United States Patent
Mori et al.

(10) Patent No.: US 10,266,965 B2
(45) Date of Patent: Apr. 23, 2019

(54) METHOD FOR PRODUCING GROUP-III NITRIDE CRYSTAL, GROUP-III NITRIDE CRYSTAL, SEMICONDUCTOR DEVICE, AND DEVICE FOR PRODUCING GROUP-III NITRIDE CRYSTAL

(71) Applicants: OSAKA UNIVERSITY, Suita-shi, Osaka (JP); ITOCHU PLASTICS INC., Tokyo (JP)

(72) Inventors: Yusuke Mori, Osaka (JP); Masashi Yoshimura, Osaka (JP); Mamoru Imade, Osaka (JP); Masashi Isemura, Tokyo (JP); Akira Usui, Tokyo (JP); Masatomo Shibata, Tokyo (JP); Takehiro Yoshida, Tokyo (JP)

(73) Assignees: Osaka University, Osaka (JP); Itochu Plastics Inc., Tokyo (JP)

( * ) Notice: Subject to any disclaimer, the term of this patent is extended or adjusted under 35 U.S.C. 154(b) by 152 days.

(21) Appl. No.: 15/123,556

(22) PCT Filed: Feb. 26, 2015

(86) PCT No.: PCT/JP2015/055716
§ 371 (c)(1),
(2) Date: Sep. 2, 2016

(87) PCT Pub. No.: WO2015/133379
PCT Pub. Date: Sep. 11, 2015

(65) Prior Publication Data
US 2017/0073839 A1    Mar. 16, 2017

(30) Foreign Application Priority Data
Mar. 3, 2014 (JP) ................................ 2014-041080

(51) Int. Cl.
*C30B 19/02* (2006.01)
*C30B 29/40* (2006.01)
(Continued)

(52) U.S. Cl.
CPC .............. *C30B 29/406* (2013.01); *B28D 5/00* (2013.01); *C30B 19/02* (2013.01); *C30B 19/061* (2013.01);
(Continued)

(58) Field of Classification Search
CPC .......... C30B 29/38; C30B 19/02; C30B 25/20
See application file for complete search history.

(56) References Cited

U.S. PATENT DOCUMENTS

| | | |
|---|---|---|
| 2003/0145783 A1 | 8/2003 | Motoki et al. |
| 2004/0183090 A1 | 9/2004 | Kitaoka et al. |

(Continued)

FOREIGN PATENT DOCUMENTS

| | | |
|---|---|---|
| EP | 1 304 749 | 4/2003 |
| EP | 2 067 884 | 6/2009 |

(Continued)

OTHER PUBLICATIONS

Extended European Search Report for the corresponding European Patent Application No. 15759207.2, dated Dec. 6, 2017, 18 pages.

*Primary Examiner* — Robert M Kunemund
(74) *Attorney, Agent, or Firm* — Hamre, Schumann, Mueller & Larson, P.C.

(57) ABSTRACT

A large Group III nitride crystal of high quality with few defects such as a distortion, a dislocation, and warping is produced by vapor phase epitaxy. A method for producing a Group III nitride crystal includes: a first Group III nitride crystal production process of producing a first Group III nitride crystal 1003 by liquid phase epitaxy; and a second Group III nitride crystal production process of producing a (Continued)

second Group III nitride crystal 1004 on the first crystal 1003 by vapor phase epitaxy. In the first Group III nitride crystal production process, the surfaces of seed crystals 1003a (preliminarily provided Group III nitride) are brought into contact with an alkali metal melt, a Group III element and nitrogen are cause to react with each other in a nitrogen-containing atmosphere in the alkali metal melt, and the Group III nitride crystals are bound together by growth of the Group III nitride crystals grown from the seed crystals 1003a to produce a first crystal 1003.

35 Claims, 28 Drawing Sheets

(51) Int. Cl.

| | | |
|---|---|---|
| *C30B 25/20* | (2006.01) | |
| *C30B 29/38* | (2006.01) | |
| *H01L 21/02* | (2006.01) | |
| *B28D 5/00* | (2006.01) | |
| *C30B 19/06* | (2006.01) | |
| *C30B 25/18* | (2006.01) | |
| *C30B 33/00* | (2006.01) | |
| *H01L 21/78* | (2006.01) | |
| *H01L 29/20* | (2006.01) | |
| *H01L 33/00* | (2010.01) | |
| *H01L 33/12* | (2010.01) | |
| *H01L 33/32* | (2010.01) | |
| *H01S 5/30* | (2006.01) | |

(52) U.S. Cl.
CPC ............ *C30B 25/186* (2013.01); *C30B 25/20* (2013.01); *C30B 29/38* (2013.01); *C30B 33/00* (2013.01); *H01L 21/0242* (2013.01); *H01L 21/0243* (2013.01); *H01L 21/0254* (2013.01); *H01L 21/0262* (2013.01); *H01L 21/02458* (2013.01); *H01L 21/02516* (2013.01); *H01L 21/02576* (2013.01); *H01L 21/02579* (2013.01); *H01L 21/02581* (2013.01); *H01L 21/02625* (2013.01); *H01L 21/02642* (2013.01); *H01L 21/02647* (2013.01); *H01L 21/7813* (2013.01); *H01L 29/2003* (2013.01); *H01L 33/007* (2013.01); *H01L 33/0079* (2013.01); *H01L 33/12* (2013.01); *H01L 33/32* (2013.01); *H01S 5/3013* (2013.01); *H01S 2304/06* (2013.01)

(56) References Cited

U.S. PATENT DOCUMENTS

| | | | |
|---|---|---|---|
| 2005/0082564 A1* | 4/2005 | Kitaoka | ............ H01L 21/0237 257/103 |
| 2005/0164419 A1 | 7/2005 | Hirota et al. | |
| 2008/0081015 A1 | 4/2008 | Sarayama et al. | |
| 2014/0328742 A1 | 11/2014 | Mori et al. | |

FOREIGN PATENT DOCUMENTS

| | | |
|---|---|---|
| EP | 2 116 636 | 11/2009 |
| EP | 2 796 594 | 10/2014 |
| JP | 52-23600 | 2/1977 |
| JP | 2002-293696 | 10/2002 |
| JP | 2003-183100 | 7/2003 |
| JP | 2005-236261 | 9/2005 |
| JP | 2008-110910 | 5/2008 |
| JP | 4588340 B | 12/2010 |
| JP | 2012-006772 | 1/2012 |
| WO | 2013/105618 | 7/2013 |

* cited by examiner (a)

(b)

(c)

METHOD FOR PRODUCING GROUP-III NITRIDE CRYSTAL, GROUP-III NITRIDE CRYSTAL, SEMICONDUCTOR DEVICE, AND DEVICE FOR PRODUCING GROUP-III NITRIDE CRYSTAL

TECHNICAL FIELD

The present invention relates to a method for producing a Group III nitride crystal, a Group III nitride crystal, a semiconductor apparatus, and an apparatus for producing a Group III nitride crystal.

BACKGROUND ART

A Group III nitride semiconductor (also called a Group III nitride compound semiconductor or a GaN semiconductor) such as gallium nitride (GaN) has been used widely as a material for various semiconductor devices such as a laser diode (LD) and a light-emitting diode (LED). For example, the laser diode (LD) that emits blue light is applied to a high-density optical disc or a display, and a light-emitting diode (LED) that emits blue light is applied to a display or illumination. Moreover, an ultraviolet LD is expected to be applied to biotechnology and the like, and an ultraviolet LED is expected as an ultraviolet source of a fluorescent lamp.

As a common method for producing a Group III nitride (e.g., GaN) crystal substrate, there is vapor phase epitaxy (hydride vapor phase epitaxy (HVPE)) such as halide vapor phase epitaxy (Patent Document 1) and metalorganic chemical vapor deposition (MOCVD), for example. On the other hand, as a method that can produce a Group III nitride single crystal of higher quality, a crystal growth method in a liquid phase is performed. This liquid phase epitaxy has had a problem in that the method was required to be performed under high temperature and high pressure. However, with recent improvements, the method can be performed under relatively low temperature and relatively low pressure and become a method suitable for mass production (e.g. Patent Documents 2 and 3). Furthermore, there is a method that uses liquid phase epitaxy and vapor phase epitaxy in combination (Patent Document 4).

CITATION LIST

Patent Document(s)

Patent Document 1: S52(1977)-023600 A
Patent Document 2: JP 2002-293696 A
Patent Document 3: Japanese Patent No. 4588340
Patent Document 4: JP 2012-006772 A

BRIEF SUMMARY OF THE INVENTION

Problem to be Solved by the Invention

With the recent increase in size of semiconductor apparatuses, there is a demand for producing a large Group III nitride crystal of high quality with few defects such as a distortion, a dislocation, and warping.

As a method for producing a large Group III nitride crystal with few defects, a method in which a fine seed crystal is grown in a liquid phase, or the like is considered. However, such a way of obtaining a large crystal requires a long period of time for crystal growth. Also, there is a possibility that a crystal grown by liquid phase epitaxy has inclusions (liquid or small miscellaneous crystals, and the like). The inclusion may cause crystal defects.

When a Group III nitride crystal is produced by vapor phase epitaxy, a substrate for epitaxial growth is required. As this substrate, a low-cost sapphire substrate commonly is used. However, there is a large difference in lattice constant, thermal expansion coefficient, and the like between the sapphire substrate and the Group III nitride crystal. Therefore, there is a possibility that defects such as a distortion, a dislocation, and warping are caused in the Group III nitride crystal. The problems of the defects become significant as the size of the crystal increases. In the present invention, "sapphire" denotes a crystal containing an aluminum oxide crystal or an aluminum oxide as a main component, unless otherwise mentioned.

Furthermore, in order to solve the problem of the difference in lattice constant, it is considered to grow the Group III nitride crystal from a large Group III nitride seed crystal with few defects, as a substitute for the sapphire substrate. More specifically, for example, it is considered that a Group III nitride substrate is used as a seed crystal as a substitute for the sapphire substrate. However, the large Group III nitride seed crystal such as a Group III nitride substrate is quite expensive, so that the costs are increased. It is very difficult to obtain a large Group III nitride seed crystal of high quality with few defects such as a distortion, a dislocation, and warping. When a Group III nitride crystal is grown from a large Group III nitride seed crystal, the Group III nitride crystal grown inherits the crystal defects of the seed crystal. In Patent Document 4, plural Group III nitride (e.g., GaN) seed crystal substrates arranged are used as a large Group III nitride seed crystal. However, this method cannot fundamentally solve the problem that the Group III nitride crystal grown inherits crystal defects of the seed crystal.

Hence, the present invention is intended to provide a method for producing a Group III nitride crystal that produces a large Group III nitride crystal of high quality with few defects such as a distortion, a dislocation, and warping by vapor phase epitaxy. Furthermore, the present invention provides a Group III nitride crystal produced by the method for producing a Group III nitride crystal, a semiconductor apparatus that uses the Group III nitride crystal, and a Group III nitride crystal production apparatus for use in the method for producing a Group III nitride crystal.

Means for Solving Problem

In order to achieve the above object, the present invention provides a method for producing a Group III nitride crystal (hereinafter, it may be simply referred to as the "production method according to the present invention"), including; a first Group III nitride crystal production process of producing a first Group III nitride crystal by liquid phase epitaxy; and a second Group III nitride crystal production process of producing a second Group III nitride crystal on the first Group III nitride crystal by vapor phase epitaxy. The first Group III nitride crystal production process includes: a seed crystal selection step of selecting a plurality of parts of a preliminarily provided Group III nitride as seed crystals for generation and growth of Group III nitride crystals; a contact step of bringing the surfaces of the seed crystals into contact with an alkali metal melt; and a Group III nitride crystal liquid phase growth step of causing a Group III element and nitrogen to react with each other in a nitrogen-containing atmosphere in the alkali metal melt to generate and grow Group III nitride crystals. In the Group III nitride crystal liquid phase growth step, the Group III nitride crystals are bound together by growth of the Group III nitride crystals grown from the seed crystals to produce the first Group III nitride crystal.

The present invention also provides a Group III nitride crystal produced by the production method according to the present invention or a Group III nitride crystal produced by further growing the Group III nitride crystal.

The present invention also provides a semiconductor apparatus including the Group III nitride crystal of the present invention. The Group III nitride crystal is a semiconductor.

The present invention also provides an apparatus for producing a Group III nitride crystal for use in the production method according to the present invention. The apparatus includes: a first Group III nitride crystal production unit that produces the first Group III nitride crystal by liquid phase epitaxy; and a second Group III nitride crystal production unit that produces the second Group III nitride crystal on the first Group III nitride crystal by vapor phase epitaxy.

EFFECTS OF THE INVENTION

According to the production method according to the present invention, a large Group III nitride crystal of high quality with few defects such as a distortion, a dislocation, warping, and the like can be produced by vapor phase epitaxy. The Group III nitride crystal of the present invention that can be produced by the production method according to the present invention is large in size, has few defects (e.g., a distortion, a dislocation, warping, and the like), and achieves high quality. Furthermore, the present invention provides a semiconductor apparatus that uses the Group III nitride crystal of the present invention, which is large in size, has few defects (e.g., a distortion, a dislocation, warping, and the like), and achieves high quality. The present invention also provides a Group III nitride crystal production apparatus that can be used in the production method according to the present invention.

MODE FOR CARRYING OUT THE INVENTION

Figure 1:
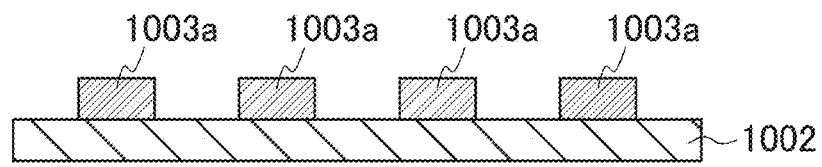
FIG. 1 shows cross sectional views schematically showing an example of processes of the production method according to the present invention.
Figure 1:
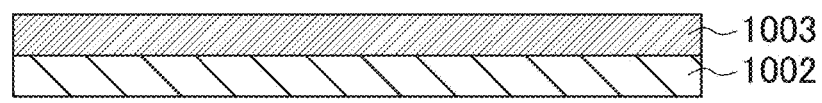
Figure 1:
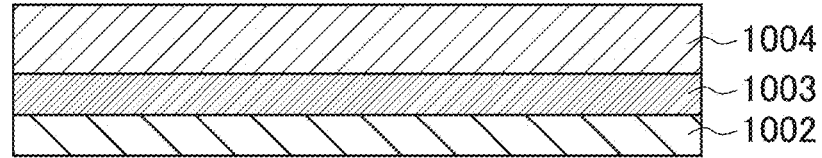

The present invention is described below with reference to examples. The present invention, however, is not limited by the following description.

In the Group III nitride crystal liquid phase growth step of the production method according to the present invention, preferably, a first Group III nitride crystal in which through holes remain is obtained by not binding some parts of the Group III nitride crystals that are adjacent to one another or a first Group III nitride crystal in which concave portions, which are formed by filling the through holes by further growth of crystals, remain is obtained. In this case, preferably, the first Group III nitride crystal has substantially no polarity inversion region. Furthermore, preferably, in the second Group III nitride crystal production process, the second Group III nitride crystal is grown so as to fill or cover the through holes or the concave portions that remain in the first Group III nitride crystal with the second Group III nitride crystal. In this case, preferably, the second Group III nitride crystal produced in the second Group III nitride crystal production process has substantially no polarity inversion region.

In the first Group III nitride crystal production process of the production method according to the present invention, preferably, the seed crystals are hexagonal crystals, and the seed crystals are arranged such that m-planes of the crystals grown from the seed crystals that are adjacent to each other do not almost coincide with each other in the seed crystal selection step. In this case, preferably, the seed crystals are arranged such that a-axes or c-axes of the seed crystals that are adjacent to each other almost coincide with each other. Furthermore, preferably, each seed crystal has a c-plane, and the c-planes are selected as crystal growth planes of the seed crystals and the seed crystals are arranged such that a-axes of the seed crystals that are adjacent to each other almost coincide with each other in the seed crystal selection step. In this case, more preferably, the seed crystals are arranged such that apexes of hexagons of the Group III nitride crystals grown from the seed crystals that are adjacent to each other almost coincide with each other in the Group III nitride crystal liquid phase growth step. Furthermore, preferably, the seed crystals are arranged such that the sides of the crystals grown from the seed crystals do not almost coincide with each other.

In the first Group III nitride crystal production process, for example, the preliminarily provided Group III nitride may include a plurality of Group III nitride crystals arranged on a substrate and the Group III nitride crystals may be selected as the seed crystals in the seed crystal selection step, or the preliminarily provided Group III nitride may be a Group III nitride crystal layer, a mask having a plurality of through holes may be arranged on the Group III nitride crystal layer, and parts of the plane of the Group III nitride crystal layer exposed from the through holes may be selected as the seed crystals in the seed crystal selection step.

In the seed crystal selection step, preferably, the preliminarily provided Group III nitride includes a plurality of Group III nitride crystals arranged on a substrate, the Group III nitride crystals are selected as the seed crystals, and the Group III nitride crystals arranged on the substrate are Group III nitride crystals formed by removing parts of the Group III nitride crystal layer formed on the substrate.

In the seed crystal selection step, preferably, the preliminarily provided Group III nitride is a Group III nitride crystal layer, a mask having a plurality of through holes is arranged on the Group III nitride crystal layer, parts of the plane of the Group III nitride crystal layer exposed from the through holes are selected as the seed crystals, and the mask does not adhere to the Group III nitride crystal layer.

Preferably, a plurality of units each composed of the Group III nitride crystal layer and the mask or a plurality of units each composed of the substrate and the Group III nitride crystal are adjacently arranged in parallel in the seed crystal selection step, the contact step, and the crystal growth step, and the Group III nitride crystals grown from the units that are adjacent to each other are bound together by the growth of the Group III nitride crystals in the crystal growth step.

In the case where the units are adjacently arranged in parallel, preferably, in the first Group III nitride crystal production process, the seed crystals are hexagonal crystals and the seed crystals are arranged such that m-planes of the crystals grown from the seed crystals that are adjacent to each other do not almost coincide with each other between the units that are adjacent to each other. In this case, preferably, the seed crystals are arranged such that a-axes or c-axes of the seed crystals that are adjacent to each other almost coincide with each other between the units that are adjacent to each other. Furthermore, more preferably, each seed crystal has a c-plane, and the c-planes are selected as crystal growth planes of the seed crystals and the seed crystals are arranged such that a-axes of the seed crystals that are adjacent to each other almost coincide with each other between the units that are adjacent to each other in the seed crystal selection step. In this case, yet more preferably, in the Group III nitride crystal liquid phase growth step, the seed crystals are arranged such that apexes of hexagons of the Group III nitride crystal grown from the seed crystals that are adjacent to each other almost coincide with each other between the units that are adjacent to each other.

The material for the mask or the substrate is not limited to particular materials. Preferably, the mask or substrate contains at least one selected from the group consisting of $Al_xGa_{1-x}N$ ($0<x\leq1$), an oxide of the $Al_xGa_{1-x}N$ ($0<x\leq1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten. The material for the mask or the substrate may be sapphire, Group III nitride, gallium arsenide (GaAs), silicon (Si), silicon carbide (SiC), magnesium oxide (MgO), zinc oxide (ZnO), gallium phosphide (GaP), zirconium diboride (($ZrB_2$)), lithium dioxogallate ($LiGaO_2$), BP, $MoS_2$, $LaAlO_3$, NbN, $MnFe_2O_4$, $ZnFe_2O_4$, ZrN, TiN, $MgAl_2O_4$, $NdGaO_3$, $LiAlO_2$, $ScAlMgO_4$, or $Ca_8La_2(PO_4)_6O_2$.

Preferably, the through holes of the mask or the Group III nitride crystals arranged on the substrate each have a dot shape, although it is not particularly limited. In this case, preferably, the through holes of the mask or the Group III nitride crystals arranged on the substrate are aligned at substantially equal intervals and each have substantially the same size. Thereby, for example, the association time of the crystals grown from the seed crystals can be synchronized. As a result, for example, voids (the through holes or the concave portions) of the same size that remain in the first Group III nitride crystal can be aligned at equal intervals, whereby the subsequent vapor phase epitaxy can be performed easily. The expression "the through holes of the mask or the Group III nitride crystals arranged on the substrate "each have almost the same size"" shall be understood as follows. That is, the size of the smallest through hole of the mask or the smallest Group III nitride crystal arranged on the substrate relative to the size of the largest through hole of the mask or the largest Group III nitride crystal arranged on the substrate is preferably 80% or more, more preferably 90% or more, yet more preferably 95% or more, and ideally 100%. In the present invention, when the present invention is specified by the numerical limitation, the numerical limitation may strictly be the numerical range or may roughly be the numerical range. For example, when the numerical limitation is "80% or more", it may strictly be 80% or more or may roughly be 80% or more. Furthermore, the expression "the through holes of the mask or the Group III nitride crystals arranged on the substrate are aligned "at substantially equal intervals"" shall be understood as follows. That is, with reference to the distance (interval) between the centers of the adjacent through holes of the mask or the distance (interval) between the centers of the adjacent Group III nitride crystals arranged on the substrate, the shortest distance (interval) relative to the longest distance (interval) is preferably 80% or more, more preferably 90% or more, yet more preferably 95% or more, and ideally 100%. The diameter of the dot is preferably in the range from 0.01 to 10 mm. The distance between the centers of the adjacent through holes of the mask or the distance between the centers of the adjacent Group III nitride crystals arranged on the substrate is not particularly limited, and is preferably 0.01 mm or more.

In the production method according to the present invention, the first Group III nitride crystal is preferably a Group III nitride crystal represented by $Al_xGa_yIn_{1-x-y}N$ ($0\leq x\leq1$, $0\leq y\leq1$, $x+y\leq1$) and particularly preferably GaN.

In the second Group III nitride crystal production process of the production method according to the present invention, the vapor phase epitaxy is preferably hydride vapor phase epitaxy (HVPE), although it is not particularly limited.

In the second Group III nitride crystal production process, preferably, the vapor phase epitaxy is a method of producing the second Group III nitride crystal by causing Group III element halide to react with nitrogen-containing gas. In this case, the Group III element halide is, for example, represented by $MX_n$ (wherein M is Al, Ga, or In; X is halogen; and n is a natural number (preferably, n=1 or 3)), and one of them may be used alone or two or more of them may be used in combination. The Group III element halide is preferably at least one selected from the group consisting of $AlCl_3$, GaCl, $GaCl_3$, and $InCl_3$. Furthermore, the nitrogen-containing gas is preferably $NH_3$.

Preferably, the production method according to the present invention further includes a slicing step of slicing the second Group III nitride crystal to provide at least one Group III nitride crystal substrate.

Furthermore, preferably, the production method according to the present invention further includes a polishing step of polishing the surface of the first Group III nitride crystal. In the second Group III nitride crystal production process, preferably, the second Group III nitride crystal is produced by vapor phase epitaxy on the surface of the first Group III nitride crystal polished in the polishing step.

In the production method according to the present invention, the second Group III nitride crystal is preferably a Group III nitride crystal represented by $Al_xGa_yIn_{1-x-y}N$ ($0\leq x\leq1$, $0\leq y\leq1$, $x+y\leq1$) and particularly preferably GaN.

In the production method according to the present invention, preferably, the second Group III nitride crystal produced has a major axis of 15 cm or more, although it is not particularly limited. Furthermore, preferably, the second Group III nitride crystal produced has a dislocation density of $1.0\times10^7$ $cm^{-2}$ or less, although it is not particularly limited. Moreover, in the second Group III nitride crystal produced, preferably, a half width of each of a symmetric reflection component (002) and an asymmetric reflection component (102) by an X-ray rocking curve method (XRC) is 300 seconds or less, although it is not particularly limited.

Next, the embodiments of the present invention are described in detail below. However, the embodiments described below are mere examples and do not limit the present invention at all.

<1. Production Method of the Present Invention>

As described above, the production method according to the present invention is a method for producing a Group III nitride crystal, including: a first Group III nitride crystal production process of producing a first Group III nitride crystal by liquid phase epitaxy; and a second Group III nitride crystal production process of producing a second Group III nitride crystal on the first Group III nitride crystal by vapor phase epitaxy. The first Group III nitride crystal production process includes: a seed crystal selection step of selecting a plurality of parts of a preliminarily provided Group III nitride as seed crystals for generation and growth of Group III nitride crystals; a contact step of bringing the surfaces of the seed crystals into contact with an alkali metal melt; and a Group III nitride crystal liquid phase growth step of causing a Group III element and nitrogen to react with each other in a nitrogen-containing atmosphere in the alkali metal melt to generate and grow Group III nitride crystals. In the Group III nitride crystal liquid phase growth step, the Group III nitride crystals are bound together by growth of the Group III nitride crystals grown from the seed crystals to produce the first Group III nitride crystal.

In a common Group III nitride crystal production method, it is very difficult to produce a large Group III nitride crystal of high quality with few defects such as a distortion, a dislocation, and warping.

As described above, there are liquid phase epitaxy and vapor phase epitaxy as the Group III nitride crystal production method. The liquid phase epitaxy and vapor phase epitaxy however had problems. That is, it is very difficult to grow a fine seed crystal large by liquid phase epitaxy by using a long period of time. Also, there is a possibility that a crystal grown by liquid phase epitaxy has inclusions (liquid or small miscellaneous crystals, and the like). The inclusion may cause crystal defects. On the other hand, in the vapor phase epitaxy, there is a large difference in lattice constant, thermal expansion coefficient, and the like between the Group III nitride crystal and the substrate of sapphire or the like. Thus, there is a possibility that defects such as a distortion, a dislocation, and warping are caused in the Group III nitride crystal. For solving these problems, use of a large Group III nitride substrate of high quality with few defects such as a distortion, a dislocation, warping, and the like as a seed crystal can be considered. However, it is very difficult to obtain such a seed crystal.

For solving these problems, the inventors of the present invention conducted earnest studies and arrived at the present invention. In the production method according to the present invention, as described above, the first Group III nitride crystal is produced by liquid phase epitaxy (the "first Group III nitride crystal production process"). In this process, as described above, Group III nitride crystals grown from seed crystals are bound together to produce the first Group III nitride crystal. In this first Group III nitride crystal production process, for example, a large first Group III nitride crystal of high quality with few defects such as a distortion, a dislocation, warping, and the like can be obtained. Then, using thus obtained first Group III nitride crystal as a seed crystal, the second Group III nitride crystal is produced by vapor phase epitaxy (the "second Group III nitride crystal production process"). Thereby, a large Group III nitride crystal of high quality with few defects such as a distortion, a dislocation, and warping can be produced.

(a) to (c) of FIG. 1 are cross sectional views schematically showing an example of a production method according to the present invention. That is, first, as shown in (a) of FIG. 1, a substrate 1002 provided with seed crystals 1003a is provided. In (a) of FIG. 1, seed crystals 1003a are provided on the substrate 1002. However, the substrate may be used or may not be used according to need. Next, as shown in (b) of FIG. 1, by binding Group III nitride crystals grown from the seed crystals 1003a together, a first Group III nitride crystal 1003 is obtained (first Group III nitride crystal production process). Then, as shown in (c) of FIG. 1, a second Group III nitride crystal 1004 is produced on the first Group III nitride crystal 1003 by vapor phase epitaxy (second Group III nitride crystal production process).

Figure 2:
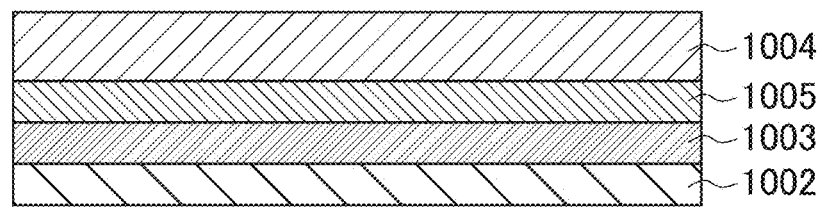
FIG. 2 is a cross sectional view schematically showing an example of a Group III nitride crystal produced by the production method according to the present invention, which is different from FIG. 1.

The production method according to the present invention may appropriately include or not include steps other than the first Group III nitride crystal production process and the second Group III nitride crystal production process. For example, the production method according to the present invention may include or not include a step of providing one or more other components (for example, other Group III nitride crystal layers, and the like) between the first Group III nitride crystal and the second Group III nitride crystal. That is, the Group III nitride crystal of the present invention produced by the production method according to the present invention may include or not include another layer 1005 between the first Group III nitride crystal 1003 and the second Group III nitride crystal 1004 as shown in FIG. 2. When the Group III nitride crystal includes the layer 1005, the layer 1005 may be one or more. The layer 1005 may be, for example, a Group III nitride crystal or other materials. For example, when the lattice constant, thermal expansion coefficient, and the like between the first Group III nitride crystal and the second Group III nitride crystal are different from each other, the layer 1005 may be provided as a buffer layer. The method for producing the layer 1005 is not limited to a particular method, and can be vapor phase epitaxy or liquid phase epitaxy, for example.

Examples of the production method according to the present invention are described in details below.

<1-1. First Group III Nitride Crystal Production Process (Liquid Phase Epitaxy)>

As described above, the first Group III nitride crystal production process includes: a seed crystal selection step of selecting a plurality of parts of a preliminarily provided Group III nitride as seed crystals for generation and growth of Group III nitride crystals; a contact step of bringing the surfaces of the seed crystals into contact with an alkali metal melt; and a Group III nitride crystal liquid phase growth step of causing a Group III element and nitrogen to react with each other in a nitrogen-containing atmosphere in the alkali metal melt to generate and grow Group III nitride crystals. In the Group III nitride crystal liquid phase growth step, the Group III nitride crystals are bound together by growth of the Group III nitride crystals grown from the seed crystals to produce the first Group III nitride crystal.

<1-1-2. Arrangement Relationship, Shape, Size, and the Like of Seed Crystal>

As described above, preferably, in the first Group III nitride crystal production process, the seed crystals are hexagonal crystals, and in the seed crystal selection step, the seed crystals are arranged such that m-planes of the crystals grown from the seed crystals that are adjacent to each other do not almost coincide with each other. This helps the Group III nitride crystals to bind (associate) tidily at their boundaries, whereby the crystal defects of the first Group III nitride crystal can be reduced.

In the production method of the present invention, preferably, the seed crystals are arranged such that the a-axes or the c-axes of the seed crystals that are adjacent to each other almost coincide with each other. In a hexagonal crystal, the number of "a-axes" is three including a1, a2, and a3 that are equivalent to one another. In the present invention, the state where a-axes of two seed crystals that are adjacent to each other almost coincide with each other indicates the state where any one of the three a-axes of one of the two seed crystals almost coincides with any one of the three a-axes of the three a-axes of the other. Moreover, in the present invention, "almost coinciding" or "substantially coinciding" encompasses both of the case of completely coinciding and the case of substantially coinciding with a slight deviation. The same applies to the case of being represented by "almost" or "substantially" in the other states.

When a Group III nitride crystal is grown from large Group III nitride seed crystals, the Group III nitride crystal grown inherits crystal defects of the seed crystals. In order to solve this problem, the inventors of the present invention found the way of growing a Group III nitride crystal large from small Group III nitride seed crystals. By using small Group III nitride seed crystals as described above, defects in the Group III nitride crystal grown can be reduced. Although the reason for this is not perfectly clear, it is considered that the Group III nitride crystal grown tends not to inherit crystal defects of the seed crystals as compared to the case where large Group III nitride seed crystals are used.

However, in the case of using small Group III nitride seed crystals, there are limitations on the sizes of the Group III nitride crystals to be obtained by the growth. Hence, for obtaining a large crystal, Group III nitride crystals grown from seed crystals may be bound together by the growth. In this case, it is preferable to prevent defects from being caused in binding sites in the course of binding the crystals by the growth. In order to do so, it is preferable not to substantially join m-places of crystals grown from hexagonal seed crystals with each other, i.e., it is preferable to arrange the seed crystals such that m-planes of crystals grown from seed crystals that are adjacent to each other do not almost coincide with each other. This makes it possible to prevent or reduce defects in the binding site of the two seed crystals. Moreover, a crystal of higher quality with fewer defects can be produced by arranging the seed crystals such that a-axes or c-axes of the seed crystals that are adjacent to each other almost (substantially) coincide with each other.

In the first Group III nitride crystal, the dislocation density is not particularly limited and is preferably $1.0 \times 10^7$ cm$^{-2}$ or less, more preferably $1.0 \times 10^{-4}$ m$^{-2}$ or less, yet more preferably $1.0 \times 10^{-3}$ cm$^{-2}$ or less, and still more preferably $1.0 \times 10^{-2}$ cm$^{-2}$ or less. Although the dislocation density is ideally 0, it is commonly impossible for the dislocation density to be 0. Thus, for example, the dislocation density is a value more than 0 and is particularly preferably a measurement limit or less of a measurement instrument. The dislocation density may be, for example, an average value of the entire crystal, and, more preferably, the maximum value in the crystal is the above-described value or less. In the Group III nitride crystal of the present invention, the half width of each of a symmetric reflection component (002) and an asymmetric reflection component (102) by XRC is, for example, 300 seconds or less, preferably 100 seconds or less, more preferably 30 seconds or less, and ideally 0.

As described above, in the Group III nitride crystal production process, preferably, the seed crystals are arranged such that m-planes of the crystals grown from the seed crystals that are adjacent to each other do not almost coincide with each other. Moreover, preferably, the seed crystals are arranged such that a-axes or c-axes of the seed crystals that are adjacent to each other almost coincide with each other. The arrangement in which m-planes of crystals grown from the seed crystals that are adjacent to each other do not almost coincide with each other and the arrangement in which a-axes or c-axes of the seed crystals that are adjacent to each other almost coincide with each other are described with reference to FIGS. 18A to 23C. FIGS. 18A to 23C, however, are mere examples and do not limit the present invention. Hereinafter, the conditions where m-planes of crystals grown from seed crystals that are adjacent to each other do not almost coincide with each other are also referred to as the "conditions (M)", the conditions where a-axes of two seed crystals that are adjacent to each other almost (substantially) coincide with each other are also referred to as the "conditions (A)", and the conditions where c-axes of two seed crystals that are adjacent to each other almost (substantially) coincide with each other are also referred to as the "conditions (C)".

First, the conditions (the conditions (A)) where a-axes of two seed crystals that are adjacent to each other almost (substantially) coincide with each other and the conditions (the conditions (M)) where m-planes of crystals grown from seed crystals that are adjacent to each other do not almost coincide with each other are described using FIGS. 18A to 18E as examples. In the present invention, the crystal growth plane of each seed crystal is not particularly limited and may be, for example, any of c-, m-, and a-planes and any other plane, and is more preferably a c- or m-plane. The case where c-planes of seed crystals (c-plane seed crystals) having the c-planes are selected as crystal growth planes, and crystals are grown from the c-planes is shown in FIGS. 18A to 18E.

Each of FIGS. 18A to 18E is a plan view showing, by way of example, an arrangement of two seed crystals that are adjacent to each other. In each of FIGS. 18A to 18E, a c-plane (crystal growth plane) is parallel with a plane of paper. Each of FIGS. 18A to 18E shows crystals in the case where two hexagonal crystals are grown from two dot-like seed crystals, for the sake of convenience of the description. Three a-axes of these crystals coincide with the three diagonal lines that pass through the center of the hexagon and match with the a-axes of seed crystals from which these crystals are derived.

Figure 18A:
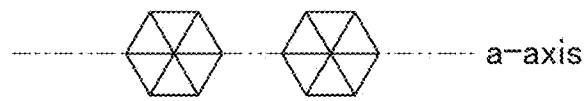
FIGS. 18A to 18E are plan views showing examples of an arrangement of two seed crystals that are adjacent to each other in c-plane seed crystals.
Figure 18B:
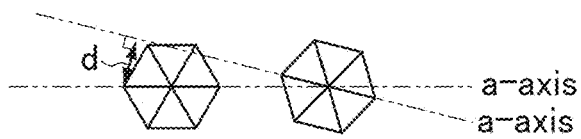

First, the conditions (A) are described. FIG. 18A shows the state where a-axes of two seed crystals that are adjacent to each other completely coincide with each other as an example of the arrangement satisfying the conditions (A). In the Group III nitride crystal production method of the present invention, the two seed crystals that are adjacent to each other are ideally made in such arrangement. The conditions (A), however, are satisfied as long as a-axes of the seed crystals that are adjacent to each other almost coincide with each other. In the conditions (A), the state where the a-axes almost (substantially) coincide with each other encompasses the state where the a-axes completely coincide with each other as shown in FIG. 18A and is, however, not limited to only this and encompasses the state where the a-axes substantially coincide with each other with a slight deviation, for example. Specifically, for example, as shown in FIG. 18B, an a-axis of one of the seed crystals may be slightly tilted relative to an a-axis of the other seed crystal. The arrangement is not limited to the arrangement where a-axes of two seed crystals coincide or intersect with each other as shown in FIGS. 18A and 18B and may be in the state where a-axes of two seed crystals are parallel with each other and are slightly apart from each other as shown in FIG. 18E.

In the conditions (A), an angle formed between the a-axes is less than 30° (degree) and preferably as small as possible. The angle formed between the a-axes is preferably 5° or less, more preferably 1° or less, yet more preferably 0.1° or less, still more preferably 0.02° or less, and particularly preferably 0°. In the case where the a-axes completely coincide with each other as shown in FIG. 18A and in the case where the a-axes are parallel with each other as shown in FIG. 18E, the angle formed between the a-axes is 0°. However, the angle formed between the a-axes normally is not exactly 0°, and directions of the a-axes are slightly deviated from each other.

Each of the two seed crystals is a hexagonal crystal. Thus, each seed crystal has three a-axes. When whether or not the conditions (A) of the present invention are satisfied is determined, a-axes and the angle formed between the a-axes are defined by the following (1) to (3):

(1) Any one of three a-axes of each of two seed crystals that are adjacent to each other is selected. The number of combinations of a-axes by this selection is 3×3=9.

(2) The two a-axes selected in (1) form an angle.

(3) Among nine combinations in (1), a combination of a-axes with the minimum angle of (2) is used as a-axes, and the angle (of (2)) formed between the a-axes in the combination is used as the angle formed between the a-axes.

When the distance between the a-axes of the two seed crystals that are adjacent to each other is too long, the a-axes do not substantially coincide with each other. Thus, the conditions (A) are not satisfied. When the a-axes are parallel with each other, the distance is, for example, a length indicated by the sign d in each of FIGS. 18C and 18E. When the a-axes are not parallel with each other, the distance between the a-axes is, for example, in the case where a line perpendicular from one of the a-axes to the other a-axis coincides with either of the two seed crystals in at least one point, the length of the longest perpendicular line (e.g., the length indicated by the sign d in each of FIGS. 18B and 18D assuming that a hexagon shown in each of FIGS. 18B and 18D is a seed crystal). In the conditions (A), the distance between the a-axes is, for example, 1 mm or less, preferably 0.5 mm or less, more preferably 0.3 mm or less, yet more preferably 0.1 mm or less, particularly preferably 0.05 mm or less, and ideally 0. The case where the distance between the a-axes is 0 is the case where the a-axes completely coincide with each other (e.g., FIG. 18A).

Figure 18C:
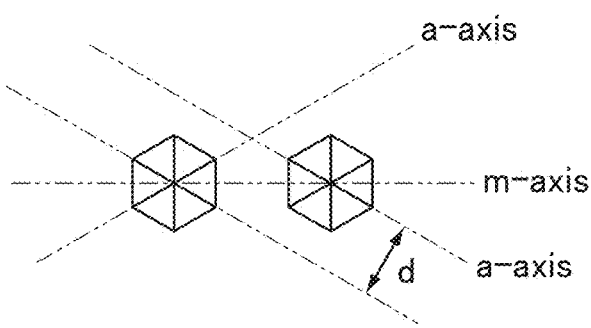
Figure 18D:
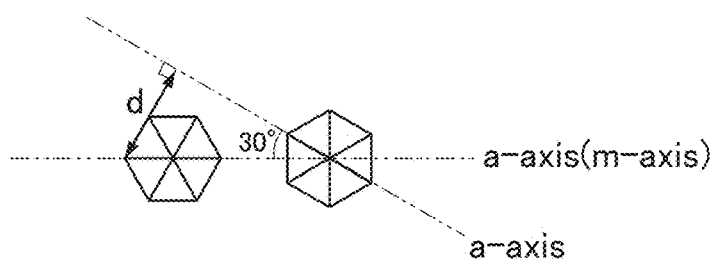
Figure 18E:
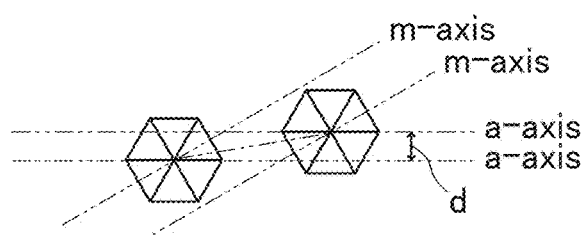

An example in which the conditions (A) are not satisfied is shown in FIGS. 18C and 18D. In FIG. 18C, although a-axes of two seed crystals that are adjacent to each other are parallel with each other, the distance d between the a-axes is too long. Thus, the a-axes do not substantially coincide with each other. In FIG. 18C, m-axes of the two seed crystals coincide with each other. Thus, m-planes (sides of hexagon shown in FIG. 18C) of crystals generated from the two seed crystals face to each other. When two seed crystals that are adjacent to each other are arranged as described above, for example, as shown in the comparative examples to be described below, two crystals grown from the two seed crystals are associated with (bound to) each other in the state where m-planes of the two crystals face to (coincide with) each other. That is, m-planes of the crystals grown from the two seed crystals that are adjacent to each other coincide with each other, and thus, the conditions (M) are not satisfied. In such a case, crystal defects are caused in the plane in which the crystals are associated (bound), and thus, a Group III nitride crystal of high quality cannot be obtained, and the object of the present invention cannot be achieved. That is, it is required that m-planes of two crystals grown from two seed crystals that are adjacent to each other do not substantially face to each other (do not substantially coincide with each other) in the present invention. In FIG. 18E, the distance d between the a-axes is short as shown in FIG. 18E. Thus, when the two crystals in FIG. 18E are grown, the area in which the m-planes face to (coincide with) each other is small. When the area in which the m-planes face to (coincide with) each other is really small, it can be said that the m-planes do not substantially face to each other (do not substantially coincide with each other). In the present invention, for example, by satisfying the conditions (A), the conditions where m-planes of two crystals grown from two seed crystals that are adjacent to each other do not substantially face to each other (do not almost coincide with each other) can be satisfied. In the case where a-axes of two seed crystals that are adjacent to each other completely coincide with each other as shown in FIG. 18A, when crystals grown from these seed crystals are associated with (bound to) each other, the association (binding) does not occur in the state where m-planes face to (coincide with) each other as described below.

In FIG. 18D, the angle formed between a-axes of two seed crystals that are adjacent to each other is 30°, so that the conditions (A) are not satisfied. Preferably, the angle formed between the a-axes is as small as possible, and the angle is specifically as described above.

In each of FIGS. 18C and 18D, the center of the left seed crystal coincides with the maxis of the right seed crystal. In the present invention, when each seed crystal has a dot shape, preferably, the center of one of the seed crystals does not coincide with the maxis of the other seed crystal (e.g., FIGS. 18C and 18D).

In the first Group III nitride crystal production process, the shape of each seed crystal is not limited to particular shapes and is, for example, preferably a dot shape. The dot shape is not particularly limited, and examples thereof include a circle, an equilateral polygon, and shapes close thereto. Examples of the equilateral polygon include an equilateral triangle, a square, an equilateral pentagon, and an equilateral hexagon. Among them, a circle or an equilateral hexagon is particularly preferable from the viewpoint of few defects (isotropy or the like) in a produced crystal (grown from the seed crystal). The size of the seed crystal having a dot shape is not particularly limited and is preferably as small as possible from the viewpoint of producing a Group III nitride crystal of high quality with few defects. It is to be noted that the size of the seed crystal having a dot shape is preferably not too small from the viewpoint of production efficiency (growth efficiency) of the Group III nitride crystal. The diameter of the crystal growth plane (e.g., a c-plane in a c-plane seed crystal) of the seed crystal having a dot shape is, for example, 10 mm or less, preferably 5 mm or less, more preferably 3 mm or less, yet more preferably 1.5 mm or less, and particularly preferably 1 mm or less. The lower limit of the diameter is, for example, 0.01 mm or more, preferably 0.1 mm or more, and more preferably 0.2 mm or more. In the present invention, in the case where the shape of the seed crystal or the Group III nitride crystal is other than a circle (a perfect circle), the "diameter" represents "the major axis (the longest diameter)".

The shape of each seed crystal is not limited to the dot shape and may be, for example, any of a rectangle, an ellipse, a stripe shape, and shapes close to them, and any other shapes. The shape is preferably a dot shape from the viewpoint of few defects (isotropy or the like) in a produced crystal (grown from the seed crystal). The size of the seed crystal having a rectangle, an ellipse, a stripe shape, or the like is not particularly limited, and from the viewpoint of few defects in a produced crystal (grown from the seed crystal), the width is, for example, 10 mm or less, preferably 5 mm or less, more preferably 3 mm or less, yet more preferably 1.5 mm or less, and particularly preferably 1 mm or less. The lower limit of the width is, for example, 0.01 mm or more, preferably 0.1 mm or more, and more preferably 0.2 mm or more from the viewpoint of production efficiency (growth efficiency) of the Group III nitride crystal.

Figure 19A:
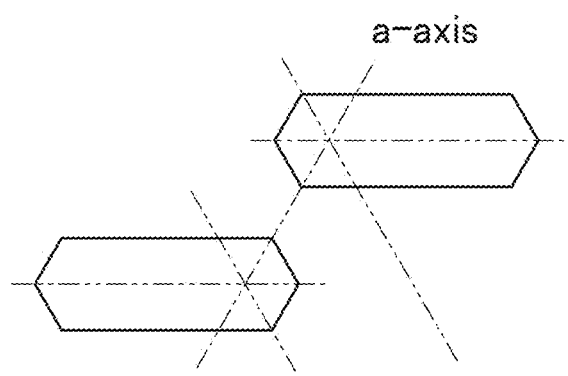
FIGS. 19A and 19B are plan views showing other examples of an arrangement of two seed crystals that are adjacent to each other in c-plane seed crystals.
Figure 19B:
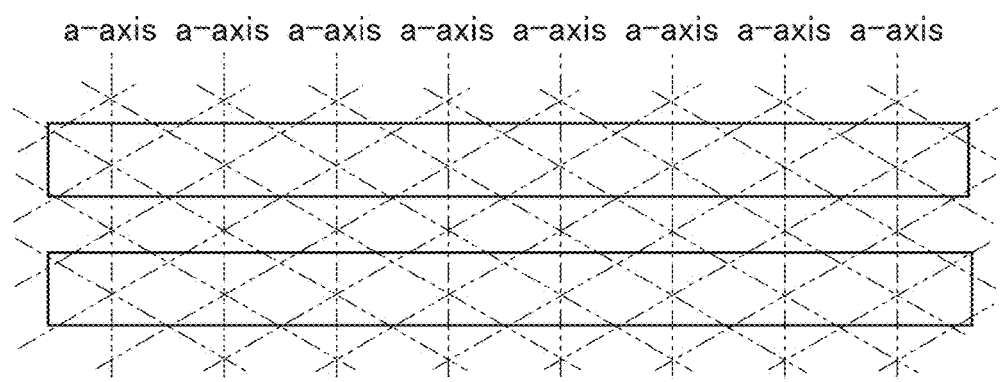

FIGS. 19A and 19B show other examples of the arrangement of seed crystals (c-plane seed crystals) each having a c-plane. In each of FIGS. 19A and 19B, a c-plane (crystal growth plane) is parallel with a plane of paper. FIG. 19A shows an example in which long and thin hexagonal crystals grown from seed crystals having a rectangle, an ellipse, or the like are adjacent to each other. In such a case, whether the conditions (A) are satisfied may be determined considering the angle formed between a-axes of the seed crystals that are adjacent to each other and the distance between the a-axes as in the description of FIGS. 18A to 18E. FIG. 19A shows an example in which the a-axes completely coincide with each other, and apexes of grown hexagonal crystals are associated with (bound to) each other. FIG. 19B shows an example in which the long side of a striped seed crystal is almost (or completely) perpendicular to its a-axis. In such a case, it can be considered that the a-axis is present at any position in the direction almost (or completely) perpendicular to the direction of the seed crystal. Thus, whether the conditions (A) are satisfied can be determined considering only the angle formed between the a-axes of the seed crystals that are adjacent to each other without considering the distance between the a-axes of the seed crystals.

In the first Group III nitride crystal production process, the distance between the centers of seed crystals that are adjacent to each other is not particularly limited and is preferably not too short from the viewpoint of obtaining a crystal of high quality with few defects. This is because defects of the seed crystals tend not to be inherited and a crystal of high quality with few defects can be easily obtained when crystals are bound to each other after sufficiently growing the seed crystals. From the viewpoint of production efficiency of a Group III nitride crystal, the distance between the centers of seed crystals that are adjacent to each other is preferably not too long. The upper limit of the distance between the centers of seed crystals that are adjacent to each other is, for example, 20 mm or less, preferably 5 mm or less, and particularly preferably 1 mm or less. The lower limit of the distance between the centers of seed crystals that are adjacent to each other is preferably 0.01 mm or more, more preferably 0.05 mm or more, and yet more preferably 0.1 mm or more.

In FIGS. 18A to 19B, the case where crystals are grown from c-planes of the seed crystals each having a c-plane (c-plane seed crystal) is described. In the case where the crystal growth plane is any plane (e.g., m-plane or the like) other than the c-plane, the sizes of the seed crystals and the numerical range of the distance between the centers of the seed crystals and the like are not particularly limited and are, for example, the same as those in the case where the crystal growth plane is the c-plane, for example.

The conditions (M), i.e., the conditions where m-planes of crystals grown from seed crystals that are adjacent to each other do not almost coincide with each other, are not particularly limited and are, for example, as follows.

In the case where m-axes of seed crystals that are adjacent to each other are almost parallel with each other (i.e., the angle formed between the m-axes is almost 0°), the conditions (M) may be, for example, conditions where the m-axis of each seed crystal does not pass through the inside of the other seed crystal, for example. Examples of satisfying these conditions include FIGS. 18A and 18E. When m-axes of seed crystals that are adjacent to each other coincide with each other (in this case, the angle formed between the m-axes is 0°), the m-axis of each seed crystal certainly passes through the inside of the other seed crystal as shown in FIG. 18C. In FIG. 18C, as described above, m-planes of crystals grown from the two seed crystals that are adjacent to each other coincide with each other. Thus, the conditions (M) are not satisfied.

Moreover, the conditions (M) may be conditions satisfying the conditions (A) regardless of whether or not the m-axis passes through the inside of the other adjacent seed crystal. This is because, as described for FIGS. 18A, 18B, and 18E and 19A and 19B, when the conditions (A) are satisfied, m-planes of crystals grown from seed crystals that are adjacent to each other do not substantially coincide with each other. Furthermore, as shown in FIGS. 20A to 21C as examples described below, when the conditions (C) (c-axes of seed crystals that are adjacent to each other almost coincide with each other) are satisfied, m-planes of crystals grown from seed crystals that are adjacent to each other do not almost coincide with each other. Thus, the conditions (M) may be conditions satisfying the conditions (C) regardless of whether or not the m-axis passes through the inside of the other adjacent seed crystal.

In the case where the m-axes almost parallel with each other, the angle formed between the m-axes is, for example, 1° or less, preferably 0.1° or less, particularly preferably 0.02° or less, and ideally 0°. In the case where the m-axes of seed crystals that are adjacent to each other are not parallel with each other, for example, as shown in FIG. 18D, it is obvious that m-planes (sides of hexagons in FIG. 18D) of crystals grown from the seed crystals do not coincide with each other, and the conditions (M) are satisfied. In this case, the angle formed between the m-axes is, for example, 5° or more, preferably 10° or more, more preferably 20° or more, and particularly preferably 25° or more. In the present invention, the seed crystals are hexagonal crystals, and thus, each seed crystal has three m-axes. In the present invention, when the angle formed between m-axes of seed crystals that are adjacent to each other is defined, the angle is defined according to the same procedures as in (1) to (3) of the conditions (A) except that the a-axes are changed to the m-axes.

In the examples of FIGS. 18A to 19B, c-planes are parallel with the plane of paper (i.e., c-axes of crystals are perpendicular to the plane of paper). Thus, the seed crystals that are adjacent to each other do not satisfy the conditions (C) (the c-axes almost coincide with each other). However, when the conditions (M) are satisfied, and preferably, the conditions (A) are also satisfied, a large Group III nitride seed crystal of high quality with few defects can be produced.

Subsequently, examples of the arrangements of m-plane seed crystals and a-plane seed crystals are described.

Figure 20A:
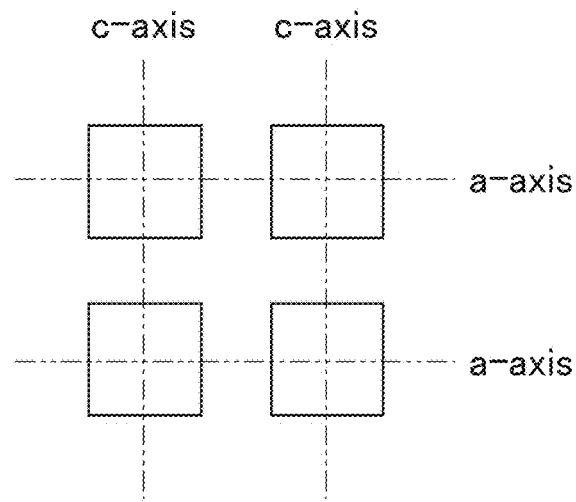
FIGS. 20A to 20C are drawings showing an example of an arrangement of seed crystals in m-plane seed crystals.
Figure 20B:
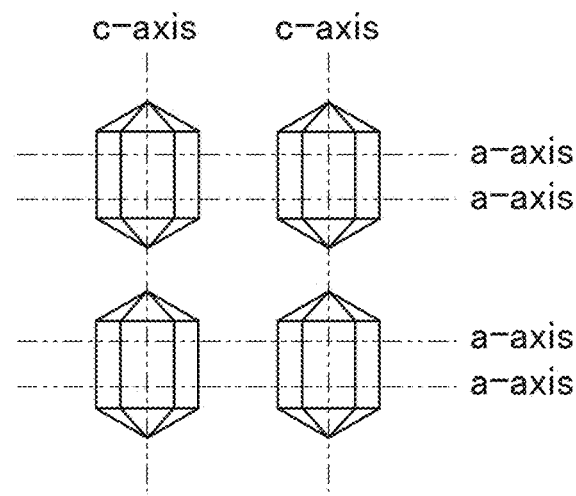
Figure 20C:
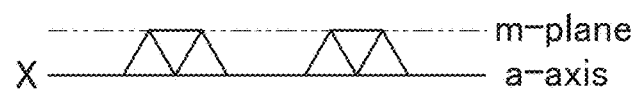

FIGS. 20A to 20C show an example of the arrangement of m-plane seed crystals. In FIGS. 20A and 20B, each m-plane (crystal growth plane) is parallel with the plane of paper. FIG. 20C is a drawing viewed from below the plane of paper of FIG. 20B. In FIG. 20C, the c-plane is parallel with the plane of paper.

FIG. 20A is a drawing schematically showing an example of the arrangement of four square seed crystals in two rows×two columns. As shown in FIG. 20A, c-axes of seed crystals that are vertically adjacent to each other on the plane of paper coincide with each other. Thus, the conditions (C) and (M) are satisfied. Moreover, a-axes of seed crystals that are horizontally adjacent to each other on the plane of paper coincide with each other. Thus, the conditions (A) and (M) are satisfied.

In the conditions (A) of the present invention, the angle formed between a-axes of seed crystals that are adjacent to each other and the distance between the a-axes may be the same as those in the case of the c-plane seed crystal (crystal growth plane is the c-plane) even when the crystal growth planes of the seed crystals are any planes (e.g., m-planes) other than c-plane. Moreover, in the conditions (C) of the present invention, the angle formed between c-axes of seed crystals that are adjacent to each other and the distance between the c-axes may be the same as those in the conditions (A) except that the a-axes are changed to c-axes even when the crystal growth planes are any planes (e.g., a-planes) other than m-planes.

Seed crystals in FIG. 20A are hexagonal crystals. Thus, the crystal forms of crystals grown from the hexagonal crystals are as shown in FIG. 20B. FIG. 20B however merely shows an example, and the present invention is not limited thereby. As shown in FIG. 20B, the a-axes of the crystals can be regarded as being placed at any position at which the crystals horizontally intersect with each other on the plane of paper. The same applies to the seed crystals of FIG. 20A.

As shown in FIG. 20C, in these seed crystals and crystals grown therefrom, the m-planes are parallel with the crystal growth planes, and the m-planes do not coincide with each other. Thus, the conditions (M) are satisfied. Moreover, as shown in FIG. 20C, other m-planes tilted 60° from crystal growth planes also do not coincide with each other (do not directly face each other). Thus, the conditions (M) are satisfied. In FIG. 20C, the straight line X represents a plane parallel with the crystal growth planes of the seed crystals.

Figure 21A:
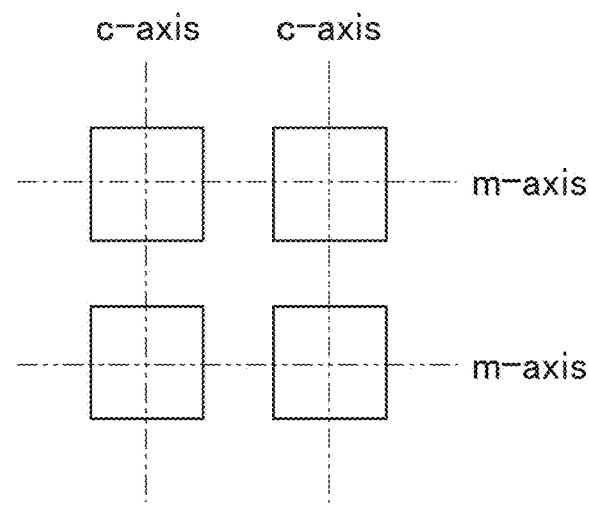
FIGS. 21A to 21C are drawings showing an example of an arrangement of seed crystals in a-plane seed crystals.
Figure 21B:
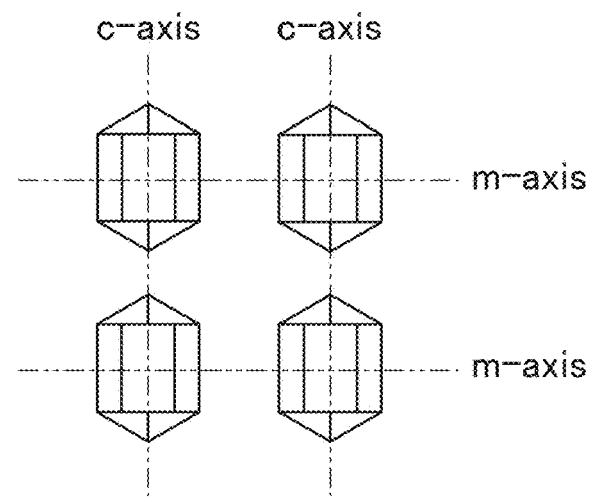
Figure 21C:
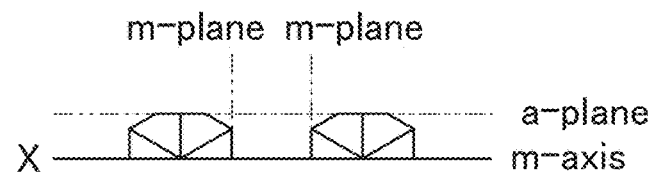

Next, FIGS. 21A to 21C show an example of the arrangement of plural a-plane seed crystals. In FIGS. 21A and 21B, each a-plane (crystal growth plane) is parallel with the plane of paper. FIG. 21C is a drawing viewed from below the plane of paper of FIG. 21B. In FIG. 21C, the c-plane is parallel with the plane of paper.

FIG. 21A is a drawing schematically showing an example of the arrangement of four square seed crystals in two rows×two columns. As shown in FIG. 21A, c-axes of seed crystals that are vertically adjacent to each other on the plane of paper coincide with each other. Thus, the conditions (C) and (M) are satisfied. Moreover, m-axes of seed crystals that are horizontally adjacent to each other on the plane of paper coincide with each other. Thus, the conditions (A), (C), and (M) are not satisfied.

Seed crystals in FIG. 21A are hexagonal crystals. Thus, the crystal forms of crystals grown from the hexagonal crystals are as shown in FIG. 21B. FIG. 21B however merely shows an example, and the present invention is not limited thereby. In FIG. 21B, each a-plane is exposed by cutting the upper part of each crystal at a plane parallel with the crystal growth plane. When the a-plane is viewed from below the plane of paper, as shown in FIG. 21C, m-planes of the seed crystals that are horizontally adjacent to each other on the plane of paper face to each other. Thus, it is understood that the conditions (M) are not satisfied. In FIG. 21C, the straight line X represents the plane parallel with the crystal growth planes of the seed crystals.

In the present invention, although all of the seed crystals that are adjacent to each other preferably satisfy at least one of the conditions (M), (A), and (C), only some of them may satisfy the conditions. For example, as shown in FIGS. 21A and 21B, the seed crystals that are horizontally adjacent to each other on the plane of paper may not satisfy the conditions (M) of the present invention, and only seed crystals that are vertically adjacent to each other on the plane of paper may satisfy the conditions (M) of the present invention. In the case of FIG. 21A or 21B, the seed crystals that are vertically adjacent to each other on the plane of paper satisfy the conditions (M) and (C). Thus, generation of defects at sites at which crystals are bound (associated) can be prevented or reduced.

In the case of a-plane seed crystal, in order for the m-planes of the grown crystals not to face (coincide with) each other, for example, plural striped seed crystals that are parallel with the m-axis (the horizontal direction on the plane of paper in FIGS. 21A and 21B) may be arranged such that the c-axes of the seed crystals almost coincide with each other. In this case, the c-axes are regarded as being placed at any positions perpendicular to the longitudinal direction of the stripe.

Figure 22A:
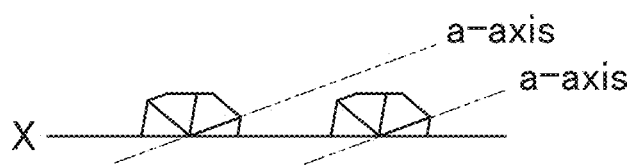
FIGS. 22A and 22B are drawings showing examples of an arrangement of seed crystals in which a-axes or c-axes are tilted relative to a crystal growth plane.
Figure 22B:
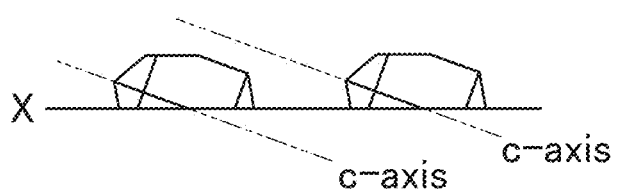

In the present invention, the crystal growth plane is not limited to a c-, m-, or a-plane and may be any plane tilted relative to any of these planes. Examples of the plane tilted relative to any of these planes are shown in FIGS. 22A and 22B. In FIGS. 22A and 22B, the straight line X represents a plane parallel with the crystal growth planes. In FIG. 22A, a-axes are slightly tilted relative to the crystal growth planes. In FIG. 22B, the c-axes are slightly tilted relative to the crystal growth planes.

Figure 23A:
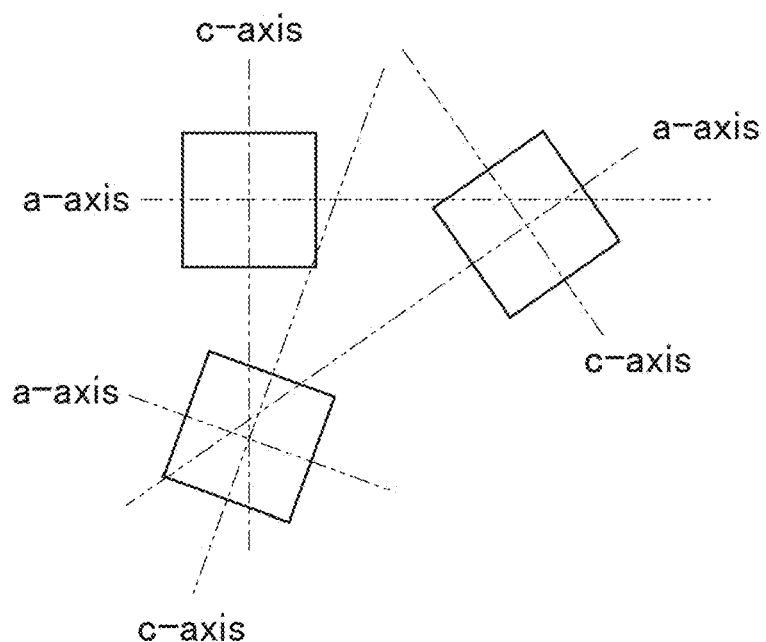
FIGS. 23A to 23C are drawings showing examples of an arrangement of seed crystals that are adjacent to each other in which a-axes or c-axes are tilted relative to one another.
Figure 23B:
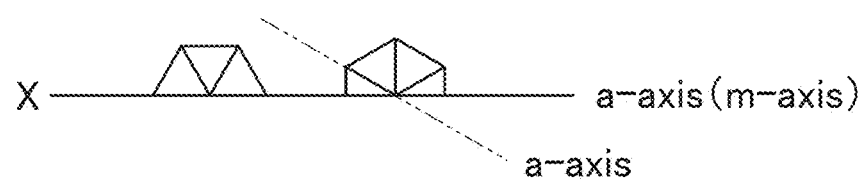
Figure 23C:
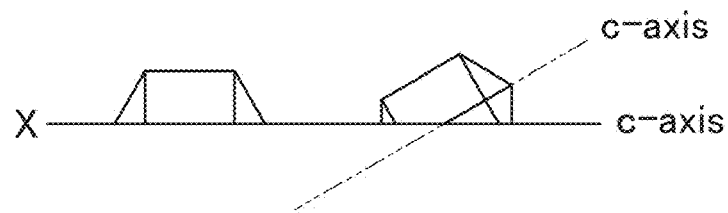

Each of FIGS. 23A to 23C shows an example in which a-axes, m-axes, or c-axes of the seed crystals that are adjacent to each other are tilted relative to each other. FIG. 23A shows the state where the a-axes or c-axes of the m-plane seed crystals that are adjacent to each other are tilted relative to each other, and the m-planes (crystal growth planes) are parallel with the plane of paper. Each of FIGS. 23B and 23C is a drawing schematically showing an example in which the crystal growth planes of the seed crystals that are adjacent to each other are different from each other. In each of FIGS. 23B and 23C, the straight line X represents a plane parallel with the crystal growth planes. In FIG. 23B, the crystal growth planes are parallel with the a-axis of the left seed crystal and are parallel with the maxis of the right seed crystal. In FIG. 23C, the crystal growth plane is parallel with the c-axis of the left crystal and is tilted relative to the c-axis of the right crystal.

In the present invention, the case where all of the a-axes, the c-axes, or the m-axes of the seed crystals that are adjacent to each other are aligned in almost the same direction (i.e., parallel with each other, FIGS. 18A, 20A to 20C, 21A to 21C, and the like) is preferable rather than the case where the a-axes, the c-axes, or the m-axes of the seed crystals that are adjacent to each other are tilted relative to each other (FIGS. 18D and 23A to 23C). The expression "being aligned in almost the same direction (being parallel with each other)" shall be understood as follows. That is, the angle formed between the a-axes, the c-axes, or the m-axes is, for example, 5° or less, preferably 1° or less, more preferably 0.03° or less, particularly preferably 0.005° or less, and ideally 0°. It is to be noted that even when all of the axes are aligned in almost the same direction, for example, if the conditions (M) of the present invention are not satisfied as in FIG. 18C, the conditions of the present invention are not satisfied. That is, in the Group III nitride crystal production method of the present invention, preferably, the conditions (M) are satisfied, and all of the a-axes, the c-axes, or the m-axes of seed crystals that are adjacent to each other are aligned in almost the same direction.

As to the conditions (A), FIGS. 18A, 18B, 18E, 19A, and 19B are described above as examples of satisfying the conditions (A) of the Group III nitride crystal production method of the present invention, and FIGS. 18C and 18D are described above as examples of not satisfying the conditions (A). However, these drawings are merely schematic drawings for the sake of convenience of the description. Thus, the angle formed between a-axes, the distance between the a-axes, and the like under the conditions (A) of the present invention are not at all limited by these drawings. Similarly, the angles, the distances, and the like under the conditions (M) and (C) also are not at all limited by the drawings.

<1-1-3. Composition and the Like of Group III Nitride Crystal>

In the first Group III nitride crystal production process, the preliminarily provided Group III nitride (seed crystal) is not particularly limited and can be, for example, Group III nitride represented by $Al_xGa_yIn_{1-x-y}N$ ($0 \leq x \leq 1$, $0 \leq y \leq 1$, $x+y \leq 1$). Examples of the preliminarily provided Group III nitride (seed crystal) include AlGaN, InGaN, InAlGaN, and GaN, each represented by the above-described composition, and GaN is particularly preferable.

In the crystal growth step, the Group III element to be caused to react with the nitrogen is, for example, at least one selected from the group consisting of gallium (Ga), indium (In), and aluminum (Al), and is particularly preferably Ga.

The Group III nitride crystal generated and grown in the crystal growth step is not particularly limited and can be, for example, a Group III nitride crystal represented by $Al_xGa_yIn_{1-x-y}N$ ($0 \leq x \leq 1$, $0 \leq y \leq 1$, $x+y \leq 1$). Examples thereof include AlGaN, InGaN, InAlGaN, and GaN, each represented by the above-described composition, and GaN is particularly preferable. The composition of each Group III nitride crystal generated and grown in the crystal growth step may be identical to or different from that of the seed crystal. Preferably, the composition of each Group III nitride crystal is identical to that of the seed crystal from the viewpoint of obtaining a Group III nitride crystal of high quality with few defects.

More specifically, examples of the Group III nitride crystal production method by the first Group III nitride crystal production process include the following first liquid phase epitaxy and the following second liquid phase epitaxy.

<1-1-4. First Liquid Phase Epitaxy>

In the seed crystal selection step of the first liquid phase epitaxy of the first Group III nitride crystal production process, the preliminarily provided Group III nitride includes a plurality of Group III nitride crystals arranged on a substrate, and the Group III nitride crystals are selected as the seed crystals.

As described above, in the first Group III nitride crystal production process, crystal growth planes are not particularly limited.

Figure 3:
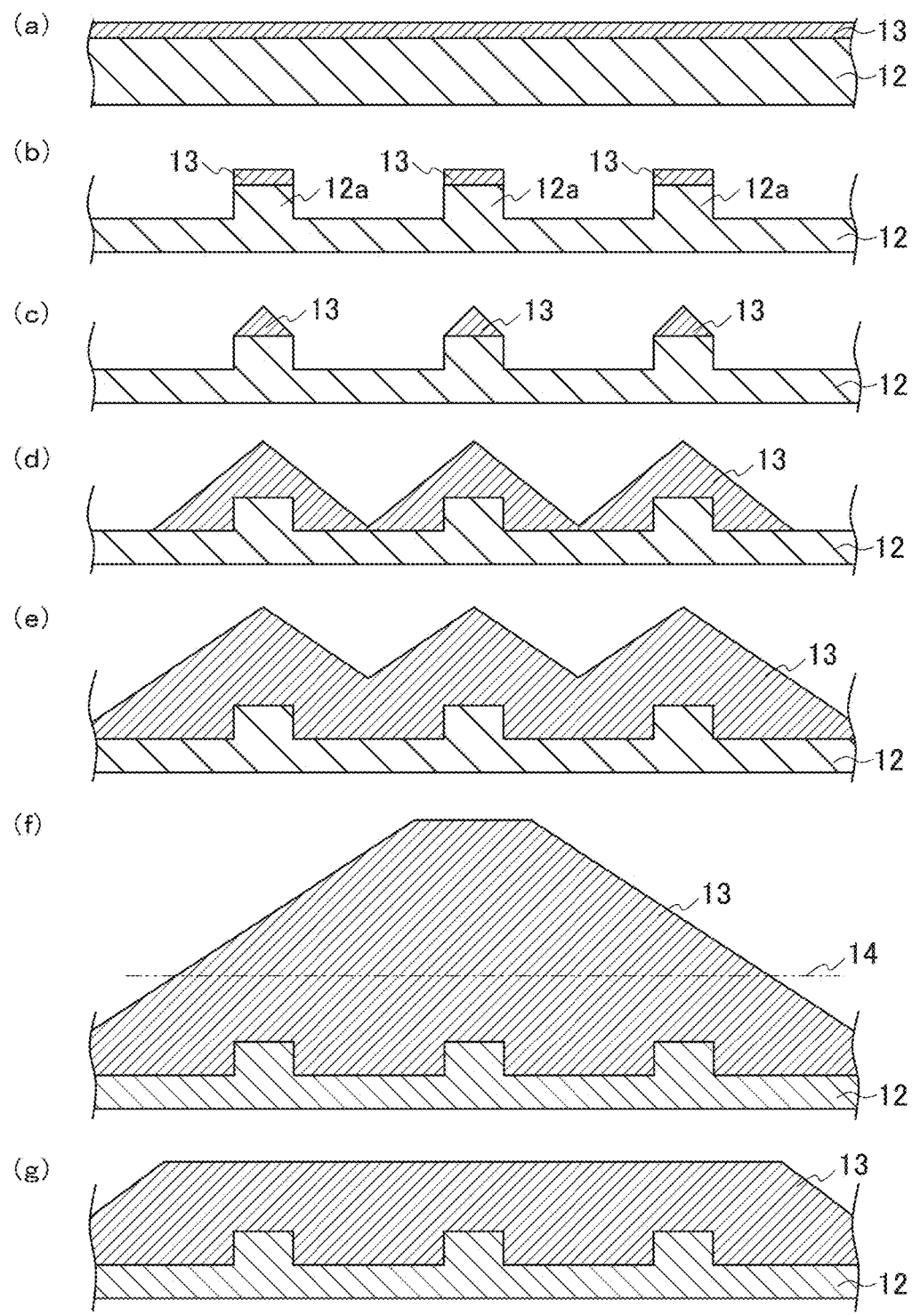
FIG. 3 shows cross sectional views showing an example of the first liquid phase epitaxy (a production method that uses plural Group III nitride crystals formed on a substrate) which is an example of the first Group III nitride crystal production process according to the present invention.

(a) to (g) of FIG. 3 are cross sectional views showing an example of the first liquid phase epitaxy of the present invention. First, as shown in (a) of FIG. 3, a Group III nitride crystal layer 13 that is to be seed crystal is formed on a substrate 12. Although the method for this is not particularly limited, the method may be, for example, vapor phase epitaxy such as MOCVD. The thickness of the Group III nitride crystal layer 13 also is not particularly limited and is, for example, from 1 to 100 μm, preferably from 2 to 100 μm, and more preferably from 5 to 50 μm. The material for the substrate 12 also is not particularly limited and may contain at least one selected from the group consisting of $Al_xGa_{1-x}N$ ($0<x \leq 1$), an oxide of the $Al_xGa_{1-x}N$ ($0<x \leq 1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten. The substrate 12 is particularly preferably a sapphire substrate from the viewpoint of the cost, the convenience, and the like.

Then, as shown in (b) of FIG. 3, upper parts of the substrate 12 and the Group III nitride crystal layer 13 on the upper parts are removed by etching or the like to cause the convex portions 12a of the substrate 12 and Group III nitride crystal layers (seed crystals) 13 arranged thereon to remain. These seed crystals are grown and bound together as in (c) to (f) of FIG. 3. The crystal can be used by cutting it at a plane parallel with the c-plane as shown in (g) of FIG. 3 (shown by a dashed line (cut plane) 14 in (f) of FIG. 3). It is to be noted that although the convex portions 12a shown in (b) of FIG. 3 each have a large thickness, the thickness of the convex portion 12a may be very small or zero (i.e., by removing only the Group III nitride crystal layer 13 without removing the upper parts of the substrate 12, the convex portions 12a may not be present).

The Group III nitride crystal production method of the present invention may further include a crystal re-growth step of further growing the produced Group III nitride crystal. Specifically, for example, in the crystal re-growth step, the produced Group III nitride crystal may be cut so that any plane (e.g., c-, m-, or a-plane or another nonpolar plane) is exposed, and the Group III nitride crystal may be further grown using the plane as a crystal growth plane. Thus, a Group III nitride crystal having a large area of any plane and a large thickness can be produced. Specifically, for example, the cut plane (c-plane) 14 of the Group III nitride crystal shown in (g) of FIG. 3 as a crystal growth plane may be further grown to increase the thickness thereof. This step corresponds to the above described "crystal re-growth step".

Although the seed crystals 13 are arranged on the convex portions 12a of the substrate in FIG. 3, the first liquid phase epitaxy of the present invention is not limited thereto. For example, the seed crystals may be arranged on a flat even substrate, or portions in which the seed crystals are arranged may be concave portions as substitute for the convex portions. It is considered that the produced crystal tends not to be directly in contact with the substrate other than the convex portions by forming the seed crystals on the convex portions of the substrate as shown in FIG. 3. In other words, although it is not shown in FIG. 3, it is considered that there are microscopic gaps (space) between the substrate 12 and the grown crystals 13 other than the convex portions. Thus, for example, it is possible to reduce or prevent warping, a distortion, cracking, and the like of the crystal, caused by the difference in thermal expansion coefficient between the substrate and the crystal as described above. This description however is a mere example of a possible mechanism and does not limit the present invention at all.

Figure 4:
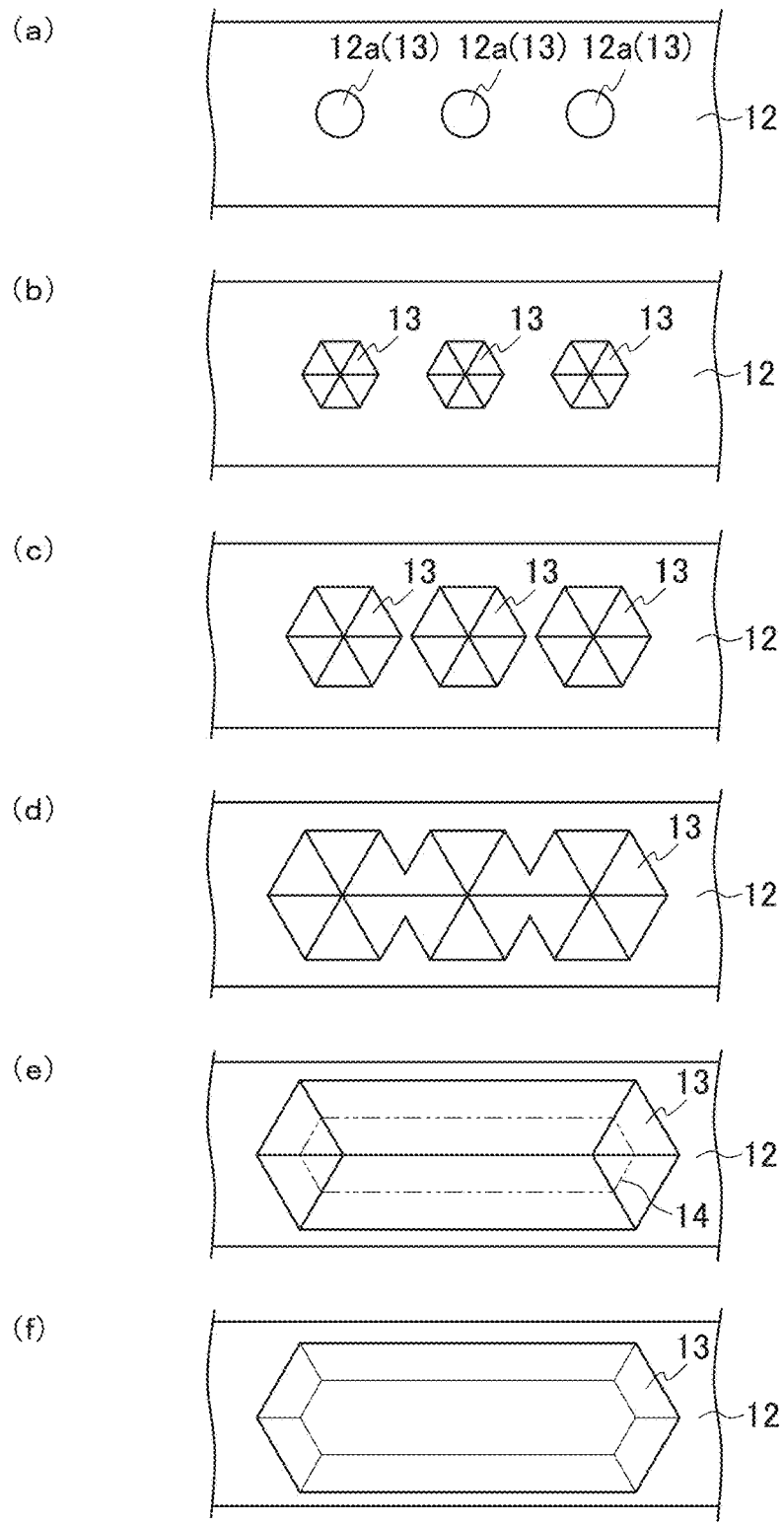
FIG. 4 shows plan views showing the production method shown in FIG. 3.

The plan views of (a) to (f) of FIG. 4 are drawings viewed from above the steps of (b) to (g) of FIG. 3. In (a) to (f) of FIG. 4, the identical parts to those shown in (b) to (g) of FIG. 3 are denoted by the identical reference numerals. As shown in FIG. 4, the convex portions 12a of the substrate are dot-shaped convex portions, and Group III nitride crystals generated from seed crystals arranged thereon are equilateral hexagons. These Group III nitride crystals are bound together by the growth as shown in (d) to (e) of FIG. 4. As shown in (a) of FIG. 4, three dots (seed crystal location positions) 12a are aligned on a straight line. Thus, after binding of the three crystals, a long and thin hexagonal crystal as in (e) of FIG. 4 is obtained.

The sizes of the dots of the convex portions 12a (i.e., the sizes of dots that are the seed crystals), the arrangement relationship between a-axes of the seed crystals that are adjacent to each other, the distance between the centers of the dots, and the like are the same as those described in "1-1-2 Arrangement relationship, shape, size, and the like of seed crystal". The a-axis direction of the Group III nitride crystal layer 13 can be checked by an X-ray diffraction method (XRD), for example. Thus, on the basis of the direction, the arrangement of the convex portions 12a can be determined. For example, in the case where seed crystals are formed by removing parts of the Group III nitride crystal layer 13 as shown in (a) and (b) of FIG. 3, the seed crystals that are formed after removal may be arranged so as to align in the a-axis direction of the Group III nitride crystal layer 13 in (a) of FIG. 3.

Figure 5:
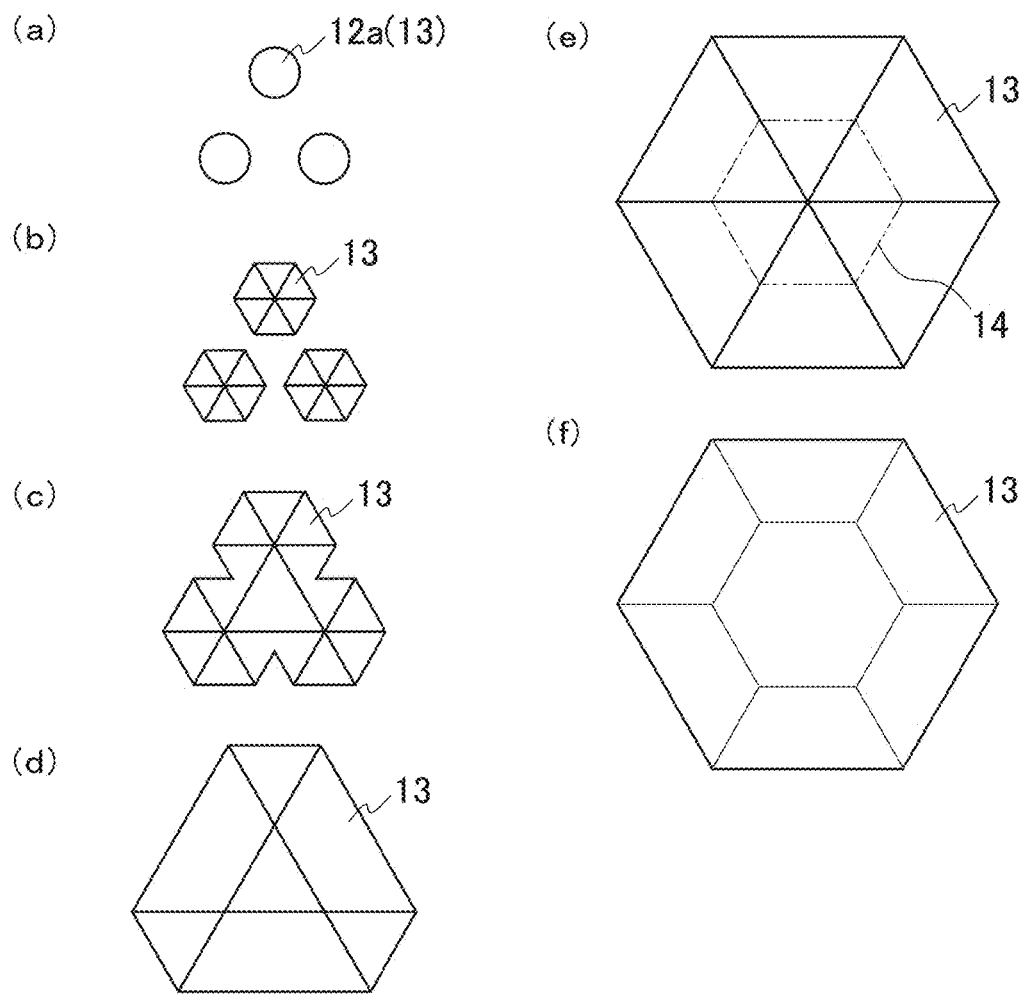
FIG. 5 shows plan views showing another example of the first liquid phase epitaxy of the present invention.
Figure 6:
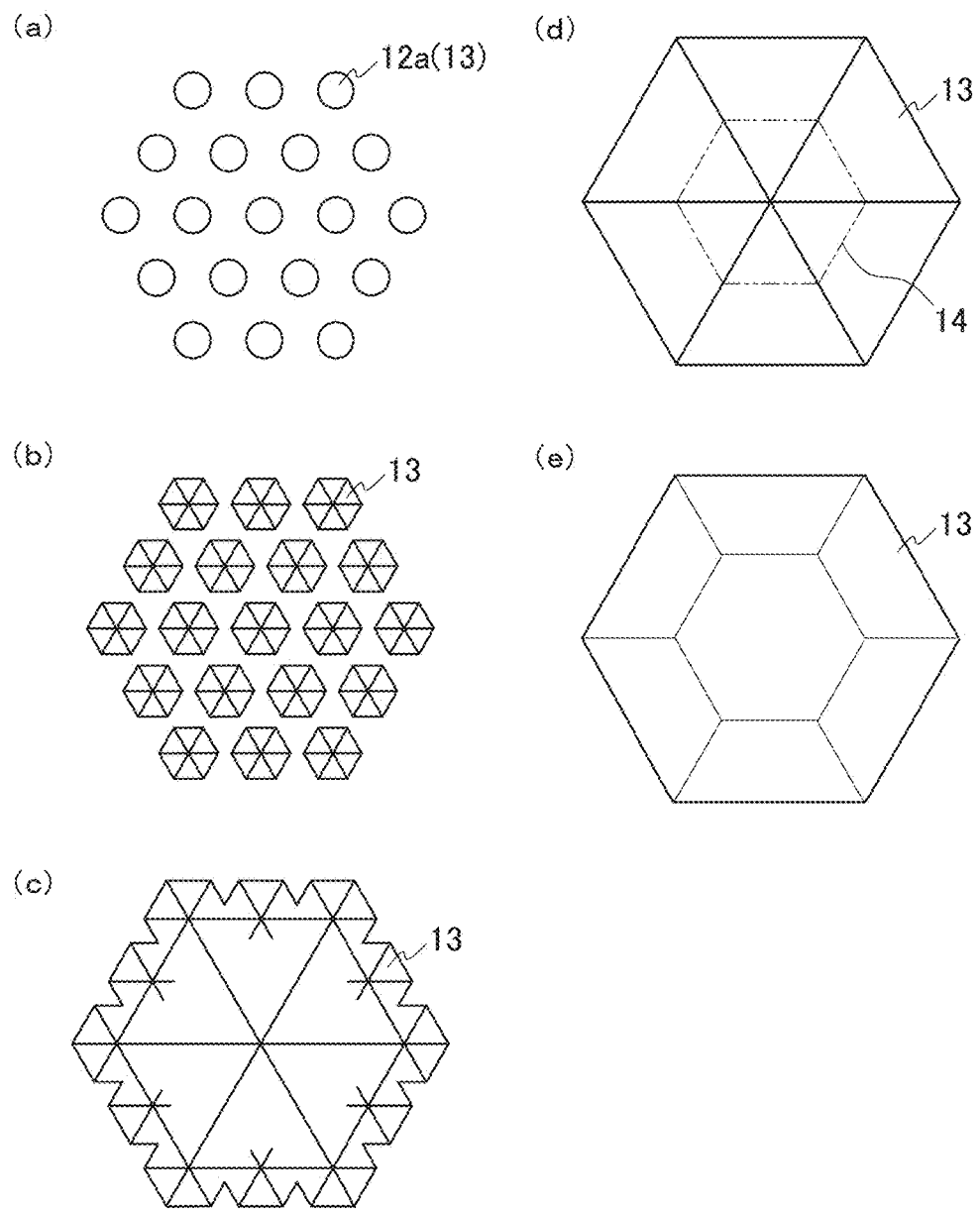
FIG. 6 shows plan views showing still another example of the first liquid phase epitaxy of the present invention.

The arrangement of the seed crystal 13 (convex portion 12a) is not limited by the arrangement shown in FIGS. 3 and 4. For example, as shown in the plan views of (a) to (f) of FIG. 5, three dots may be arranged on the apexes of an equilateral triangle, or many dots further may be arranged as shown in (a) to (e) of FIG. 6 by repeating the pattern. By increasing the number of dots as described above, a Group III nitride crystal in a larger size can be produced. In FIGS. 5 and 6, identical parts to those shown in FIGS. 3 and 4 are indicated by identical reference numerals.

In the first Group III nitride crystal production process according to the present invention, the arrangement relationship, shape, size, and the like of seed crystal are not particularly limited. As shown in FIG. 18C, the arrangement of not facing (coinciding) the m-planes (sides of an equilateral hexagon) of Group III nitride crystals 13 is preferable because defects are less prone to occur at sites at which the crystals are associated when the crystals are associated (bound) by crystal growth. This is also as described in the section "1-1-2. Arrangement relationship, shape, size, and the like of seed crystal".

<1-1-5. Second Liquid Phase Epitaxy>

Next, in the seed crystal selection step of the second liquid phase epitaxy of the first Group III nitride crystal production process, the preliminarily provided Group III nitride is a Group III nitride crystal layer, a mask having a plurality of through holes is arranged on the Group III nitride crystal layer, and parts of the plane of the Group III nitride crystal layer exposed from the through holes are selected as the seed crystals.

In the second liquid phase epitaxy of the present invention, the crystal growth plane is not particularly limited as in the first liquid phase epitaxy. For example, the Group III nitride crystal layer may be a Group III nitride crystal layer having a c-plane, the mask may be arranged on the c-plane, and parts of the c-plane exposed from the through holes may be selected as the seed crystals (crystal growth planes of the seed crystals). Alternatively, the Group III nitride crystal layer may be a Group III nitride crystal layer having an m-plane, the mask may be arranged on the m-plane, and parts of the m-plane exposed from the through holes may be selected as the seed crystals (crystal growth planes of the seed crystals). Although the case where the crystal growth plane is the c-plane is mainly described below, the Group III nitride crystal may be produced in the same manner except that the crystal growth plane is replaced by another plane such as the m-plane.

Figure 7:
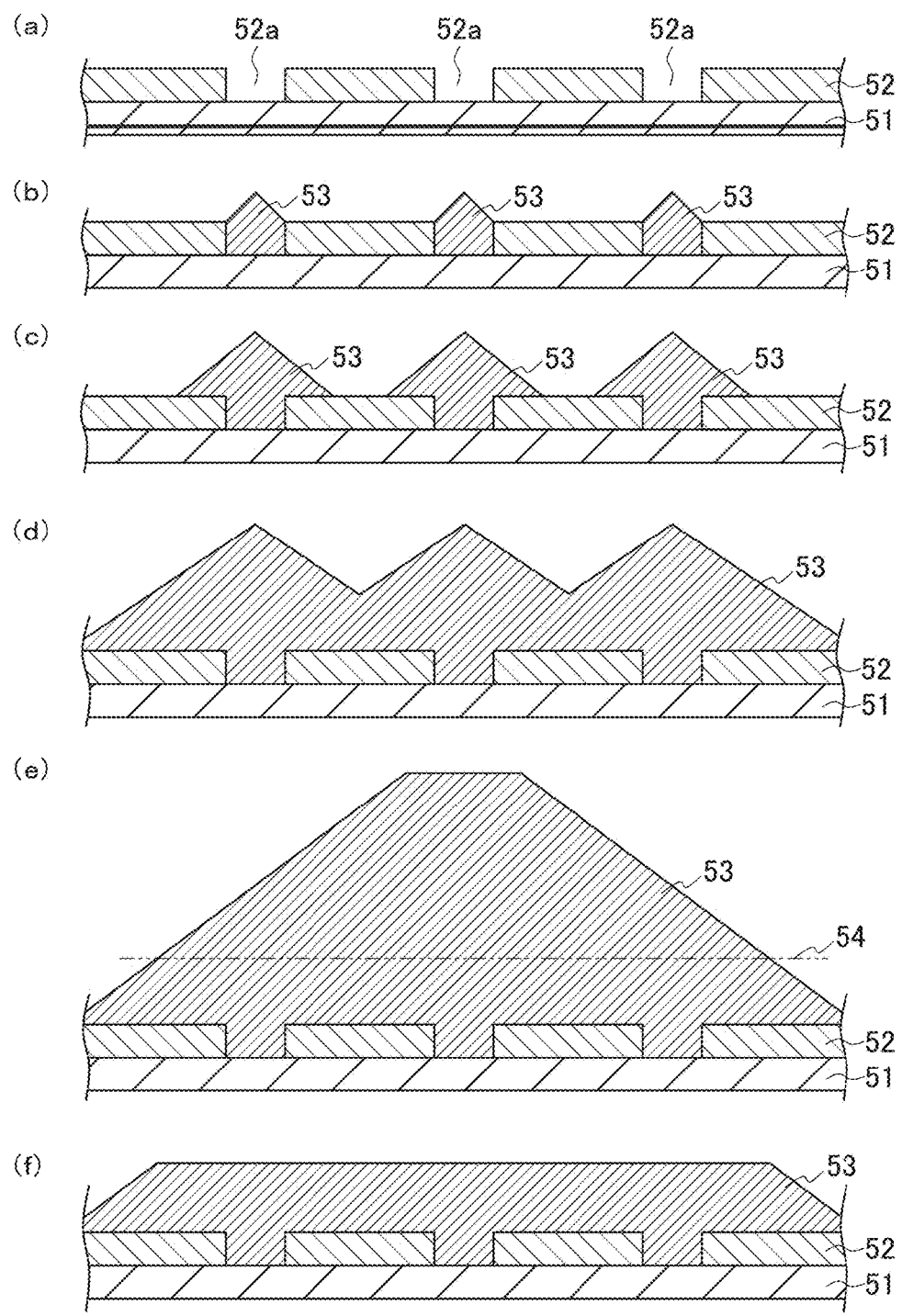
FIG. 7 shows cross sectional views showing an example of the second liquid phase epitaxy (a Group III nitride crystal production method that uses units in each of which a mask having plural dot-shaped through holes is formed on a Group III nitride crystal layer) which is an example of the first Group III nitride crystal production process according to the present invention.

(a) to (f) of FIG. 7 schematically show, by way of example, steps of producing a Group III nitride crystal by the second liquid phase epitaxy of the present invention. That is, first, as shown in (a) of FIG. 7, a mask 52 having through holes 52a is arranged on the c-plane of a Group III nitride crystal layer 51, which is a hexagonal crystal. Parts of the c-plane of the Group III nitride crystal layer 51 exposed from these through holes 52a become seed crystals.

That is, it can be said that this step of arranging a mask 52 is a seed crystal selection step of selecting seed crystals for generation and growth of Group III nitride crystals. The Group III nitride crystal layer 51 is not particularly limited and may be, for example, a Group III nitride crystal substrate or the like. From the viewpoint of the costs and the convenience, the Group III nitride crystal layer 51 is preferably a Group III nitride crystal formed on another substrate (not shown). From the viewpoint of producing a Group III nitride crystal of high quality with few defects, the Group III nitride crystal layer 51 is preferably a Group III nitride substrate of high quality. The Group III nitride substrate may be, for example, an independent substrate (free-standing substrate) which is not formed on another substrate. It is to be noted that, according to the present invention, even by using a Group III nitride crystal formed on another substrate, a Group III nitride crystal of high quality with few defects can be produced as described above. The thickness of the Group III nitride crystal layer 51 also is not particularly limited and is, for example, from 1 to 100 µm, preferably from 2 to 100 µm, and more preferably from 5 to 50 µm. Another substrate on which a Group III nitride crystal is formed is not particularly limited, and examples thereof include a sapphire substrate and a silicon carbide substrate. The mask 52 may be formed on the c-plane of the Group III nitride crystal layer by deposition, application, or the like. Preferably, the mask 52 having through holes 12a is previously formed and merely placed on the Group III nitride crystal layer 51 because of the convenience. Preferably, the mask 52 does not adhere to the Group III nitride crystal layer 51 for the reason that the mask 52 easily can be reused and the like. The material for the mask 52 also is not particularly limited and is preferably a material that is less likely to react with an alkali metal melt, and examples thereof include a carbon-based material and oxide. The mask may contain at least one selected from the group consisting of $Al_xGa_{1-x}N$ ($0<x\leq1$), an oxide of the $Al_xGa_{1-x}N$ ($0<x\leq1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten. In the present invention, the mask 52 is particularly preferably a sapphire mask from the viewpoint of the cost, the convenience, and the like. The thickness of the mask 52 also is not particularly limited and is, for example, from 0.0005 to 2 mm, preferably from 0.01 to 1 mm, and more preferably from 0.05 to 0.5 mm.

Subsequently, the parts (seed crystals) of the c-plane of the Group III nitride crystal layer 51 exposed from the through holes 52a are brought into contact with an alkali metal melt (contact step). Further, a Group III element and nitrogen are caused to react with each other in a nitrogen-containing atmosphere in the alkali metal melt to generate and grow Group III nitride crystals (crystal growth step). This crystal growth step is shown in (b) to (e) of FIG. 7. As shown in (b) and (c) of FIG. 7, Group III nitride crystals 53 are generated and grown from the surfaces of the seed crystals. By causing the Group III nitride crystals 53 to be further grown and to be bound together as shown in (d) and (e) of FIG. 7, a large Group III nitride seed crystal of high quality with few defects can be produced. This Group III nitride crystal can be used as in (f) of FIG. 7 by cutting it at the plane (indicated by the dashed line 54 in (e) of FIG. 7) parallel with the c-plane, for example. Although (f) of FIG. 7 shows a lower part of the Group III nitride crystal after the cutting, an upper part also can be used. By cutting (dicing) as described above, the Group III nitride crystal can be used easily as a semiconductor substrate for semiconductor apparatus or the like, for example. Moreover, for example, the cut plane (c-plane) of the Group III nitride crystal shown in (f) of FIG. 7 as a crystal growth plane may be further grown to increase the thickness thereof. This step corresponds to the above described "crystal re-growth step".

The shape, size, arrangement, distance (distance between the centers of seed crystals that are adjacent to each other), and the like of the through hole 52a of the mask may be the same as those of the seed crystal in the first liquid phase epitaxy of the present invention, for example. For example, in FIGS. 4 to 6, the second liquid phase epitaxy of the present invention can be schematically shown by substituting the mask 52 for the substrate 12, the through holes 52a for the convex portions 12a, and the Group III nitride crystal 53 for the Group III nitride crystal 13. In the same manner as the first liquid phase epitaxy, the a-axis direction of the Group III nitride crystal layer 51 can be checked by an X-ray diffraction method (XRD), for example. Thus, on the basis of the direction, the arrangement of the through holes 52a can be determined. For example, in the case of FIG. 7, seed crystals exposed from the through holes 52a are plural parts of the Group III nitride crystal layer 51 of one piece. Thus, for example, the through holes 52a may be arranged so as to align in the a-axis direction of the Group III nitride crystal layer 51.

Figure 27:
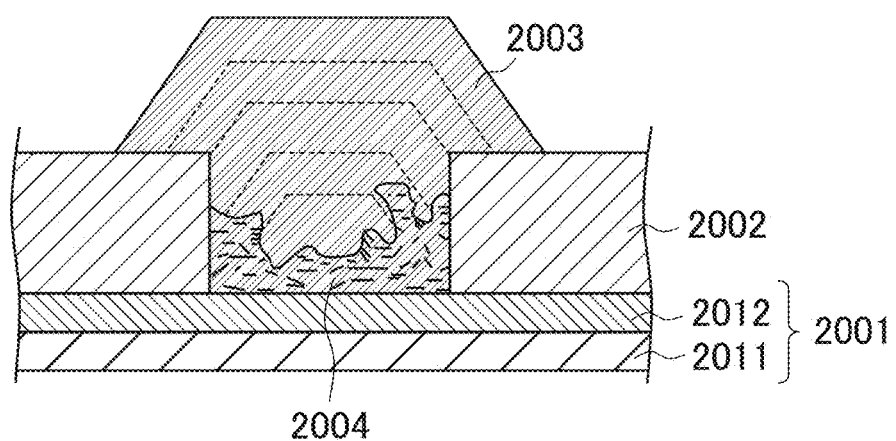
FIG. 27 is a cross sectional view schematically showing an example of a mechanism of crystal growth from a through hole in a mask.

In the first liquid phase epitaxy of the present invention, as described above, a Group III nitride crystal of high quality with few defects can be produced by using small Group III nitride seed crystals. In the second liquid phase epitaxy of the present invention, it is also possible to produce a Group III nitride crystal of higher quality with fewer defects by using the mask having through holes. Although the reason for this is unknown, it is considered that, for example, defects such as a dislocation of crystal and the like are extended laterally and are not extended vertically when crystals are laterally grown out from the through holes in the course of growing the crystals. FIG. 27 shows an example of this. In FIG. 27, a seed substrate obtained by forming a Group III nitride (e.g., GaN) crystal layer 2012 on a substrate 2011 is indicated by the numeral 2001. A mask (e.g., a sapphire mask) formed on the Group III nitride crystal layer 2012 is indicated by the numeral 2002. As shown in FIG. 27, a part of the surface of the Group III nitride crystal 2012 is exposed from a small through hole formed in the mask 2002, and a Group III nitride crystal 2003 is grown using the exposed small part as a seed crystal. Thus, it is considered that crystal defects 2004 are terminated in the through holes of the mask 2002 and that the crystal defects tend not to be propagated inside the grown Group III nitride crystal 2003. FIG. 27 however schematically shows a mere example of a possible mechanism, and the present invention is not at all limited by the drawing and the description thereof.

Figure 14A:
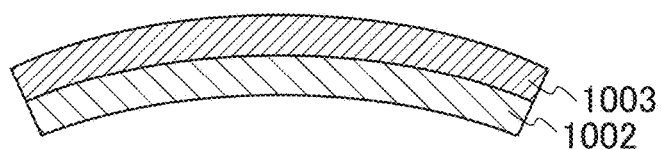
FIG. 14A is a cross sectional view showing, by way of example, a distortion of a Group III nitride crystal grown on a substrate.

According to a common method for producing a Group III nitride crystal, for example, in the case where there is a difference in thermal expansion coefficient between a substrate and a crystal, there is a possibility of causing warping, a distortion, cracking, and the like in the crystal by warping of the substrate while producing or using the crystal. An example of this is schematically shown in the cross sectional view of FIG. 14A. As shown in FIG. 14A, a GaN crystal 1003 is formed on a sapphire substrate 1002. The GaN crystal 1003 is warped together with the sapphire substrate 1002 by the difference in thermal expansion coefficient between them. By the warping, a distortion is caused in the GaN crystal 1003, and there is a possibility of causing cracking in some cases. However, it is considered that according to the first liquid phase epitaxy of the present invention, such a problem can be prevented or reduced.

That is, according to the second liquid phase epitaxy of the present invention, the produced Group III nitride crystal and the Group III nitride crystal layer (seed crystal) are not directly in contact with each other at points other than the through holes and are separated by the mask. Therefore, even if warping is caused in the independent substrate and the like that is present in or below the Group III nitride crystal layer (seed crystal) that is below the mask, there is less possibility of causing warping, a distortion, cracking, and the like in the Group III nitride crystals formed on the mask. Moreover, according to the second liquid phase epitaxy of the present invention, the seed crystals are not formed on the mask, and thus, the Group III nitride crystals grown from the seed crystals and the mask are not directly in contact with each other. Therefore, even in the case where there is a difference in thermal expansion coefficient between the mask and the Group III nitride crystals (for example, the mask is sapphire, and the Group III nitride crystals are GaN), there is less possibility of causing warping, a distortion, cracking, and the like in the Group III nitride crystals due to the warping of the mask.

On the other hand, it is considered that the first liquid phase epitaxy of the present invention is superior in crystal growth efficiency by arranging seed crystals directly on a substrate without using a mask and through holes. For example, the first liquid phase epitaxy of the present invention or the second liquid phase epitaxy of the present invention may be used as desired according to the purpose, for example.

<1-1-6. Liquid Phase Epitaxy Causing Through Hole or Concave Portion to Remain>

In the first Group III nitride crystal production process in the production method according to the present invention, as described above, preferably, a first Group III nitride crystal in which through holes remain is obtained by not binding some parts of the Group III nitride crystals that are adjacent to one another or a first Group III nitride crystal in which concave portions, which are formed by filling the through holes by further growth of crystals, remain is obtained. Details are described below.

Figure 8:
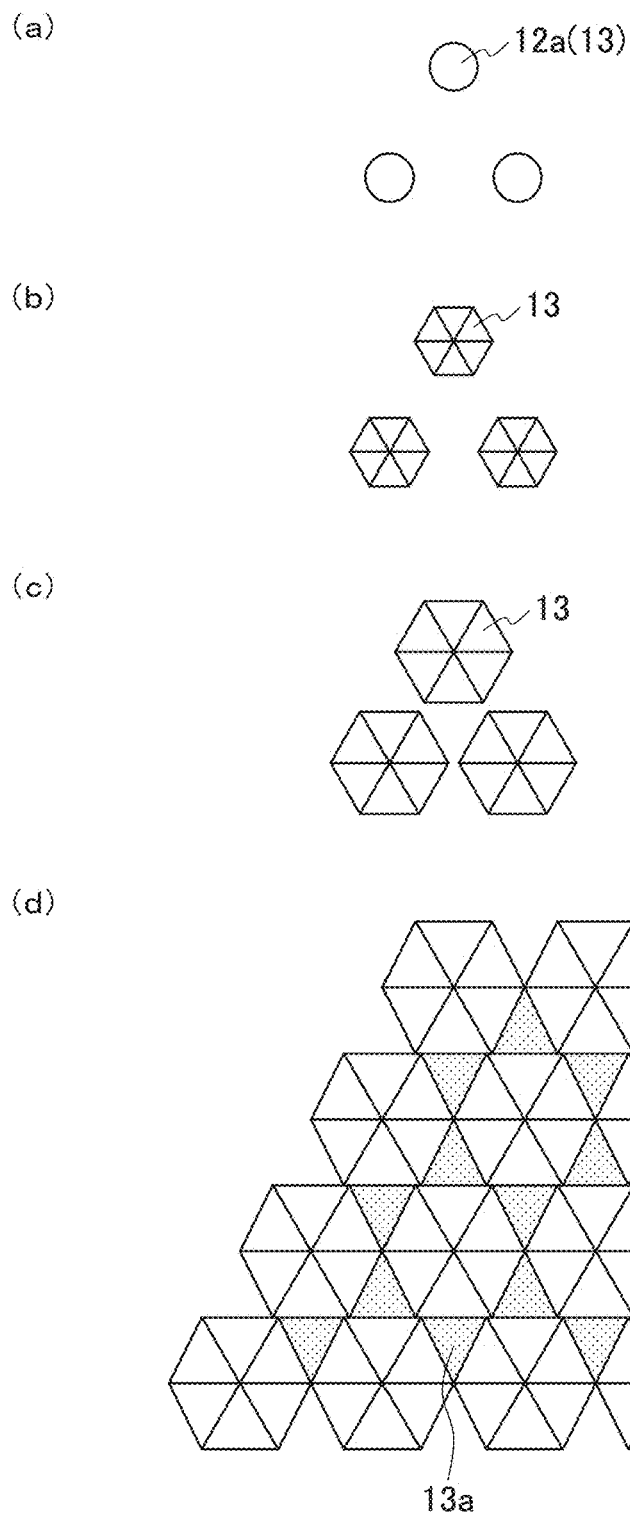
FIG. 8 shows process diagram showing an example in which a first Group III nitride crystal in which through holes remain is obtained by not binding some parts of the Group III nitride crystals that are adjacent to one another in the first Group III nitride crystal production process according to the present invention.

The plan views of (a) to (d) of FIG. 8 show an example of the liquid phase epitaxy of the first Group III nitride crystal production process of the present invention. In the liquid phase epitaxy shown in (a) to (d) of FIG. 8, a Group III nitride crystal in which the through holes remain is the first Group III nitride crystal. (a) to (d) of FIG. 8 show an example in which the first liquid phase epitaxy (the method in which a mask is not used) is used. As shown in (a) to (d) of FIG. 8, seed crystals 13 (convex portions 12a) are arranged such that the pattern in which three dots are arranged on the apexes of an equilateral triangle is repeated as shown in FIGS. 5 and 6. It is to be noted that in (a) to (c) of FIG. 8, only three dots on the apexes of an equilateral triangle are shown for simplification of drawing. Furthermore, in FIG. 8, seed crystals 13 (convex portions 12a) are hexagonal crystals and are arrange such that the m-planes of the crystals grown from the seed crystals 13 that are adjacent to each other do not almost coincide with each other. Moreover, seed crystals 13 (convex portions 12a) are arranged such that the a-axes of the seed crystals 13 that are adjacent to each other coincide with each other and apexes of hexagonal Group III nitride crystals grown coincide with each other.

As shown in (a) to (c) of FIG. 8, the seed crystals 13 arranged on the convex portions 12a are grown to become Group III nitride crystals 13. Then, as shown in (d) of FIG. 8, the Group III nitride crystals are bound together to become a Group III nitride crystal 13 of one piece. It is to be noted that, in (d) of FIG. 8, different from FIGS. 5 and 6, the first Group III nitride crystal 13 in which through holes 13*a* remain is obtained by not binding some parts of the Group III nitride crystals that are adjacent to one another. As shown in (d) of FIG. 8, the through holes 13*a* remain at sites where the holes are in contact with the sides of the hexagonal Group III nitride crystals grown from the seed crystals arranged on the convex portions 12*a*.

It is to be noted that although (a) to (d) of FIG. 8 are described as an example of the first liquid phase epitaxy (the method in which a mask is not used), the same can be applied to the second liquid phase epitaxy (the method in which a mask is used, e.g., the method shown in FIG. 7).

Furthermore, as described above, a first Group III nitride crystal in which concave portions, which are formed by filling the through holes by further growth of crystals, remain may be used. Examples of the state where the through holes remain and the state where the concave portions remain are described below. When the crystals are further grown from the state where the concave portions remain, the first Group III nitride crystal of one piece in which the concave portions do not remain is obtained as shown in (f) of FIG. 3 or (e) of FIG. 7.

Figure 9:
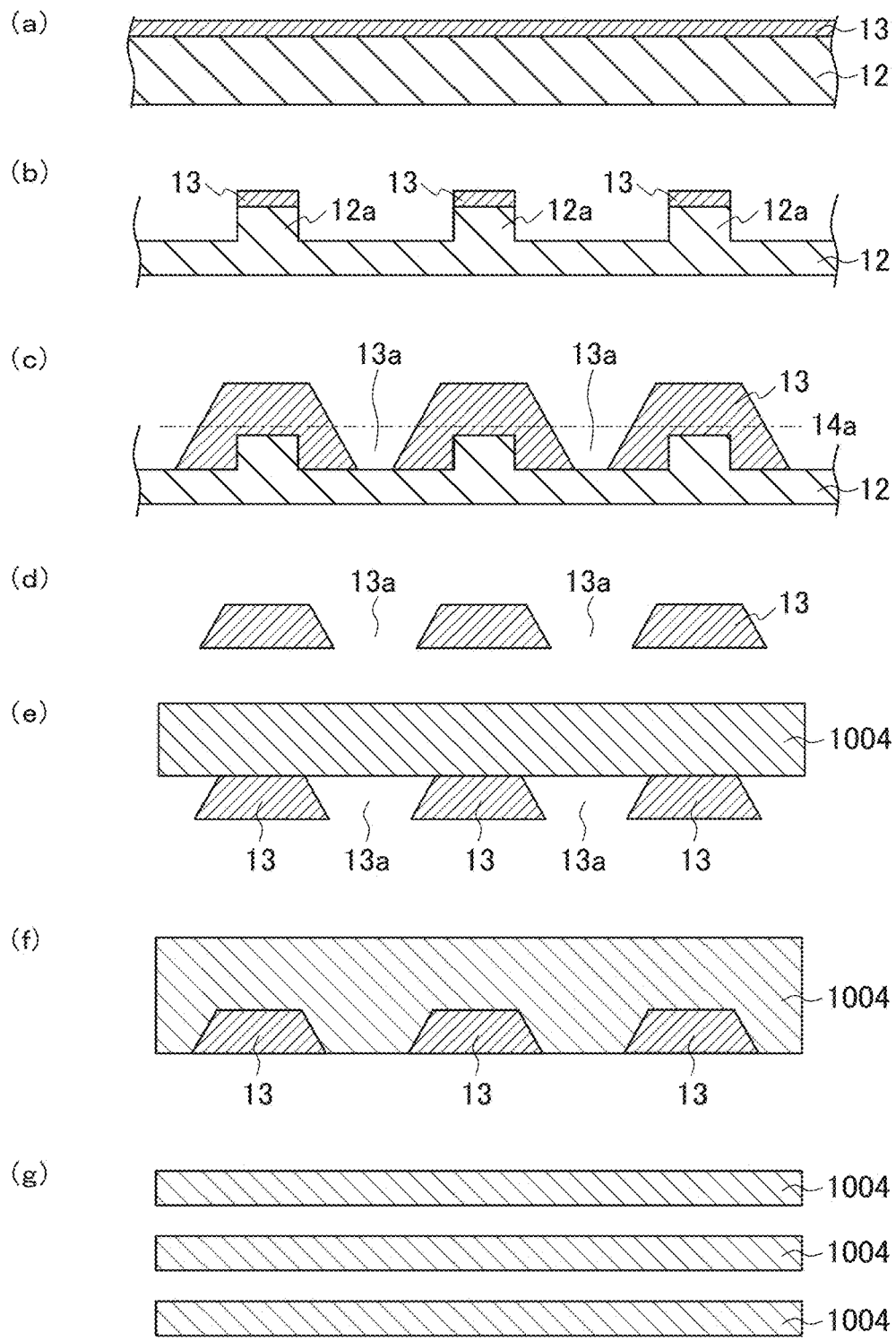
FIG. 9 shows cross sectional views showing another example of the production method according to the present invention. (a) to (d) of FIG. 9 show the first liquid phase epitaxy (a production method that uses plural Group III nitride crystals formed on a substrate). In (a) to (d) of FIG. 9, a first Group III nitride crystal in which through holes remain is obtained by not binding some parts of the Group III nitride crystals that are adjacent to one another. (e) and (f) of FIG. 9 shows the second Group III nitride crystal production process (vapor phase epitaxy). (g) of FIG. 9 shows a slicing step of slicing the second Group III nitride crystal.
Figure 10:
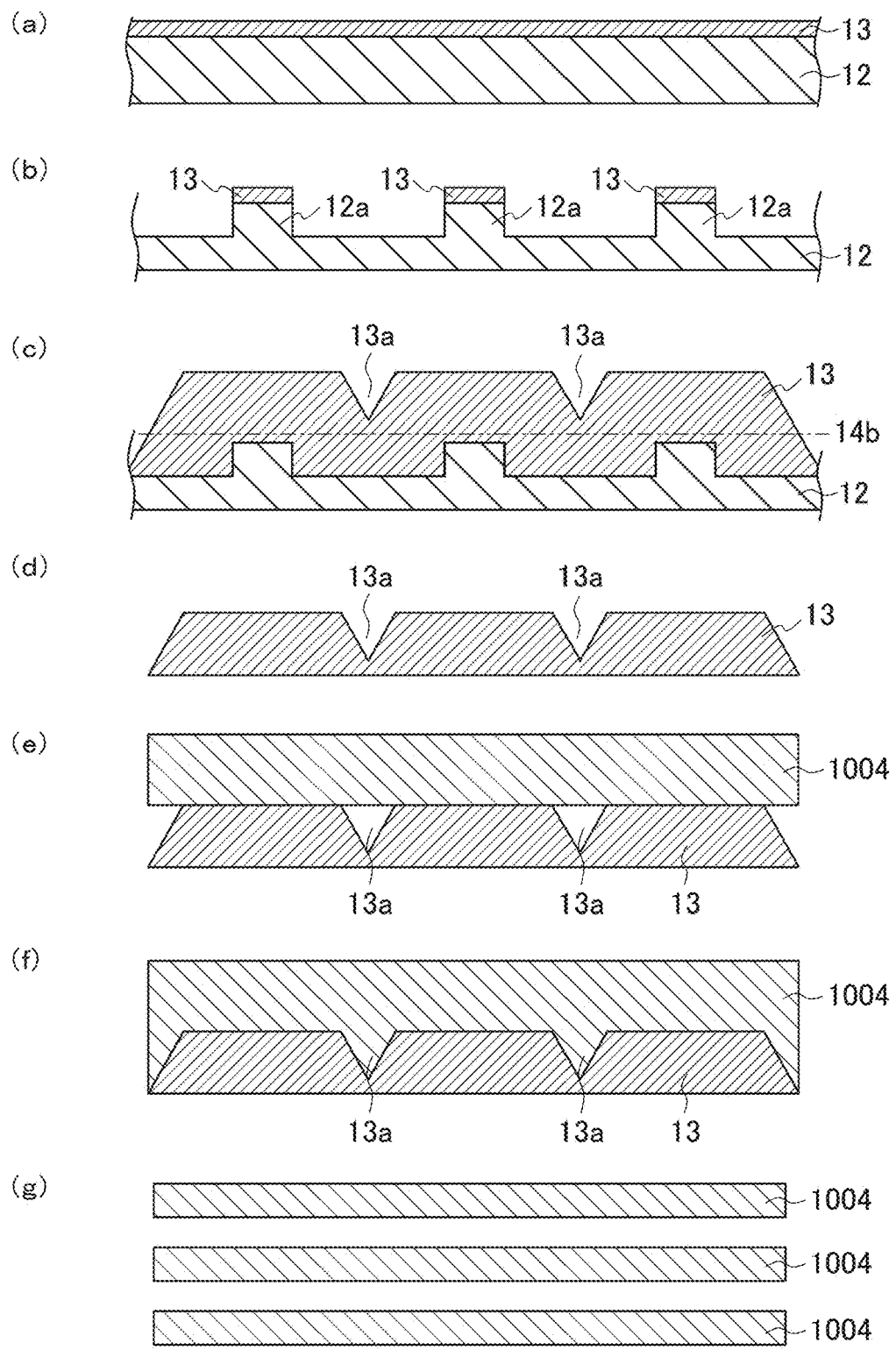
FIG. 10 shows cross sectional views showing still another example of the production method according to the present invention. (a) to (d) of FIG. 10 show the first liquid phase epitaxy (a production method that uses plural Group III nitride crystals formed on a substrate). In (a) to (d) of FIG. 10, a first Group III nitride crystal in which concave portions, which are formed by filling the through holes by further growth of crystals, remain is obtained. (e) and (f) of FIG. 10 show the second Group III nitride crystal production process (vapor phase epitaxy). (g) of FIG. 10 shows a slicing step of slicing the second Group III nitride crystal.
Figure 11:
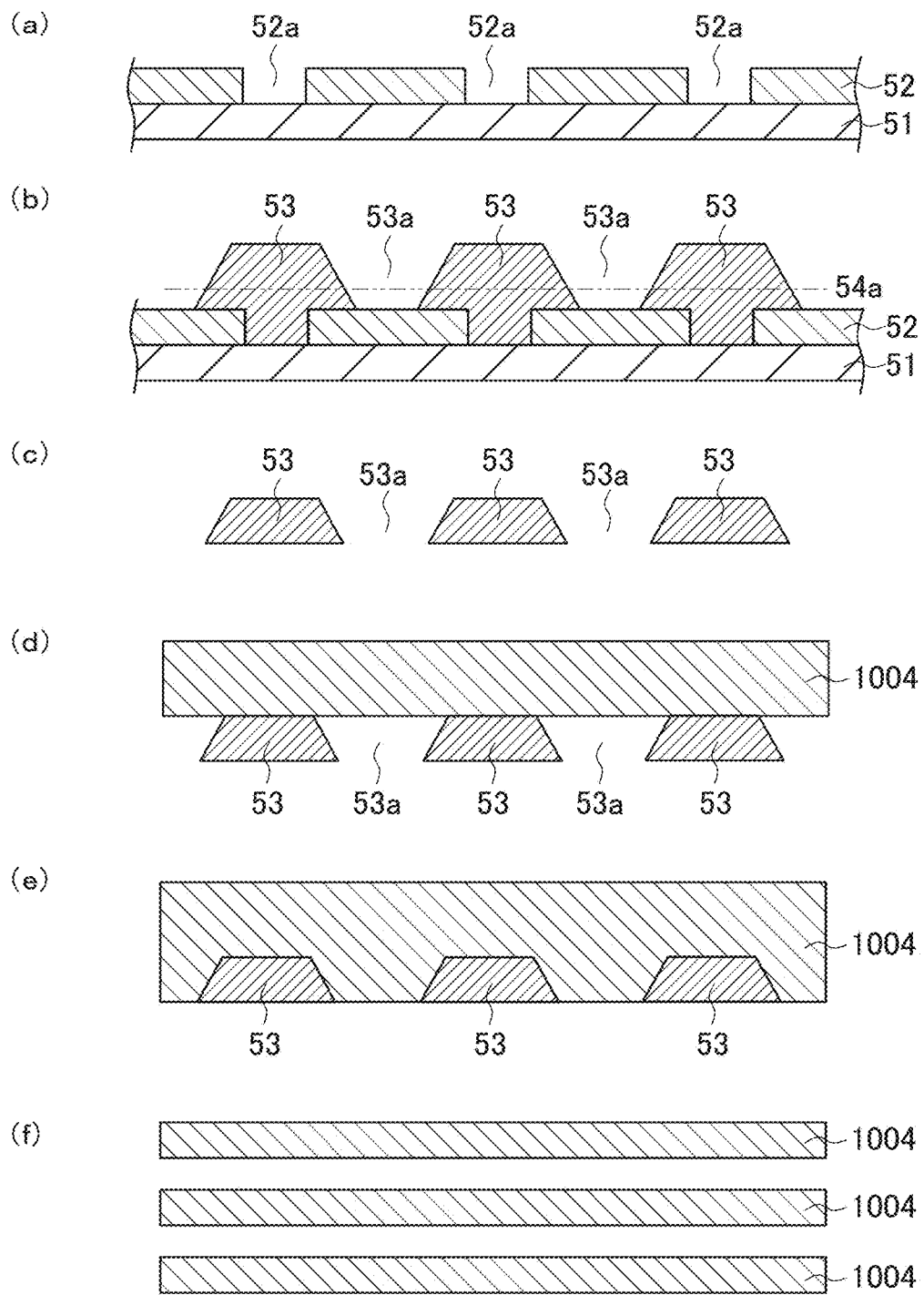
FIG. 11 shows cross sectional views showing still another example of the production method according to the present invention. (a) to (c) of FIG. 11 show the first liquid phase epitaxy (a production method that uses units in each of which a mask having plural dot-shaped through holes is formed on a Group III nitride crystal layer). In (a) to (c) of FIG. 11, a first Group III nitride crystal in which through holes remain is obtained by not binding some parts of the Group III nitride crystals that are adjacent to one another. (d) and (e) of FIG. 11 show the second Group III nitride crystal production process (vapor phase epitaxy). (f) of FIG. 11 shows a slicing step of slicing the second Group III nitride crystal.
Figure 12:
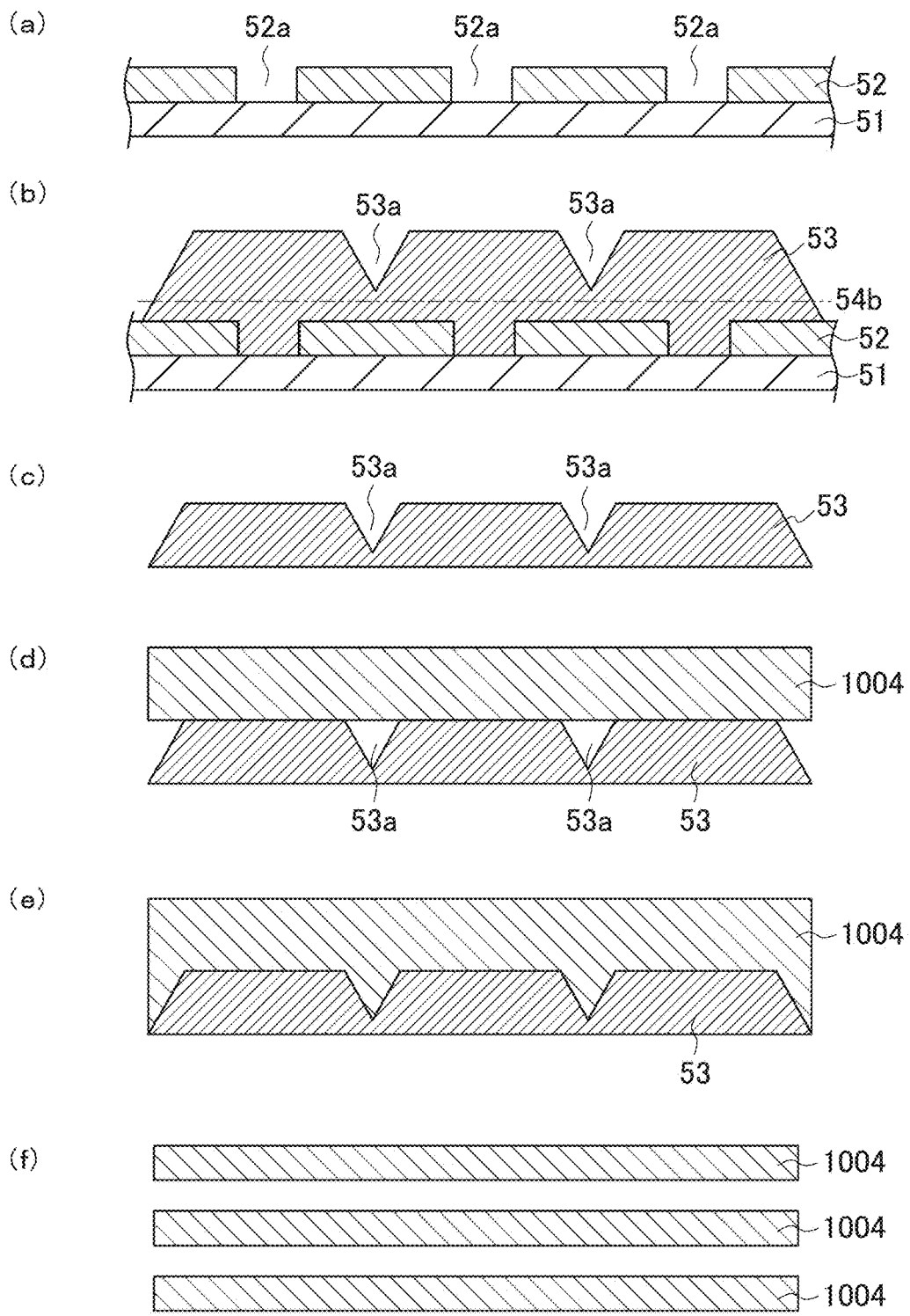
FIG. 12 shows cross sectional views showing still another example of the production method according to the present invention. (a) to (c) of FIG. 12 show the first liquid phase epitaxy (a production method that uses units in each of which a mask having plural dot-shaped through holes is formed on a Group III nitride crystal layer). In (a) to (c) of FIG. 12, a first Group III nitride crystal in which concave portions, which are formed by filling the through holes by further growth of crystals, remain is obtained. (d) and (e) of FIG. 12 show the second Group III nitride crystal production process (vapor phase epitaxy). (f) of FIG. 12 shows a slicing step of slicing the second Group III nitride crystal.

Next, examples of the method for allowing the through holes or concave portions to remain in the first liquid phase epitaxy (the method in which a mask is not used) and the second liquid phase epitaxy (the method in which a mask is used) are described with reference to cross sectional views of FIGS. 9 to 12. FIG. 9 shows an example of allowing the through holes to remain in the first liquid phase epitaxy (the method in which a mask is not used). FIG. 10 shows an example of allowing the concave portions to remain in the first liquid phase epitaxy (the method in which a mask is not used). FIG. 11 shows an example of allowing the through holes to remain in the second liquid phase epitaxy (the method in which a mask is used). FIG. 12 shows an example of allowing the concave portions to remain in the second liquid phase epitaxy (the method in which a mask is used).

First, the cross sectional views of FIG. 9 ((a) to (g) of FIG. 9) are described. First, as shown in (a) of FIG. 9, a Group III nitride crystal layer 13 that is to be seed crystals is formed on a substrate 12. Next, as shown in (b) of FIG. 9, upper parts of the substrate 12 and the Group III nitride crystal layer 13 on the upper parts are removed by etching or the like to allow the convex portions 12*a* of the substrate 12 and Group III nitride crystal layers (seed crystals) 13 arranged thereon to remain. More specifically, for example, the process may be the same as that shown in (a) and (b) of FIG. 3. Furthermore, the arrangement of the convex portions 12*a* (seed crystals 13) may be the same as that shown in FIG. 8, for example.

Next, the seed crystals 13 are grown as shown in (c) of FIG. 9. As shown in (c) of FIG. 9, in the state where the seed crystals 13 are grown, the first Group III nitride crystal 13 in which through holes 13*a* remain is obtained by not binding some parts of the Group III nitride crystals that are adjacent to one another. Furthermore, although it is not shown in (c) of FIG. 9, the Group III nitride crystals 13 of (c) of FIG. 9 excluding the through holes 13*a* are bound together to be one piece as in (d) of FIG. 8. (b) of FIG. 9 can be a cross sectional view obtained by cutting any seed crystal 13 shown in the plan view of (a) of FIG. 8 along the m-plane that passes through the center of the seed crystal 13, for example. Furthermore, (c) of FIG. 9 can be a cross sectional view obtained by cutting any crystal 13 shown in the plan view of (d) of FIG. 8 along the m-plane that passes through the center of the crystal 13, for example.

The first Group III nitride crystal 13 shown in (c) of FIG. 9 may be used in the second Group III nitride crystal production process (vapor phase epitaxy) without processing or may be used in the state where it is cut along a plane (for example, the dashed line 14*a* in (c) of FIG. 9) parallel with the substrate (the state shown in (d) of FIG. 9). Furthermore, although only the upper part of each Group III nitride crystal 13 is used in (d) of FIG. 9, the lower part may be used. Moreover, in the Group III nitride crystal 13 of (c) or (d) of FIG. 9, the size of the through hole 13*a* may be adjusted appropriately by polishing or the like of its top surface.

Then, as shown in (e) of FIG. 9, the second Group III nitride crystal 1004 is produced on the first Group III nitride crystal 13 by the vapor phase epitaxy (second Group III nitride crystal production process). The details of the second Group III nitride crystal production process (vapor phase epitaxy) are described below.

In the second Group III nitride crystal production process that is performed after (c) or (d) of FIG. 9, by changing the growth conditions of the second Group III nitride crystal 1004, the through holes 13*a* of the first Group III nitride crystal 13 may be filled as shown in (f) of FIG. 9 in place of (e) of FIG. 9. It is also possible to create the state that is intermediate between (e) of FIG. 9 and (f) of FIG. 9 (the state where through holes are partially filled). The present invention can be used in any of the state shown in (e) of FIG. 9, the state shown in (f) of FIG. 9, and the state that is intermediate therebetween. The state shown in (e) of FIG. 9 where voids remain at the lower part of the second Group III nitride crystal 1004 is preferable because a higher reduction effect in crystal defects and distortions can be obtained. In the second Group III nitride crystal production process (vapor phase epitaxy), whether not to fill the through holes (for example, (e) of FIG. 9) or fill the through holes (for example, (f) of FIG. 9) with the Group III nitride crystal grown (produced) can be controlled by the $H_2$ concentration of the carrier gas (first carrier gas and second carrier gas) that is described below, for example. Specifically, the through holes tend to be filled when the $H_2$ concentration of the carrier gas is high (for example, 75 volume % or more) and the through holes tend not to be filled when the $H_2$ concentration is low (for example, 75 volume % or less). The above description and the numerical values however merely are examples and do not limit the present invention at all. Furthermore, the second Group III nitride crystal 1004 of (e) or (f) of FIG. 9 may be used after cutting (slicing) it into thin pieces as shown in (g) of FIG. 9, for example. The Group III nitride crystal 1004 after slicing can be used as a Group III nitride crystal substrate in a semiconductor apparatus and the like, for example. The thickness of the Group III nitride crystal 1004 after slicing is not particularly limited, and it can be determined appropriately in consideration of the final target thickness of the substrate and the removal margin at the time of polishing the substrate, for example. Although the final target thickness changes depending on the diameter and the like of the substrate so that it cannot be determined unconditionally, the thickness of the Group III nitride crystal 1004 after slicing is preferably, for example, about 400 μm to 500 μm for producing a GaN substrate having a diameter of φ2 inch.

Next, as described above, the cross sectional views of (a) to (g) of FIG. 10 show an example of allowing the concave portions to remain in the first liquid phase epitaxy (the method in which a mask is not used). First, (a) and (b) of FIG. 10 are the same as (a) and (b) of FIG. 9. Next, (c) of FIG. 10 shows the state where the crystals are further grown from the state shown in (c) of FIG. 9 and the through holes 13a are filled to become concave portions 13a. The first Group III nitride crystal 13 shown in (c) of FIG. 10 may be used in the state where it is cut along a plane (for example, the dashed line 14b in (c) of FIG. 10) parallel with the substrate (the state shown in (d) of FIG. 10). Furthermore, although the upper part of each Group III nitride crystal 13 cut is used in (d) of FIG. 10, the lower part where the concave portions 13a do not remain may be used. The Group III nitride crystal 13 may be cut at a position higher than the dashed line 14b shown in (c) of FIG. 10 to allow the concave portions 13a to remain at the lower part of the Group III nitride crystal 13 after cutting, and the lower part where the concave portions 13a remain may be used. In this case, through holes instead of the concave portions 13a remain at the upper part of the Group III nitride crystal 13 after cutting. (e) to (g) of FIG. 10 are the same as (e) to (g) of FIG. 9 except that the first Group III nitride crystal 13 (in which through holes remain) shown in (c) or (d) of FIG. 9 is replaced with the first Group III nitride crystal 13 (in which concave portions remain) shown in (c) or (d) of FIG. 10.

Furthermore, as described above, the cross sectional views of (a) to (f) of FIG. 11 show an example of allowing the through holes to remain in the second liquid phase epitaxy (the method in which a mask is used). As described above, the cross sectional views of (a) to (f) of FIG. 12 show an example of allowing the concave portions to remain in the second liquid phase epitaxy (the method in which a mask is used). The cross sectional views of (a) to (f) of FIG. 11 are the same as (b) to (g) of FIG. 9 except that the substrate 12, the convex portions 12a, and the seed crystals 13 on the convex portions 12a shown in (b) to (g) of FIG. 9 are replaced with the Group III nitride crystal layer 51, the mask 52, and the through holes 52a (this relationship is similar to the relationship between FIG. 3 and FIG. 7). The first Group III nitride crystal 53 shown in (b) of FIG. 11 may be used in the state where it is cut along a plane (for example, the dashed line 54a in (b) of FIG. 11) parallel with the substrate. In this case, either the upper part ((c) of FIG. 11) or the lower part may be used. Furthermore, the cross sectional views of (a) to (f) of FIG. 12 are the same as (b) to (g) of FIG. 10 except that the substrate 12, the convex portions 12a, and the seed crystals 13 on the convex portions 12a shown in (b) to (g) of FIG. 10 are replaced with the Group III nitride crystal layer 51, the mask 52, and the through holes 52a (this relationship is similar to the relationship between FIG. 3 and FIG. 7). The first Group III nitride crystal 53 shown in (b) of FIG. 12 may be used in the state where it is cut along a plane (for example, the dashed line 54a in (b) of FIG. 12) parallel with the substrate. The first Group III nitride crystal 53 shown in (b) of FIG. 12 may be used in the state where it is cut along a plane (for example, the dashed line 54b in (b) of FIG. 12) parallel with the substrate. In this case, either the upper part ((c) of FIG. 12) or the lower part in which concave portions 53a do not remain may be used. The Group III nitride crystal 53 may be cut at a position higher than the dashed line 54b shown in (b) of FIG. 12 to allow the concave portions 53a to remain at the lower part of the Group III nitride crystal 53 after cutting, and the lower part where the concave portions 53a remain may be used. In this case, not the concave portions 53a but the through holes remain on the upper part of the Group III nitride crystal 53 after cutting.

Examples of the effect of allowing the through holes or concave portions to remain in the Group III nitride crystal liquid phase growth step (liquid phase epitaxy) include the following (1) to (3). These effects however merely are examples and do not limit the present invention at all.

(1) The presence of through holes or concave portions relieves the crystal distortion of the first Group III nitride crystal (crystal produced by the liquid phase epitaxy). As a result, the crystal distortion of the second Group III nitride crystal grown on the first Group III nitride crystal by the vapor phase epitaxy can be relieved.

(2) The Group III nitride crystal liquid phase growth step (liquid phase epitaxy) can be terminated at the phase where through holes or concave portion still remain. Thus, the Group III nitride crystal achieves high production efficiency and yield.

(3) The dislocation of the first Group III nitride crystal (crystal produced by the liquid phase epitaxy) is less prone to occur. As a result, the second Group III nitride crystal grown on the first Group III nitride crystal by vapor phase epitaxy is less prone to inherit the dislocation of the first Group III nitride crystal.

When the through holes or the concave portions are allowed to remain in the Group III nitride crystal liquid phase growth step, as described above, preferably, the seed crystals are arranged such that the a-axes of the seed crystals that are adjacent to each other coincide with each other and the apexes of the hexagons of the Group III nitride crystal grown from the seed crystals that are adjacent to each other almost coincide with each other. This is because such a configuration makes it easy to produce a crystal of high quality with few defects as described in the section "1-1-2. Arrangement relationship, shape, size, and the like of seed crystal".

As described above, preferably, a polarity inversion region is substantially not present in the first Group III nitride crystal (crystal produced by liquid phase epitaxy, especially, its concave portions). This is because, if a polarity inversion region is not present in the first Group III nitride crystal (crystal produced by liquid phase epitaxy), crystal defects (for example, defects such as unevenness of crystal, and the like) due to the polarity inversion region are not caused in the second Group III nitride crystal (crystal produced by vapor phase epitaxy).

A polarity inversion region is less prone to occur in the Group III nitride crystal grown by the liquid phase epitaxy as compared to in the Group III nitride crystal grown by the vapor phase epitaxy. According to the present invention, by forming the second Group III nitride crystal (crystal produced by vapor phase epitaxy) on the first Group III nitride crystal (crystal produced by the liquid phase epitaxy), it is possible to produce a Group III nitride crystal in which a polarity inversion region is substantially not present even when the vapor phase epitaxy is used. In the present invention, the description "a polarity inversion region is "substantially not present"" means that the number of the polarity inversion regions detected by the convergent beam electron diffraction (CBED) is 10 or less, preferably 5 or less, and more preferably 0 (a polarity inversion region is not detected) within the plane of the substrate, for example, with the substrate having a diameter of $\varphi$2 inch. Prior to the CBED, for example, by utilizing the difference in the etching rate between a polarity inversion region and a polarity non-inversion region, a position where a polarity inversion region is likely to be present is detected by etching. Then, whether the position detected is actually a polarity inversion region is determined by the CBED.

Furthermore, preferably, plural through holes or concave portions are arranged with high symmetry. This isotropically absorbs the crystal distortions of the first Group III nitride crystal (crystal produced by liquid phase epitaxy) and the second Group III nitride crystal (crystal produced by vapor phase epitaxy) formed thereon and further reduces the crystal distortion, for example. Specifically, for example, the through holes or the concave portions are preferably arranged in six-fold symmetry as shown in (d) of FIG. 8.

Moreover, for example, as described above, the size (diameter) of the through hole or the concave portion may be adjusted appropriately by the polishing or the like of the top surface of the first Group III nitride crystal (crystal produced by liquid phase epitaxy). This makes it possible to further reduce the crystal defects such as the crystal distortion and the like, for example.

<1-1-7. Contact Step and Crystal Growth Step and Apparatuses Used Therein>

As described above, the first Group III nitride crystal production process of the production method according to the present invention includes: a seed crystal selection step of selecting a plurality of parts of a preliminarily provided Group III nitride as seed crystals for generation and growth of Group III nitride crystals; a contact step of bringing the surfaces of the seed crystals into contact with an alkali metal melt; and a Group III nitride crystal liquid phase growth step of causing a Group III element and nitrogen to react with each other in a nitrogen-containing atmosphere in the alkali metal melt to generate and grow Group III nitride crystals. In the Group III nitride crystal liquid phase growth step, the Group III nitride crystals are bound together by growth of the Group III nitride crystals grown from the seed crystals to produce the first Group III nitride crystal. Specifically, the first Group III nitride crystal production process is as described in the sections from "1-1. First Group III nitride crystal production process (liquid phase epitaxy)" to "1-1-6. Liquid phase epitaxy causing through hole or concave portion to remain", for example. Other than this, the first Group III nitride crystal production process is not particularly limited and can be performed in the same manner as in a method for producing a Group III nitride crystal by common liquid phase epitaxy (LPE) using an alkali metal melt, for example, and an example of this is described below.

For example, there is a sodium flux method (Naflux method) as a method for producing gallium nitride (GaN) used in a semiconductor substrate of LED or a power device. In this method, for example, first, a seed crystal (e.g., a GaN thin film formed on a sapphire substrate) is set in a crucible. In addition to the seed crystal, sodium (Na) and gallium (Ga) at an appropriate ratio are stored in the crucible. Then, the sodium and the gallium in the crucible are melted under high-temperature (e.g., 800° C. to 1000° C.) and high-pressure (e.g., several tens of atmospheres) atmosphere to cause nitrogen gas ($N_2$) to be melted in the melt thus obtained. Thus, the GaN seed crystal in the crucible can be grown, and an intended GaN crystal can be produced.

In the first Group III nitride crystal production process, for example, the seed crystal set in the crucible may be provided as described in the sections from "1-1. First Group III nitride crystal production process (liquid phase epitaxy)" to "1-1-5. Second liquid phase epitaxy" according to the seed crystal selection step, for example. The subsequent steps may be performed by the same method as the common sodium flux method or the same method with appropriate changes, for example. For example, any of the other Group III elements may be used as a substitute for Ga. More specifically, for example, the Group III nitride crystal is as described in the section "1-1-3. Composition of Group III nitride crystal and the like".

In the first Group III nitride crystal production process, the crystal growth step is, as described above, performed in a nitrogen-containing atmosphere. In the "nitrogen-containing atmosphere", the form of nitrogen is not particularly limited, and examples thereof include gas, a nitrogen molecule, a nitrogen compound, and the like. The "nitrogen-containing atmosphere" is preferably a nitrogen-containing gas atmosphere because the nitrogen-containing gas melts in the flux and becomes a material for growing a Group III nitride crystal. As the nitrogen-containing gas, any of the other nitrogen-containing gases such as an ammonia gas ($NH_3$) and the like may be used in addition to or as a substitute for the above described nitrogen gas ($N_2$). In the case of using a mixed gas of a nitrogen gas and an ammonia gas, the ratio of the nitrogen gas and the ammonium gas to be mixed may be any ratio. Using an ammonia gas is particularly preferable because the reaction pressure can be reduced.

As the alkali metal melt (flux), any of the other alkali metals such as lithium and the like may be used in addition to or as a substitute for the sodium. More specifically, the alkali metal melt contains at least one selected from the group consisting of lithium (Li), sodium (Na), potassium (K), rubidium (Rb), cesium (Cs), and francium (Fr) and may be, for example, a mixed flux of Na and Li, or the like. The alkali metal melt is particularly preferably a sodium melt. The alkali metal melt may or may not contain one or more kinds of components other than the alkali metal. The component other than the alkali metal is not particularly limited, and examples thereof include any of the alkali earth metals. Examples of the alkali earth metal include calcium (Ca), magnesium (Mg), strontium (Sr), barium (Ba), and radium (Ra), and among them, Ca and Mg are preferable, and Ca is more preferable. As a component other than the alkali metal, for example, carbon (carbon alone or a carbon compound) may or may not be contained. Preferably, the melt contains carbon alone that generates cyan (CN) or a carbon compound that generates cyan (CN). The carbon may be an organic substance in the form of gas. Examples of such carbon alone or a carbon compound include cyanide, graphite, diamond, fullerene, carbon nanotube, methane, ethane, propane, butane, and benzene. The content of the carbon is not particularly limited and is, for example, in the range from 0.01% to 20% by atom (at.), from 0.05% to 15% by atom (at.), from 0.1% to 10% by atom (at.), from 0.1% to 5% by atom (at.), from 0.25% to 7.5% by atom (at.), from 0.25% to 5% by atom (at.), from 0.5% to 5% by atom (at.), from 0.5% to 2.5% by atom (at.), from 0.5% to 2% by atom (at.), from 0.5% to 1% by atom (at.), from 1% to 5% by atom (at.), or from 1% to 2% by atom (at.) with reference to the total of the melt, the Group III element, and the carbon. Among them, from 0.5% to 5% by atom (at.), from 0.5% to 2.5% by atom (at.), from 0.5% to 2% by atom (at.), from 0.5% to 1% by atom (at.), from 1% to 5% by atom (at.), or from 1% to 2% by atom (at.) is preferable.

The ratio of the alkali metal to be added to the Group III element is, for example, from 0.1% to 99.9% by mol, preferably from 1% to 99% by mol, and more preferably from 5% to 98% by mol. The molar ratio in the case of using a mixed flux of an alkali metal and an alkali earth metal is, for example, the alkali metal:the alkali earth metal=from 99.99 to 0.01:from 0.01 to 99.99, preferably from 99.9 to 0.05:from 0.1 to 99.95, and more preferably from 99.5 to 1:from 0.5 to 99. A high purity of the melt is preferable. For example, the purity of Na is preferably 99.95% or more. As a flux component (e.g., Na) of high purity, a commercially available product of high purity may be used, or a substance obtained by purchasing a commercially available product and increasing the purity thereof by a method such as distillation may be used.

The reaction temperature and the reaction pressure of the Group III element and the nitrogen-containing gas are not limited to the above-described numerals and can be set as appropriate. Although an appropriate reaction temperature and an appropriate reaction pressure vary depending on the component of the melt (flux), the component of atmosphere gas, and the pressures thereof, the reaction temperature and the reaction pressure are, for example, a temperature from 100° C. to 1500° C. and a pressure from 100 Pa to 20 MPa, preferably a temperature from 300° C. to 1200° C. and a pressure from 0.01 MPa to 20 MPa, more preferably a temperature from 500° C. to 1100° C. and a pressure from 0.1 MPa to 10 MPa, and yet more preferably a temperature from 700° C. to 1100° C. and a pressure from 0.1 MPa to 10 MPa. The reaction time, i.e., the time for growing a crystal, is not particularly limited and can be set as appropriate so as to grow the crystal to an appropriate size and is, for example, from 1 to 1000 hr, preferably from 5 to 600 hr, and more preferably from 10 to 400 hr.

In the first Group III nitride crystal production process, there is a possibility of melting the seed crystals before the concentration of nitrogen is increased depending on the flux in some cases. In order to prevent this, nitride may be caused to be present in the flux at least during the early stage of the reaction. Examples of the nitride include $Ca_3N_2$, $Li_3N$, $NaN_3$, BN, $Si_3N_4$, and InN, and these nitrides may be used alone or two or more of them may be used in combination. The proportion of the nitride in the flux is, for example, from 0.0001% to 99% by mol, preferably from 0.001% to 50% by mol, and more preferably from 0.005% to 10% by mol.

In the first Group III nitride crystal production process, an impurity may be caused to be present in the mixed flux. By causing an impurity to be present in the mixed flux, an impurity-containing GaN crystal can be produced. Examples of the impurity include silicon (Si), alumina ($Al_2O_3$), indium (In), aluminum (AO, indium nitride (InN), silicon oxide ($SiO_2$), indium oxide ($In_2O_3$), zinc (Zn), magnesium (Mg), zinc oxide (ZnO), magnesium oxide (MgO), and germanium (Ge).

The first Group III nitride crystal production process may further include a step of stirring the melt. The stage of performing the step of stirring the melt is not particularly limited and can be performed in, for example, at least one of the stage before the crystal growth step, the stage at the same time with the crystal growth step, and the stage after the crystal growth step. More specifically, for example, the step of stirring the melt may be performed before the crystal growth step, at the same time with the crystal growth step, or at the both timing.

An apparatus used in the first Group III nitride crystal production process is not particularly limited and may be the same as an apparatus used in common apparatus (LPE apparatus) and is, for example, specifically an LPE apparatus or the like described in Patent Document 3 (Japanese Patent No. 4588340). Such an LPE apparatus is described below with reference to FIGS. 24A to 26. It can be said that such an apparatus corresponds to the "first Group III nitride crystal production unit" of the Group III nitride crystal production apparatus of the present invention.

Figures 24A, 24B:
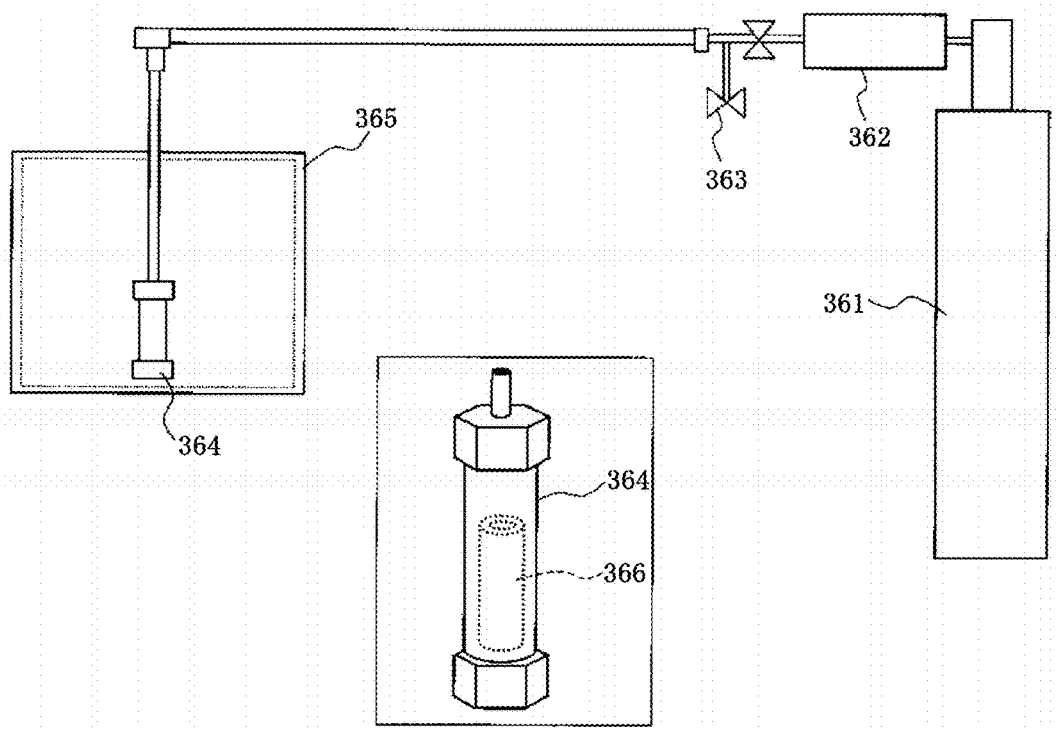
FIGS. 24A and 24B are schematic views showing a configuration of an example of an apparatus for use in the production method according to the present invention.

The schematic views of FIGS. 24A and 24B show an example of a configuration of the LPE apparatus. The LPE apparatus shown in FIG. 24A includes: a raw material gas tank 361 for supplying, as a raw material gas, a nitrogen gas or a mixed gas of an ammonia gas ($NH_3$ gas) and a nitrogen gas; a pressure adjuster 362 for adjusting a pressure of the growth atmosphere; a valve for leakage 363; a stainless container 364 for growing a crystal; and an electric furnace 365. FIG. 24B is an enlarged view of the stainless container 364, and a crucible 366 is set in the stainless container 364. The crucible 366 is composed of boron nitride (BN), alumina ($Al_2O_3$), yttrium aluminum garnet (YAG), or the like. The temperature of the crucible 366 can be controlled in the range from 600° C. to 1000° C. The atmospheric pressure (from 100 atm ($100 \times 1.013 \times 10^5$ Pa) to 150 atm ($150 \times 1.013 \times 10^5$ Pa)) supplied from the raw material gas tank 361 can be controlled at 100 atm ($100 \times 1.013 \times 10^5$ Pa) or less by the pressure adjuster 362.

Figure 25:
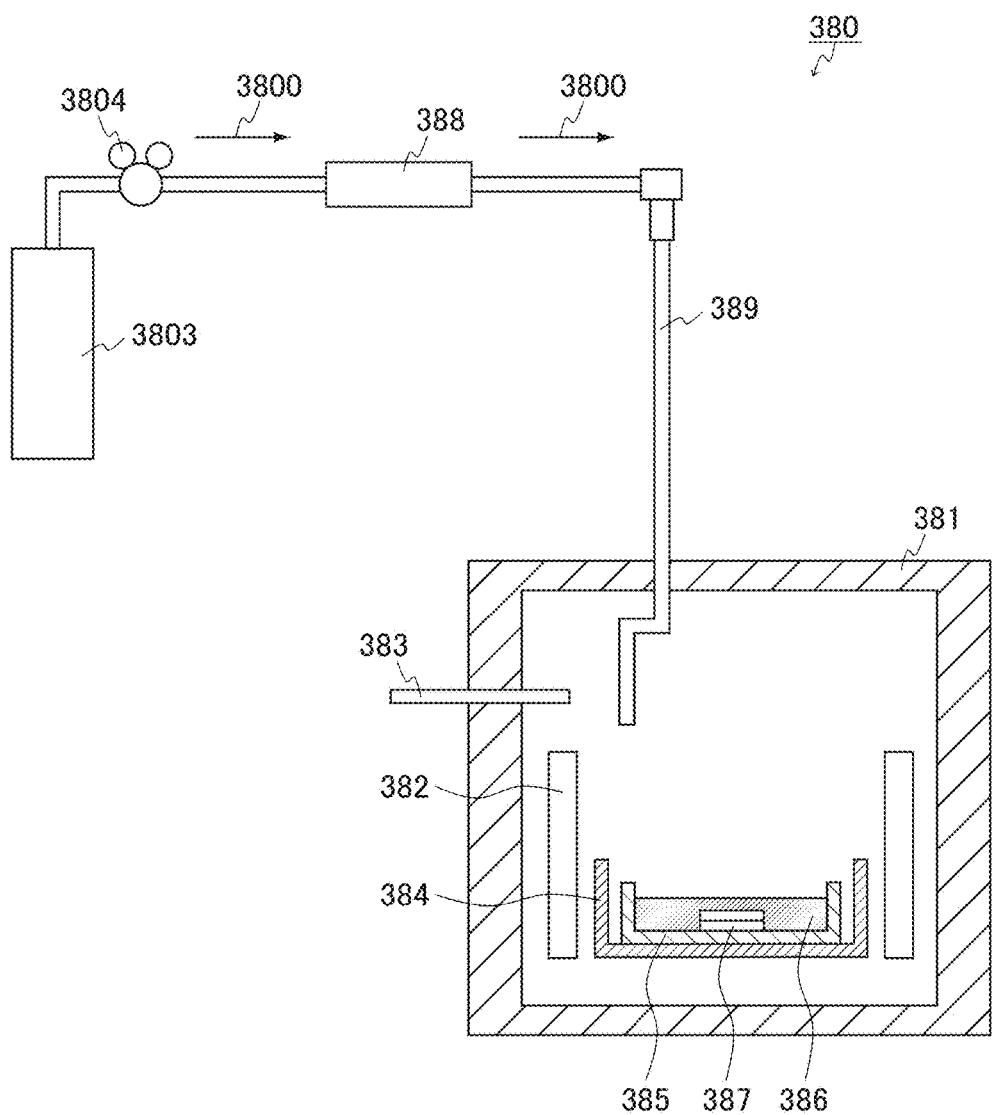
FIG. 25 is a schematic view showing a configuration of another example of an apparatus for use in the production method according to the present invention.

FIG. 25 shows an example of a large LPE apparatus (electric furnace). As shown in FIG. 25, this LPE apparatus 380 includes a growth furnace 381 made of stainless and a raw material gas tank 3803. The growth furnace 381 and the raw material gas tank 3803 are linked with each other through a pipe 389. The pipe 389 is equipped with a pressure adjuster 3804 and a flow rate adjuster 388 between the growth furnace 381 and the raw material gas tank 3803. A heater 382 for heating and a thermocouple 383 are arranged in the growth furnace 381 and configured so as to withstand an atmospheric pressure of 50 atm ($50 \times 1.013 \times 10^5$ Pa). Furthermore, there is a crucible-fixing stage 384 in the growth furnace 381. A crucible 385 made of boron nitride (BN) is fixed in the crucible-fixing stage 384, and a melt 386 and a seed crystal 387 are arranged in the crucible 385. In this state, as a raw material gas, a nitrogen gas or a mixed gas of an ammonia gas ($NH_3$ gas) and a nitrogen gas is supplied from the raw material gas tank 3803 through the pipe 389 in the direction indicated by the arrow (direction in which the atmospheric gas is supplied) 3800 in FIG. 25 to cause a reaction (crystal growth). The raw material gas (atmospheric gas) is transferred to the growth furnace 381 after impurities in a gas purification part (not shown) has removed. Furthermore, the pressure of the raw material gas (atmosphere pressure) is adjusted by the pressure adjuster 3804 and the flow rate adjuster 388.

Figure 26:
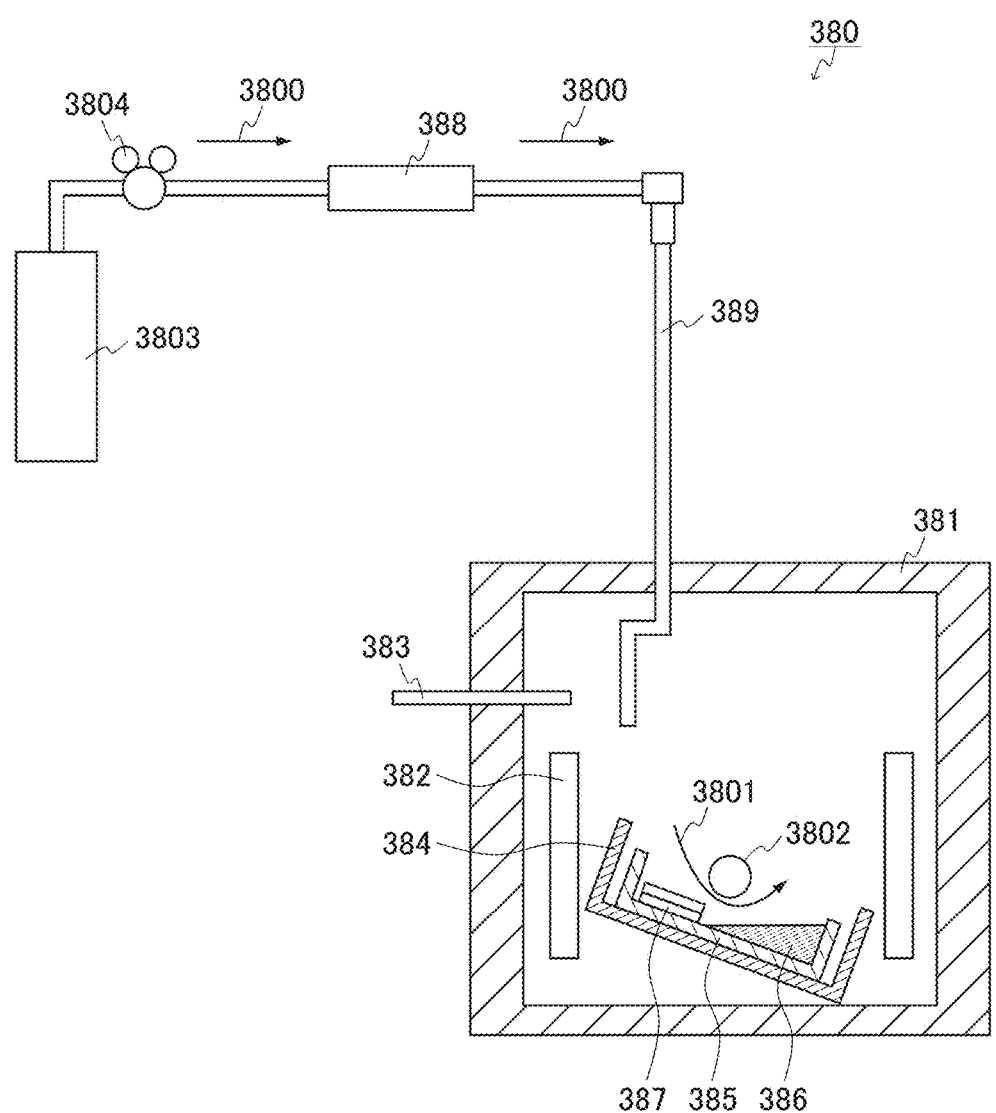
FIG. 26 is a schematic view showing a configuration of still another example of an apparatus for use in the production method according to the present invention.

FIG. 26 shows an example of a swing LPE apparatus. As shown in FIG. 26, this swing LPE apparatus 380 has a mechanism of rotating the crucible-fixing stage 384 around the rotation axis 3802 in the direction indicated by the arrow (rotation direction) 3801 in the growth furnace 381. Except for this, the apparatus shown in FIG. 26 is the same as the apparatus shown in FIG. 25. In the apparatus shown in FIG. 26, a melt 386 in the crucible 385 moves horizontally in response to the rotation of the crucible-fixing stage 384, and thus, the growth direction on the seed crystal is controlled to be constant. In the present example, it is desirable that the seed crystal (GaN seed crystal substrate) 387 is fixed such that the direction in which the melt 386 swings is parallel with a striped mask film on the GaN seed crystal substrate 387. It is to be noted that the LPE apparatus shown in FIG. 26 may be used in the same manner as the apparatus shown in FIG. 25 without using a mechanism of rotating the crucible-fixing stage 384 (i.e., without swinging the melt 386).

<1-1-8. Third Liquid Phase Epitaxy (Method for Producing Larger-Size Group III Nitride Crystal and the Like)>

Plural units each composed of the Group III nitride crystal layer and the mask may be used in the first liquid phase epitaxy of the first Group III nitride crystal production process of the present invention, or plural units each composed of the substrate and the Group III nitride crystal may be used in the second liquid phase epitaxy of the present invention. More specifically, in the seed crystal selection step, the contact step, and the crystal growth step, the units are adjacently arranged in parallel, and in the crystal growth step, the Group III nitride crystals grown from the units that are adjacent to each other are bound together by the growth of the Group III nitride crystals. Hereinafter, this production method is referred to as the third liquid phase epitaxy of the present invention.

Figure 14B:
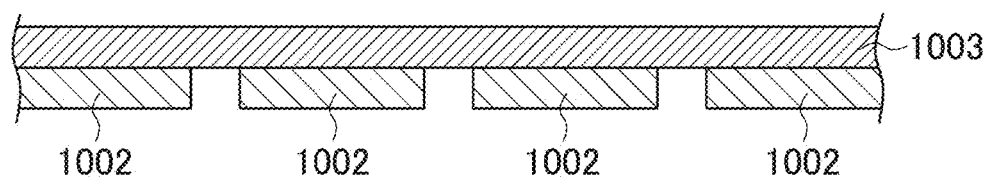
FIGS. 14B to 14D are cross sectional views, by way of example, showing the state where the distortion is eliminated using plural units.

As described with reference to FIG. 14A, in the case where there is a difference in thermal expansion coefficient between the substrate and the crystal or the like, there is a possibility of causing warping, a distortion, cracking and the like in the crystal by warping of the substrate while producing or using the crystal. However, for example, it is considered that, as shown in FIG. 14B, when the sapphire substrate 1002 is separated into pieces, warping, a distortion, cracking, and the like of the GaN crystal 1003 caused by warping of the sapphire substrate 1002 can be prevented or reduced. According to the third liquid phase epitaxy of the present invention, for example, an effect of preventing or reducing warping, a distortion, cracking, and the like of the produced Group III nitride crystal can be obtained. It is possible to divide (crack) the Group III nitride crystal by intentionally causing the substrate or the mask to be warped utilizing the difference in thermal expansion coefficient between the substrate (or the mask) and the Group III nitride crystal and the like consciously without using the third liquid phase epitaxy of the present invention (i.e., without using plural units).

Figure 13:
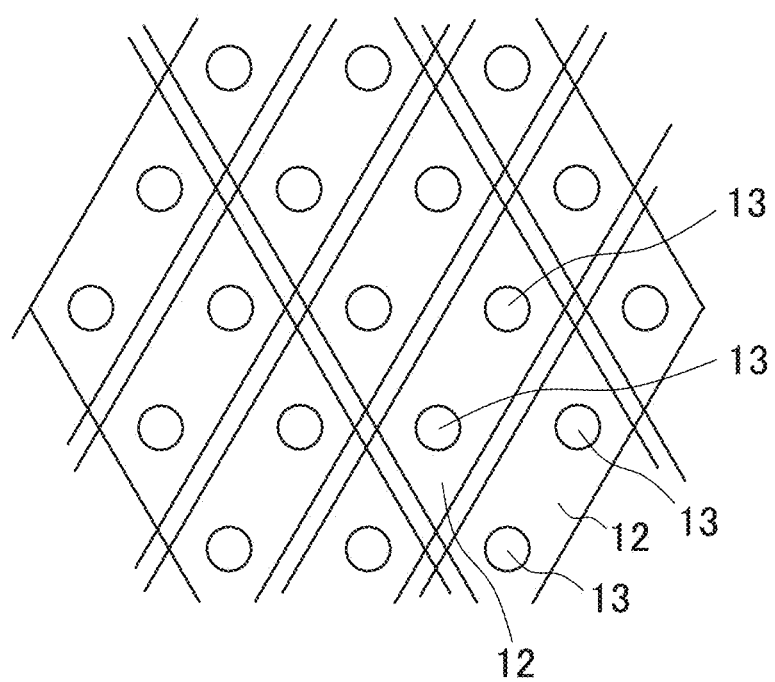
FIG. 13 is a drawing schematically showing, by way of example, units for use in the third liquid phase epitaxy which is an example of the first Group III nitride crystal production process according to the present invention.
Figure 14C:
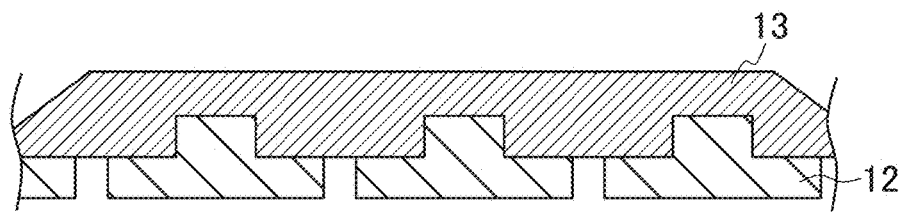
Figure 14D:
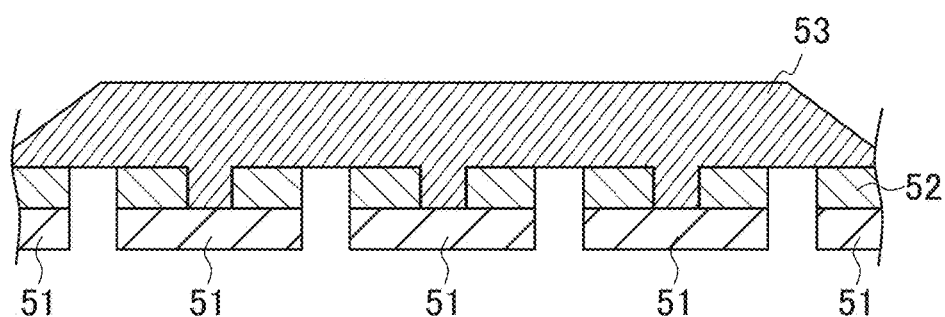

The plan view of FIG. 13 schematically shows an example of a unit for use in the third liquid phase epitaxy of the present invention. FIG. 13 shows a state where plural units each composed of a substrate 12 and a Group III nitride crystal (seed crystal) 13 are adjacently arranged in parallel in the first liquid phase epitaxy of the present invention. Instead of the first liquid phase epitaxy of the present invention, the second liquid phase epitaxy of the present invention may be used. In such a case, for example, the arrangement may be an arrangement in which a Group III nitride crystal layer 51 is used as a substitute for the substrate 12 of FIG. 13, a mask having through holes is arranged thereon as shown in FIG. 14D, and through holes (seed crystals) 52a are present at the positions of the seed crystals 13 of FIG. 13. Although two seed crystals are arranged on a substrate (unit) in FIG. 13, the number of seed crystals is not limited to two and may be one or any number of three or more. Furthermore, the size of each substrate also is not particularly limited and can be set as appropriate considering the production efficiency of the Group III nitride crystal, an effect of preventing or reducing warping, a distortion, cracking, and the like of the produced crystal, and the like. The cross sectional views of FIGS. 14C and 14D schematically show examples of producing a Group III nitride crystal by the third liquid phase epitaxy of the present invention. FIG. 14C shows an example in which the first liquid phase epitaxy of the present invention is used. FIG. 14C is the same as (g) of FIG. 3 except that plural units each composed of a substrate 12 and a Group III nitride crystal (seed crystal) 13 are adjacently arranged in parallel, and the Group III nitride crystals 13 grown from the units that are adjacent to each other are bound together. FIG. 14D shows an example in which the second liquid phase epitaxy of the present invention is used. FIG. 14D is the same as (f) of FIG. 7 except that plural units each composed of a Group III nitride crystal layer 51 and a mask 52 are adjacently arranged in parallel, and Group III nitride crystals 53 grown from the units that are adjacent to each other are bound together. Thereby, warping, a distortion, cracking, and the like of the produced crystal can be prevented or reduced. It is to be noted that appropriate changes can be made in FIG. 14D. For example, the size of the divided unit of each of the Group III nitride crystal layer 51 and the mask 52 may be changed appropriately or the Group III nitride crystal layer 51 and the mask 52 may coincide with each other in the state where their dividing positions are shifted. Furthermore, although the mask 52 is divided by each unit in FIG. 14D, the mask 52 may be linked to one another to be one piece. Moreover, in the units that are adjacent to each other, preferably, seed crystals that are adjacent to each other satisfy the conditions (M) and, more preferably, the crystals that are adjacent to each other satisfy the conditions (A) or (C) in addition to the conditions (M).

Figure 15:
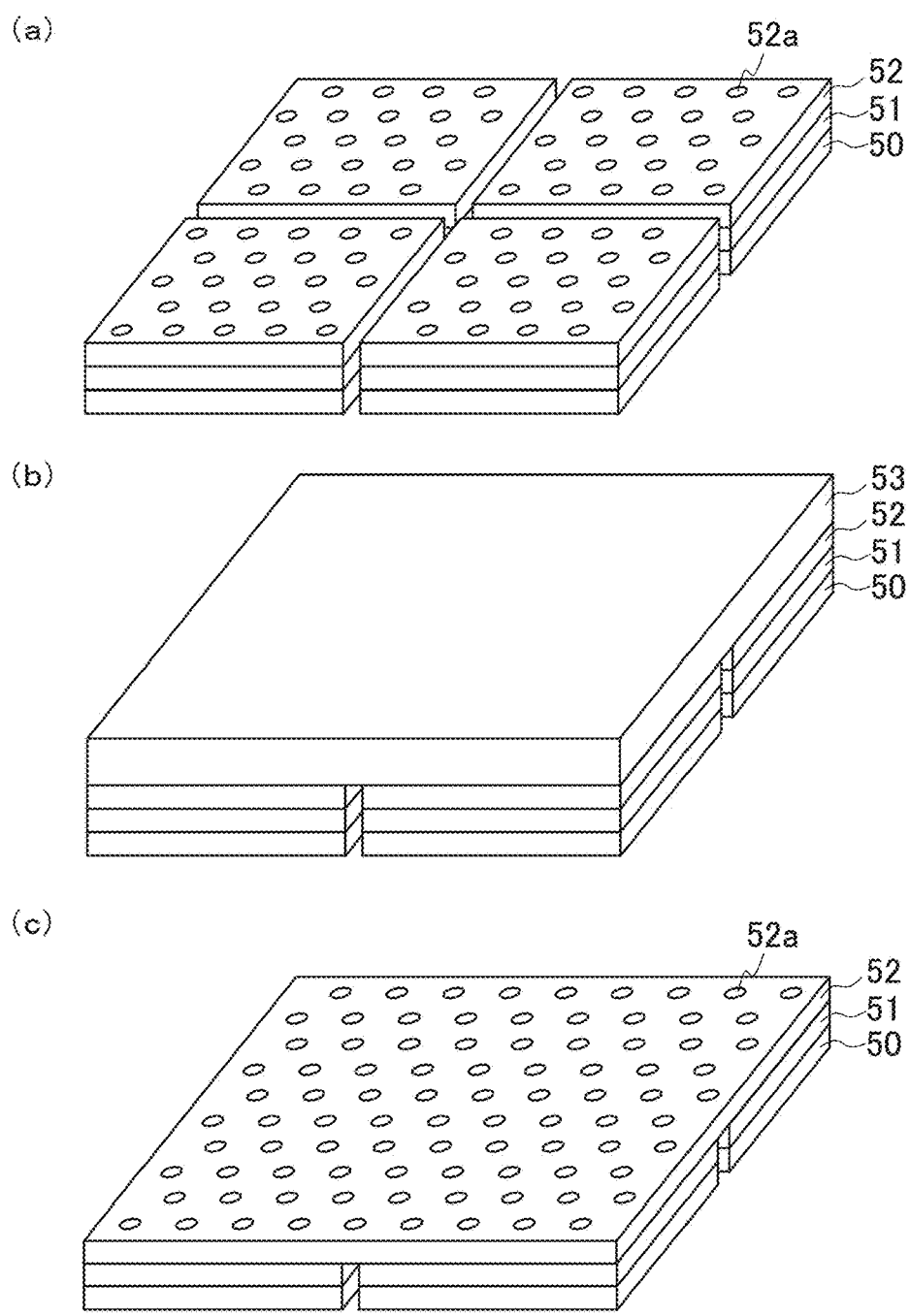
FIG. 15 shows perspective views showing a case where plural units are adjacently arranged in parallel in the first liquid phase epitaxy of the present invention as examples.

As described above, according to the first Group III nitride crystal production process of the present invention, a large Group III nitride seed crystal of high quality with few defects can be produced as a seed crystal in the second Group III nitride crystal production process. In the first Group III nitride crystal production process, according to the third liquid phase epitaxy, for example, a larger Group III nitride crystal of high quality with few defects can be produced. An example of this is schematically shown in the perspective views of FIG. 15. FIG. 15 shows an example in which the second liquid phase epitaxy of the present invention is used in the third liquid phase epitaxy of the present invention. First, as shown in (a) of FIG. 15, plural units each formed of a Group III nitride crystal layer 51 and a mask 52 formed thereon are adjacently arranged in parallel. Plural holes 52a are formed in each mask 52. The Group III nitride crystal layer 51, the mask 52, and the through holes 52a are as described in the sections "1-1-2. Arrangement relationship, shape, size, and the like of seed crystal" and "1-1-5. Second liquid phase epitaxy", for example. In this case, not only seed crystals (through holes 52a) in each unit, but also seed crystals (through holes 52a) that are adjacent to each other between the units that are adjacent to each other satisfy the conditions (M), i.e., the conditions where m-planes of crystals grown from the seed crystals that are adjacent to each other do not almost coincide with each other. Preferably, the seed crystals that are adjacent to each other satisfy the conditions (A) or (C) in addition to the conditions (M). That is, (a) of FIG. 15 shows a part of the seed crystal selection step.

As show in (a) of FIG. 15, in this example, a Group III nitride crystal layer 51 is formed on another substrate 50, which forms a unit together with a Group III nitride crystal layer 51 and a mask 52. The material for the substrate 50 is not particularly limited and is, for example, the same as the substrate in the second liquid phase epitaxy of the present invention and is particularly preferably sapphire or the like from the viewpoint of the costs and the convenience.

In the state of (a) of FIG. 15, the contact step and the crystal growth step are performed to grow a Group III nitride crystal 53. Thereby, the grown crystals in each unit and between the units shown in (a) of FIG. 15 are bound together, and one large Group III nitride crystal 53 can be produced as shown in (b) of FIG. 15.

In accordance with the recent advances in technology, a large semiconductor crystal can be produced, and this offers more choices of designing a semiconductor apparatus. For example, in a silicon semiconductor substrate or the like, large crystals having a diameter of 6 inch (about 15 cm), 8 inch (about 20 cm), and the like are put to practical use.

However, with reference to a Group III nitride crystal such as GaN, it was impossible to produce such a large crystal. As described above, according to a conventional method for producing a Group III nitride crystal, there is a possibility of causing warping, a distortion, cracking, and the like while producing or using the crystal due to the difference in thermal expansion coefficient between a substrate (sapphire substrate 1002 in FIG. 14A) and a crystal (GaN crystal 1003 in FIG. 14A) and the like. The problem becomes more significant when a large Group III nitride crystal is produced by using a large substrate. For example, it is considered that the crystal is prone to be cracked, and in addition, a crystal defect inherited from the crystal grown from the seed crystal becomes larger due to warping, a distortion, and the like of the crystal. A Group III nitride crystal such as GaN has been produced using a 2-inch substrate (diameter: about 5 cm), and a Group III nitride crystal that is larger than the substrate has not been produced on a large scale.

However, in the third liquid phase epitaxy of the present invention, for example, as shown in (a) to (c) of FIG. 15, a large crystal can be produced while reducing the problem of warping, a distortion, cracking, and the like of the crystal caused by warping of the substrate by arranging the units in parallel. Furthermore, it is considered that the third liquid phase epitaxy of the present invention can further reduce the problem by combining with the first liquid phase epitaxy of the present invention.

(a) to (c) of FIG. 15 show an example in which the second liquid phase epitaxy of the present invention is used. The third liquid phase epitaxy of the present invention can be performed in the same manner as described above except that the units of the first liquid phase epitaxy of the present invention are used as substitute for the units of the second liquid phase epitaxy of the present invention. Although the number of the units arranged lengthwise and crosswise is 2×2=4 in (a) to (c) of FIG. 15, the number of the units is not limited thereto and can be any number. The number may be, for example, 1×2=2, 1×3=3, or 3×3=9.

In the third liquid phase epitaxy of the present invention, the units that are adjacent to each other may be partially connected with each other. Specifically, in the third liquid phase epitaxy of the present invention, the masks are preferably connected to each other between the units that are adjacent to each other because it allows the seed crystals that are adjacent to each other to be arranged to satisfy the conditions (M) (more preferably, to satisfy the conditions (A) or (C) in addition to the conditions (M)). For example, in (a) of FIG. 15, as a mask 52, a mask is used for each unit. However, the masks may be connected to form a large mask as a whole as shown in (c) of FIG. 15, for example.

The size of the Group III nitride crystal produced by the first Group III nitride crystal production process is not particularly limited, and the major axis is preferably 15 cm (about 6 inch) or more, more preferably 20 cm (about 8 inch) or more, and particularly preferably 25 cm (about 10 inch) or more. The height of the Group III nitride crystal also is not particularly limited and is, for example, 1 cm or more, preferably 5 cm or more, and more preferably 10 cm or more. Although such a large Group III nitride crystal may be produced without using the third liquid phase epitaxy of the present invention, it is preferably produced by the third liquid phase epitaxy of the present invention. Specifically, a Group III nitride crystal with a large diameter (in a lateral direction) is preferably produced by the third liquid phase epitaxy of the present invention. The first Group III nitride crystal production process, however, is not limited to the production of such a large Group III nitride crystal and can be used to produce a Group III nitride crystal in a conventional size having higher quality, for example.

<1-2. Second Group III Nitride Crystal Production Process (Vapor Phase Epitaxy)>

Next, the second Group III nitride crystal production process (vapor phase epitaxy) is described.

In the second Group III nitride crystal production process, as described above, a second Group III nitride crystal is produced on the first Group III nitride crystal by vapor phase epitaxy. Except for this, the second Group III nitride crystal production process is not particularly limited and can be the same as a common vapor phase epitaxy, for example. The examples thereof are described below.

<1-2-1. Second Group III Nitride Crystal Production Apparatus by Vapor Phase Epitaxy>

Figure 28:
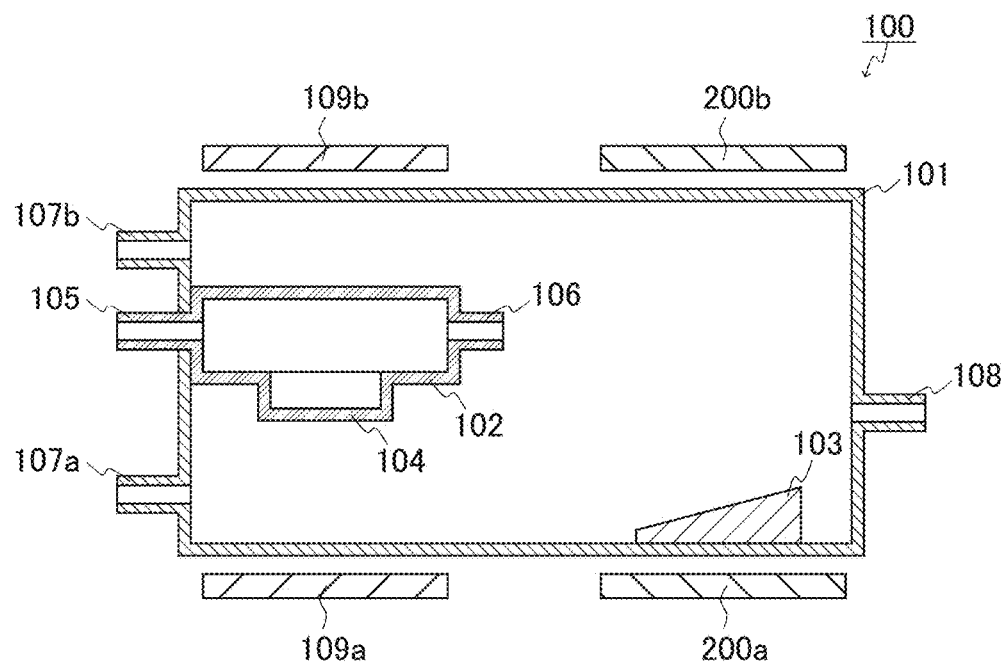
FIG. 28 is a cross sectional view schematically showing an example of an apparatus for use in the second Group III nitride crystal production process in the Group III nitride crystal production method according to the present invention.

FIG. 28 shows an example of the configuration of the production apparatus (the second Group III nitride crystal production apparatus using vapor phase epitaxy) for use in the second Group III nitride crystal production process. In FIG. 28, in order to make it clearly understandable, the size, the ratio, and the like of components are different from actual ones. As shown in FIG. 28, a production apparatus 100 of the present example includes a first container 101, a second container 102, and a substrate support 103, and the second container 102 and the substrate support 103 are disposed in the first container 101. The second container 102 is fixed at the left side surface of the first container 101 in FIG. 28. The substrate support 103 is fixed at the lower surface of the first container 101. The second container 102 includes a Group III element-containing material placement part 104 at its lower surface. The second container 102 is provided with a hydrogen halide gas introduction pipe 105 at its left side surface and is provided with a Group III element halide gas delivery pipe 106 at its right side surface in FIG. 28. Hydrogen halide gas can be continuously introduced (supplied) into the second container 102 through the hydrogen halide gas introduction pipe 105. The first container 101 is provided with nitrogen-containing gas introduction pipes 107*a* and 107*b* at its left side surface and is provided with an exhaust pipe 108 at its right side surface in FIG. 28. Nitrogen-containing gas can be continuously introduced (supplied) into the first container 101 through the nitrogen-containing gas introduction pipes 107*a* and 107*b*. Furthermore, at the outside of the first container 101, first heating units 109*a* and 109*b* and second heating units 200*a* and 200*b* are disposed. However, the production apparatus for use in the production method of the present invention is not limited to this example. For example, although the number of second containers 102 disposed in the first container 101 in this example is one, the number of second containers 102 disposed in the first container 101 may be more than one. Furthermore, although the number of the hydrogen halide gas introduction pipes 105 is one in this example, the number of the hydrogen halide gas introduction pipes 105 may be more than one.

There is no particular limitation on the shape of the first container. Examples of the shape of the first container include a cylinder, a quadratic prism, a triangular prism, and a shape created by combining these shapes. Examples of the material for forming the first container include quartz, alumina, aluminum titanate, mullite, tungsten, and molybdenum. A self-made first container or a commercially available first container may be used. The commercially available first container can be, for example, the "quartz reaction tube" (product name) manufactured by PHOENIX TECHNO.

There is no particular limitation on the shape of the second container. Examples of the shape of the second container include those described for the first container. Examples of the material for forming the second container include quartz, tungsten, stainless, molybdenum, aluminum titanate, mullite, and alumina. A self-made second container or a commercially available second container may be used. The commercially available second container can be, for example, the "SUS316BA tube" (product name) manufactured by Mecc Technica Co.

Conventionally known heating units can be used as the first heating unit and the second heating unit. Examples of the heating unit include ceramic heaters, high frequency heaters, resistance heaters, and light collecting heaters. One type of the heating units may be used alone or two or more of them may be used in combination. Preferably, the first heating unit and the second heating unit are each independently controlled.

Figure 30:
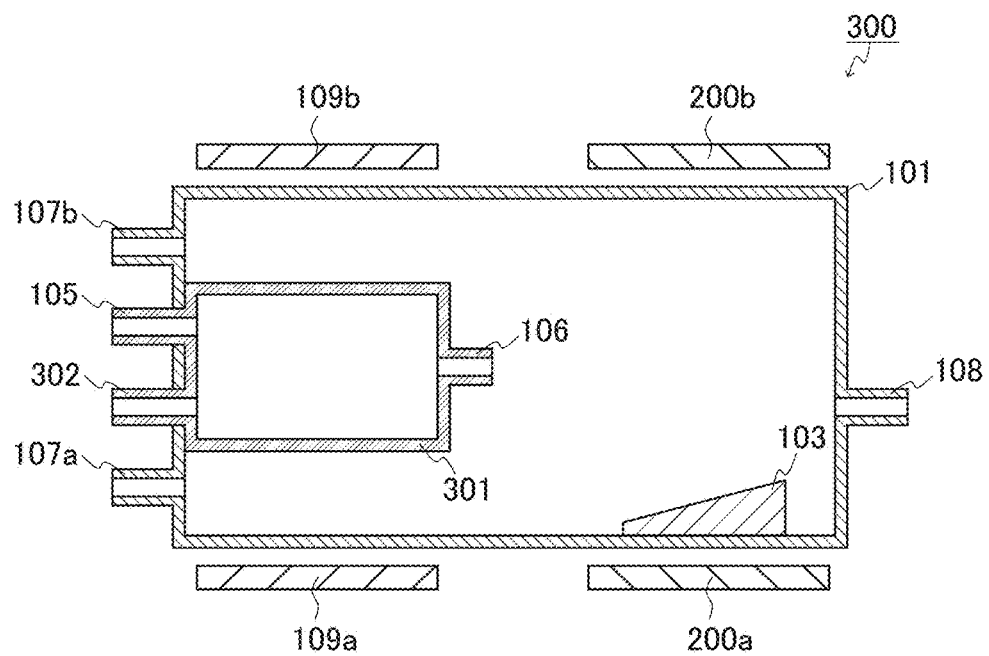
FIG. 30 is a cross sectional view schematically showing another example of an apparatus for use in the second Group III nitride crystal production process.

FIG. 30 shows another example of the configuration of the production apparatus for use in the second Group III nitride crystal production process. As shown in FIG. 30, this production apparatus 300 has the same configuration as the production apparatus 100 shown in FIG. 28 except that it includes a second container 301 instead of a second container 102. As shown in FIG. 28, the second container 301 is provided with hydrogen halide gas introduction pipe 105 at the upper part of its left side surface, is provided with a Group III element metal introduction pipe 302 at the lower part of its left side surface, and is provided with a Group III element halide gas delivery pipe 106 at its right side surface. Oxidizing gas can be continuously introduced (supplied) into the second container 301 through the hydrogen halide gas introduction pipe 105. A Group III element metal can be continuously introduced (supplied) into the second container 301 through the Group III element metal introduction pipe 302. The second container 301 does not include a Group III element-containing material placement part 104, instead, it has a deep depth (vertical width) and allows a Group III element metal to be stored in its lower part. The first container 101 and the second container 301 of the production apparatus shown in FIG. 30 each can be referred to as a "reaction vessel". The Group III element metal introduction pipe 302 corresponds to a "Group III element-containing material supply unit". The hydrogen halide gas introduction pipe 105 can be referred to as a "hydrogen halide gas supply unit". The nitrogen-containing gas introduction pipes 107a and 107b each can be referred to as a "nitrogen-containing gas supply unit". In the present invention, the production apparatus (the second Group III nitride crystal production apparatus using the vapor phase epitaxy) for use in the second Group III nitride crystal production process may be, for example as the apparatus shown in FIG. 30, an apparatus for producing a Group III nitride crystal in which the Group III element-containing material can be continuously supplied into the reaction vessel by the Group III element-containing material supply unit, the hydrogen halide gas can be continuously supplied into the reaction vessel by the hydrogen halide gas supply unit, the nitrogen-containing gas can be continuously supplied into the reaction vessel by the nitrogen-containing gas supply unit, and the Group III element-containing material, the hydrogen halide gas, and the nitrogen-containing gas are caused to react in the reaction vessel to produce a Group III nitride crystal.

It can be said that the production apparatus (for example, apparatus shown in FIG. 28 or 30) used in the second Group III nitride crystal production process, corresponds to "the second Group III nitride crystal production unit" in the Group III nitride crystal production apparatus of the present invention. The configuration of the production apparatus for use in the second Group III nitride crystal production process is not limited to those shown in FIGS. 28 and 30. For example, the heating units 109a, 109b, 200a, and 200b and the substrate support 103 can be omitted. However, from the viewpoint of reactivity and operability, the production apparatus is preferably provided with these components. Furthermore, the production apparatus for use in the production method of the present invention may be provided with other components in addition to the above-described components. Examples of other components include a unit that controls the temperatures of the first heating unit and the second heating unit and a unit that adjusts the pressure and the introduction amount of the gas used in each step.

The production apparatus for use in the second Group III nitride crystal production process can be produced by assembling the above-described components and other components as needed according to a conventionally known method, for example.

<1-2-2. Production Process, Reaction Conditions, and the Like>

Next, steps, reaction conditions, materials to be used, and the like in the second Group III nitride crystal production process are described. The present invention, however, is not limited by the following description. A mode for carrying out the second Group III nitride crystal production process is described below with reference to the production apparatus shown in FIG. 28 or the production apparatus shown in FIG. 30 instead of the production apparatus shown in FIG. 28.

Figure 29:
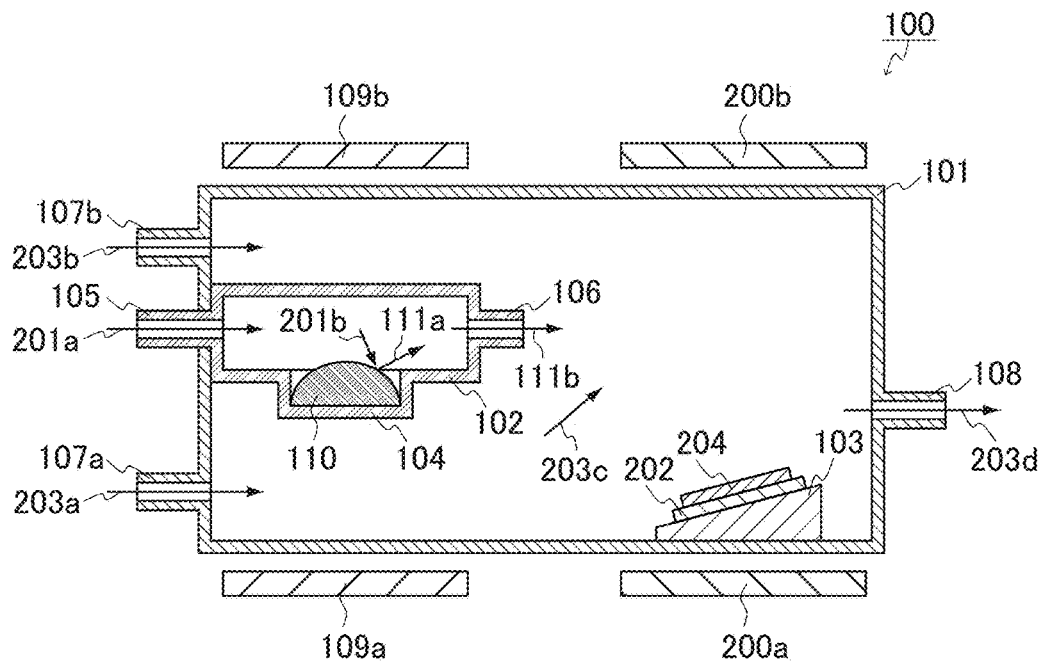
FIG. 29 is a cross sectional view schematically showing an outline of the second Group III nitride crystal production process using the apparatus shown in FIG. 28.

First, as shown in FIG. 29 (or FIG. 31), a first Group III nitride crystal 202 produced by the first Group III nitride crystal production process is previously disposed on a first Group III nitride crystal support 103. The first Group III nitride crystal 202 can be selected appropriately according to the form or the like of a Group III nitride crystal to be generated thereon. The first Group III nitride crystal 202 may be a Group III nitride crystal formed on a substrate, for example. Specifically, for example, as shown in (b) of FIG. 1, a first Group III nitride crystals 1003 may be formed on a substrate 1002. As described above, preferably, the material for the substrate contains at least one selected from the group consisting of $Al_xGa_{1-x}N$ (0<x≤1), an oxide of the $Al_xGa_{1-x}N$ (0<x≤1), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten, for example. Also, examples of the material for the substrate include sapphire, Group III nitride, gallium arsenide (GaAs), silicon (Si), silicon carbide (SiC), magnesium oxide (MgO), zinc oxide (ZnO), gallium phosphide (GaP), zirconium diboride (($ZrB_2$)), lithium dioxogallate ($LiGaO_2$), BP, $MoS_2$, $LaAlO_3$, NbN, $MnFe_2O_4$, $ZnFe_2O_4$, ZrN, TiN, $MgAl_2O_4$, $NdGaO_3$, $LiAlO_2$, $ScAlMgO_4$, and $Ca_8La_2(PO_4)_6O_2$. Among them, sapphire is particularly preferable from the viewpoint of the cost and the like.

The material for the first Group III nitride crystal 202 (seed crystal) may be, for example, identical to or different from the material for the second Group III nitride crystal to be generated thereon. Preferably, the material for the first Group III nitride crystal 202 is identical to the material for the second Group III nitride crystal. When epitaxial growth is performed by growing a crystal on a seed crystal of the same material, the process is called "homoepitaxy growth" and it is also called "homoepi" for short.

Figure 31:
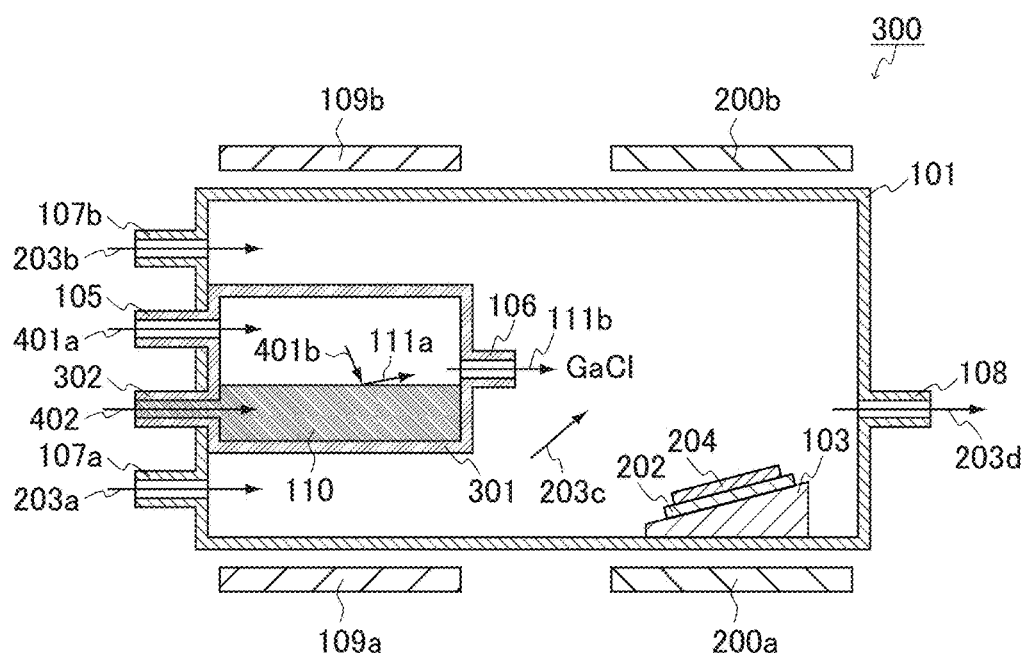
FIG. 31 is a cross sectional view schematically showing an outline of the Group III nitride crystal production method according to the present invention using the apparatus shown in FIG. 30.

Next, as shown in FIG. 29, a Group III element-containing material (for example, Group III element metal) 110 is disposed on a Group III element-containing material placement part 104. When the production apparatus shown in FIG. 30 is used, as shown in FIG. 31, a Group III element metal 402 is introduced into a second container 301 from a Group III element metal introduction pipe 302 and is stored in the lower part of the second container 301 as a Group III element metal 110. The Group III element metal 402 can be continuously introduced into the second container 301 from the Group III element metal introduction pipe 302. For example, the Group III element metal 402 can be introduced from the Group III element metal introduction pipe 302 to refill with a quantity equivalent to the amount of the Group III element metal 402 consumed by reaction. Examples of the Group III element metal include aluminum (Al), gallium (Ga), indium (In), and thallium (Tl), and one of them may be used alone or two or more of them maybe used in combination. For example, as the Group III element metal, at least one selected from the group consisting of aluminum (Al), gallium (Ga), and indium (In) may be used. In this case, the composition of the Group III nitride crystal to be produced can be represented by $Al_sGa_tIn_{\{1-(s+t)\}}N$ (provided that, $0 \leq s \leq 1$, $0 \leq t \leq 1$, $s+t \leq 1$). Furthermore, the Group III element-containing material 110 may be caused to react in the presence of a dopant material or the like, for example. The dopant is not particularly limited, and examples thereof include Si, S, Te, Mg, Fe, Ge, Sn, Se, Zn, Ru, O, and C When the Group III element-containing material 110 is caused to react in the presence of such dopants, for example, the dopants can be used in the form of the single elements, oxides, halides, and the like.

Furthermore, a ternary or higher nitride crystal produced using two or more kinds of Group III element-containing materials can be, for example, a crystal represented by $Al_sGa_tIn_{\{1-(s+T)\}}N$ ($0<s<1$, $0<t<1$, $s+t<1$) and a crystal represented by $Ga_xIn_{1-x}N$ ($0<x<1$). For generating a ternary or higher nitride crystal, it is preferable to generate at least two kinds of Group III element halide gases. In this case, it is preferable to use a production apparatus provided with at least two second containers. The mixing ratio of at least two kinds of Group III element halide gas (raw material gas) can be any mixing ratio. Furthermore, as described above, the Group III element halide (raw material gas) is, for example, represented by $MX_n$ (wherein M is Al, Ga, or In; X is halogen; and n is a natural number (preferably, n=1 or 3)), and specific examples of the Group III element halide include $AlCl_3$, $GaCl$, $GaCl_3$, and $InCl_3$.

Because of its relatively low melting point, a Group III element metal easily becomes liquid by heating. When the Group III element metal is liquid, it can be easily supplied into a reaction vessel (second container 301 in FIG. 31) continuously. Among the above-described Group III element metals, gallium (Ga) is particularly preferable. This is because gallium nitride (GaN) produced from gallium is very useful as a material for a semiconductor apparatus. In addition, because gallium can become liquid at room temperature because of its low melting point (about 30° C.), it can be particularly easily supplied to a reaction vessel continuously. When only gallium is used as the Group III element metal, a Group III nitride crystal to be produced is gallium nitride (GaN) as described above.

Next, the Group III element-containing material 110 is heated using first heating units 109a and 109b and the first Group III nitride crystal 202 is heated using second heating units 200a and 200b. In this state, hydrogen halide gas 201a (or 401a) is introduced from a hydrogen halide gas introduction pipe 105, and nitrogen-containing gas 203a and 203b is introduced from the nitrogen-containing gas introduction pipes 107a and 107b. Although there is no particular limitation on the hydrogen halide gas 201a (or 401a), it is particularly preferable to use hydrogen chloride (HCl) gas as in a common HVPE method. The hydrogen halide gas 201a (or 401a) introduced (supplied) into a second container 102 (or 301) comes into contact with the surface of the Group III element-containing material 110 (hydrogen halide gas 201b). The Group III element-containing material 110 is thereby caused to react with the hydrogen halide gas 201b to generate Group III element halide gas 111a (Group III element halide gas generation step). The partial pressure of the hydrogen halide gas is not particularly limited, and is preferably in the range from 0.3 kPa to 8 kPa.

In the Group III element halide gas generation step in the production method of the present invention, from the viewpoint of promoting the generation of the Group III element halide gas, preferably, the Group III element-containing material is caused to react with the hydrogen halide gas in a heated state. In this case, the temperature of the Group III element-containing material is not particularly limited, and is preferably in the range from 450° C. to 900° C.

In the Group III element halide gas generation step, particularly preferably, the Group III element-containing material is gallium, the hydrogen halide gas is HCl gas, and the Group III element halide gas is GaCl. The reaction formula of this case can be represented, for example, by the following formula (I). However, the reaction formula is not limited thereto.

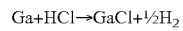

$$Ga+HCl \rightarrow GaCl+½H_2 \qquad (I)$$

In the production method of the present invention, from the viewpoint of controlling the partial pressure of the hydrogen halide gas, the Group III element halide gas generation step may be performed in an atmosphere of mixed gas of the hydrogen halide gas and other gas. This other gas is not limited to a particular gas, and may be gas that contains one of or both of inert gas and hydrogen gas (H2), for example. There are no particular limitations on the proportions of the hydrogen halide gas and other gas relative to the total amount of the mixed gas. Preferably, the proportion of the hydrogen halide gas relative to the total amount of the mixed gas is 0.001 vol. % or more and less than 100 vol. %, and the proportion of the other gas relative to the total amount of the mixed gas exceeds 0 vol. % and 99.999 vol. % or less. More preferably, the proportion of the hydrogen halide gas relative to the total amount of the mixed gas is 0.01 vol. % or more and 80 vol. % or less, and the proportion of other gas relative to the total amount of the mixed gas is 20 vol. % or more and 99.99 vol. % or less. Still more preferably, the proportion of the hydrogen halide gas relative to the total amount of the mixed gas is 0.1 vol. % or more and 60 vol. % or less, and the proportion of other gas relative to the total amount of the mixed gas is 40 vol. % or more and 99.9 vol. % or less. Furthermore, there is no particular limitation on the inert gas in other gas and the proportion may be the proportion calculated by subtracting the proportion of the hydrogen gas from 100%, for example. The proportion of the hydrogen gas in other gas is not particularly limited, and is preferably in the range from 1 vol. % to 100 vol. %. In the production method of the present invention, examples of the inert gas include nitrogen gas, helium gas, argon gas, and krypton gas. Among them, nitrogen gas is particularly preferable. Examples of the method for creating the mixed gas atmosphere include a method of introducing other gas from another gas introduction pipe (not shown) provided in the second container separately from the hydrogen halide gas introduction pipe; and a method of preliminarily generating gas in which the hydrogen gas and the inert gas are mixed at predetermined proportions and introducing the thus obtained gas from the hydrogen halide gas introduction pipe. In the case of introducing other gas from the separately provided gas introduction pipe, the flow rate of other gas can be set appropriately according to the flow rate of the hydrogen halide gas and the like.

The generated Group III element halide gas 111a is delivered to the outside of the second container 102 through a Group III element halide gas delivery pipe 106 (Group III element halide gas 111b). Here, the "other gas" for controlling the partial pressure serves as a first carrier gas for delivering the generated Group III element halide gas 111b to the outside of the second container 102 through the Group III element halide gas delivery pipe 106.

The generation of the Group III element halide gas 111a (111b) may be performed in a condition under pressure, in a condition under reduced pressure, or in conditions other than these conditions, for example. The pressure in the condition under pressure, in the condition under reduced pressure, or in the conditions other than these conditions is not particularly limited, and is the same as that in the Group III nitride crystal generation step that is described below, for example. The method of applying pressure can be, for example, a method of applying pressure by the hydrogen halide gas, the first carrier gas, or the like.

The Group III element halide gas (e.g. GaCl gas) 111b delivered to the outside of the second container 102 through the Group III element halide gas delivery pipe 106 is caused to react with nitrogen-containing gas 203c introduced into the first container 101, and a Group III nitride (e.g., GaN) crystal 204 is generated on the first Group III nitride crystal 202 (Group III nitride crystal generation step). The reaction formula of this case can be represented, for example, by the following formula (II) in the case where the Group III element halide gas is GaCl gas and the nitrogen-containing gas is ammonia gas. However, the reaction formula is not limited thereto. It is to be noted that excess remaining gas after reaction can be emitted from the exhaust pipe 108 as exhaust gas 203d.

$$GaCl + 2NH_3 \rightarrow GaN + H_2 + NH_4Cl \qquad (II)$$

In the production method according to the present invention, the nitrogen-containing gas is particularly preferably $NH_3$.

In the Group III nitride crystal generation step, the temperature of the first Group III nitride crystal is not particularly limited. From the viewpoint of ensuring the generation rate of crystal and improving crystallinity, the temperature is preferably in the range from 950° C. to 1100° C.

The Group III nitride crystal generation step may be performed in a condition under pressure, in a condition under reduced pressure, or in conditions other than these conditions. The pressure in the first container 101 in the Group III nitride crystal generation step is not particularly limited. Preferably, the pressure is adjusted to be a constant value in the range from 95 kPa to 105 kPa, for example, so that the generation step is not affected by the weather or the like.

In the Group III nitride crystal generation step, the supply amount of the Group III element halide gas (e.g., GaCl gas indicated by 111b in FIGS. 29 and 31) is, for example, in the range from $5 \times 10^{-5}$ to $5 \times 10^1$ mol/h, preferably in the range from $1 \times 10^{-4}$ to 5 mol/h, and more preferably in the range from $2 \times 10^{-4}$ to $5 \times 10^{-1}$ mol/h. The supply amount of the Group III element halide gas can be adjusted, for example, by adjusting the flow rate of the hydrogen halide gas in generation of the Group III element halide gas.

The flow rate of the nitrogen-containing gas can be set appropriately according to the conditions such as the temperature of the first Group III nitride crystal and the like. The partial pressure of the nitrogen-containing gas is not particularly limited. Preferably, the partial pressure is in the range from 5 kPa to 36 kPa.

For transferring the introduced nitrogen-containing gas to a crystal generation region (in the vicinity of the first Group III nitride crystal support 103 in the first container 101 in FIGS. 28 to 31), second carrier gas may be introduced. For example, the second carrier gas may be introduced from a carrier gas introduction pipe (not shown) provided separately from the nitrogen-containing gas introduction pipe or introduced from the nitrogen-containing gas introduction pipe after being mixed with the nitrogen-containing gas. As the second carrier gas, for example, the gas that contains one of or both of inert gas and hydrogen gas can be used as in the case of the "other gas" in the Group III element halide gas generation step.

In the case of introducing the second carrier gas from the carrier gas introduction pipe, the flow rate of the second carrier gas can be set appropriately according to the flow rate of the nitrogen-containing gas and the like. The partial pressure of the second carrier gas is not particularly limited and can be set appropriately.

The mixing ratio A:B (volume ratio) between the nitrogen-containing gas (A) and the second carrier gas (B) is not particularly limited, and is preferably in the range from 2 to 80:98 to 20, more preferably in the range from 5 to 60:95 to 40, and yet more preferably in the range from 10 to 40:90 to 60. The mixing ratio A:B (volume ratio) can be set, for example, by preliminarily mixing the nitrogen-containing gas and the second carrier gas at a predetermined mixing ratio or adjusting the flow rate of the nitrogen-containing gas and the flow rate of the second carrier gas.

Preferably, the Group III nitride crystal (e.g., GaN crystal) generation step is performed in a condition under pressure. The pressure conditions are as described above. The method of applying pressure can be, for example, a method of applying pressure by the nitrogen-containing gas, the second carrier gas, or the like.

The Group III nitride crystal generation step may be performed in a dopant-containing gas atmosphere. This allows a dopant-containing GaN crystal to be generated. Examples of the dopant include Si, S, Te, Mg, Fe, Ge, Sn, Se, Zn, Ru, O, and C. One type of the dopants may be used alone or two or more of them may be used in combination. Examples of the dopant-containing gas include monosilane ($SiH_4$), disilane ($Si_2H_6$), triethylsilane ($SiH(C_2H_5)_3$), tetraethylsilane ($Si(C_2H_5)_4$), $H_2S$, $H_2Se$, $H_2Te$, $GeH_4$, $Ge_2O$, $SiO$, $MgO$, $ZnO$, halide gas (e.g., $SiH_2Cl_2$, $GeCl_4$, $FeCl_2$, and the like), and $Cp_2Mg$, and one of them may be used alone or two or more of them may be used in combination. Furthermore, the partial pressure of the dopant-containing gas is not particularly limited, and is preferably in the range from 0.01 to 0.5 Pa.

For example, the dopant-containing gas may be introduced from a dopant-containing gas introduction pipe (not shown) provided separately from the nitrogen-containing gas introduction pipe or introduced from the nitrogen-containing gas introduction pipe after being mixed with the nitrogen-containing gas. In the case of introducing the second carrier gas, the dopant-containing gas may be introduced after being mixed with the second carrier gas.

The concentration of the dopant in the dopant-containing gas is not particularly limited, and is, for example, in the range from 0.001 to 100000 ppm, preferably in the range from 0.01 to 1000 ppm, and more preferably in the range from 0.1 to 10 ppm.

There is no particular limitation on the generation rate of the Group III nitride crystal (e.g., GaN crystal). The rate is, for example, 100 μm/h or more, preferably 500 μm/h or more, and more preferably 1000 μm/h or more.

The second Group III nitride crystal production process can be performed as described above. However, the second Group III nitride crystal production process is not limited thereto.

There is no particular limitation on the size of the second Group III nitride crystal produced by the second Group III nitride crystal production process. Preferably, the major axis is 15 cm (about 6 inch) or more, more preferably, the major axis is 20 cm (about 8 inch) or more, and particularly preferably, the major axis is 25 cm (about 10 inch) or more. There is no particular limitation on the height (thickness) of the second Group III nitride crystal. The height is, for example, 1 cm or more, preferably 5 cm or more, and more preferably 10 cm or more. The production method according to the present invention however is not limited to the production of such a large Group III nitride crystal. For example, the production method according to the present invention can be used to produce a Group III nitride crystal having the same size as a conventional one with higher quality. Furthermore, for example, as described above, the height (thickness) of the second Group III nitride crystal is not particularly limited, and may be less than 1600 μm, for example.

In the second Group III nitride crystal, the dislocation density is not particularly limited and is preferably $1.0 \times 10^7$ cm$^{-2}$ or less, more preferably $1.0 \times 10^{-4}$ m$^{-2}$ or less, yet more preferably $1.0 \times 10^{-3}$ cm$^{-2}$ or less, and still more preferably $1.0 \times 10^{-2}$ cm$^{-2}$ or less. Although the dislocation density is ideally 0, it is commonly impossible for the dislocation density to be 0. Thus, for example, the dislocation density is a value more than 0 and is particularly preferably a measurement limit or less of a measurement instrument. The dislocation density may be, for example, an average value of the entire crystal, and, more preferably, the maximum value in the crystal is the above-described value or less. In the Group III nitride crystal of the present invention, the half width of each of a symmetric reflection component (002) and an asymmetric reflection component (102) by XRC is, for example, 300 seconds or less, preferably 100 seconds or less, more preferably 30 seconds or less, and ideally 0.

The Group III nitride crystal production method of the present invention may further include a crystal re-growth step of further growing the produced Group III nitride crystal. Specifically, for example, in the crystal re-growth step, the produced Group III nitride crystal may be cut so that any plane (e.g., c-, m-, or a-plane or another nonpolar plane) is exposed, and the Group III nitride crystal may be further grown using the plane as a crystal growth plane. Thus, a Group III nitride crystal having a large area of any plane and a large thickness can be produced.

<2. Group III Nitride Crystal and Semiconductor Apparatus>

The Group III nitride crystal of the present invention is a Group III nitride crystal produced by the production method of the present invention or a Group III nitride crystal produced by further growing the Group III nitride crystal.

The Group III nitride crystal of the present invention is, for example, a large Group III nitride seed crystal of high quality with few defects. Although the quality is not particularly limited, the dislocation density is, for example, preferably in the numerical range described in the section "1. Production method of the present invention". The size of the Group III nitride crystal also is not particularly limited and is, for example, as mentioned above. The use of the Group III nitride crystal of the present invention also is not particularly limited and can be used in a semiconductor apparatus because of having properties of a semiconductor, for example.

According to the present invention, as mentioned above, a Group III nitride (e.g., GaN) crystal with a diameter of 6 inches or more, which has not been produced by a conventional technique, can be provided. Accordingly, for example, by using Group III nitride as a substitute for Si in a semiconductor apparatus such as a power device generally required to have a large diameter of Si (silicon), a high frequency device, or the like, the performance can be further improved. Therefore, the present invention has a great impact on the semiconductor industry. The Group III nitride crystal of the present invention is not limited thereto and is applicable to any other semiconductor apparatuses such as solar battery and the like and any other applications besides the semiconductor apparatuses.

There is no particular limitation on the semiconductor apparatus of the present invention, and the semiconductor apparatus can be any article as long as it is operated by using a semiconductor. Examples of the article operated by a semiconductor include semiconductor devices and electrical equipment using the semiconductor device. Examples of the semiconductor device include diodes, high frequency devices such as transistors, power devices, and light emitting devices such as light-emitting diodes (LEDs) and laser diodes (LDs). Examples of the electrical equipment using the semiconductor device include a cellular phone base station equipped with the high frequency device; control equipment for solar cell and power supply control equipment of a vehicle driven by electricity each equipped with the power device; and a display, lighting equipment, and an optical disk device each equipped with the light emitting device. For example, a laser diode (LD) that emits blue light is applied to a high density optical disk, a display, and the like, and a light-emitting diode (LED) that emits blue light is applied to a display, a lighting, and the like. An ultraviolet LD is expected to be applied in biotechnology and the like and an ultraviolet LED is expected as an ultraviolet source which is an alternate for a mercury lamp. Also, an inverter that uses the Group III-V compound of the present invention as a power semiconductor for inverter can be used for power generation in a solar cell, for example. As described above, the Group III nitride crystal of the present invention is not limited thereto, and can be applied to other semiconductor apparatuses or various technical fields.

EXAMPLES

The examples of the present invention are described below. The present invention, however, is not limited by the following examples.

In the present example, as described below, first, a GaN crystal is produced by the liquid phase epitaxy (first Group III nitride crystal production process), and then a GaN crystal is produced thereon by the vapor phase epitaxy (second Group III nitride crystal production process).

<Production of GaN Crystal by Liquid Phase Epitaxy>

A GaN crystal was produced using an LPE apparatus having the structure shown in FIG. 26. This process corresponds to the "first Group III nitride crystal production process" of the present invention.

As shown in (a) of FIG. 9, a substrate obtained by forming a GaN seed crystal layer 13 on a sapphire substrate 12 by MOCVD (vapor phase epitaxy) was provided. The thickness of the sapphire substrate 12 was 1 mm, and the thickness of the GaN seed crystal layer 13 was 5 µm. Subsequently, parts of the GaN seed crystal layer 13 and the upper parts of the sapphire substrate 12 were removed by etching. Thereby, as shown in (b) of FIG. 9, a GaN seed crystal substrate in which the seed crystals 13 are arranged on the plural convex portions 12a of the substrate 12 was obtained. The shape of the convex portion 12a (seed crystal 13) was a circular dot shape. The arrangement pattern of the convex portions 12a was, as shown in (a) of FIG. 6, repetition of a pattern in which convex portions 12a (seed crystals 13) are arranged on apexes of an equilateral triangle. The diameter of the convex portion 12a (seed crystal 13) was 0.25 mm and the distance between the centers of the convex portions 12a (seed crystals 13) that are adjacent to each other was 0.55 mm.

Next, crystal growth was performed in a nitrogen gas atmosphere using the GaN seed crystal substrate under the following conditions to produce a GaN crystal. The following "C [mol %] 0.5" represents addition of a 0.5% by mole carbon powder relative to the total amount of gallium (Ga), sodium (Na), and the carbon powder. As an operation, first, a crucible 385 was placed in a stainless container 384, and the stainless container 384 was placed in an electric furnace (heat-and-pressure-resistant container) 381. Heating was started by a heater (not shown) to cause the electric furnace (heat-and-pressure-resistant container) 381 to be under high-temperature and high-pressure conditions at 870° C. and 34 atm (about 3.4 MPa) at the same time as introducing a nitrogen gas from a raw material gas tank 3803 into the stainless container 384, and a reaction was performed for 168 hours to perform the crystal growth. Thus, an intended GaN crystal was produced. Furthermore, the upper parts of the GaN crystal and the sapphire substrate were removed by grinding and polishing to cause only the lower parts remain, whereby a GaN crystal having a thickness of 2.8 mm was obtained. This GaN crystal was subjected to the subsequent GaN crystal production by vapor phase epitaxy (second Group III nitride crystal production process).

| | |
|---|---|
| Temperature [° C.] | 870 |
| Pressure [MPa] | 3.4 |
| Time [h] | 168 |
| Ga:Na | 27:73 |
| C [mol %] | 0.5 |
| Crucible | $Al_2O_3$ |

Figure 16:
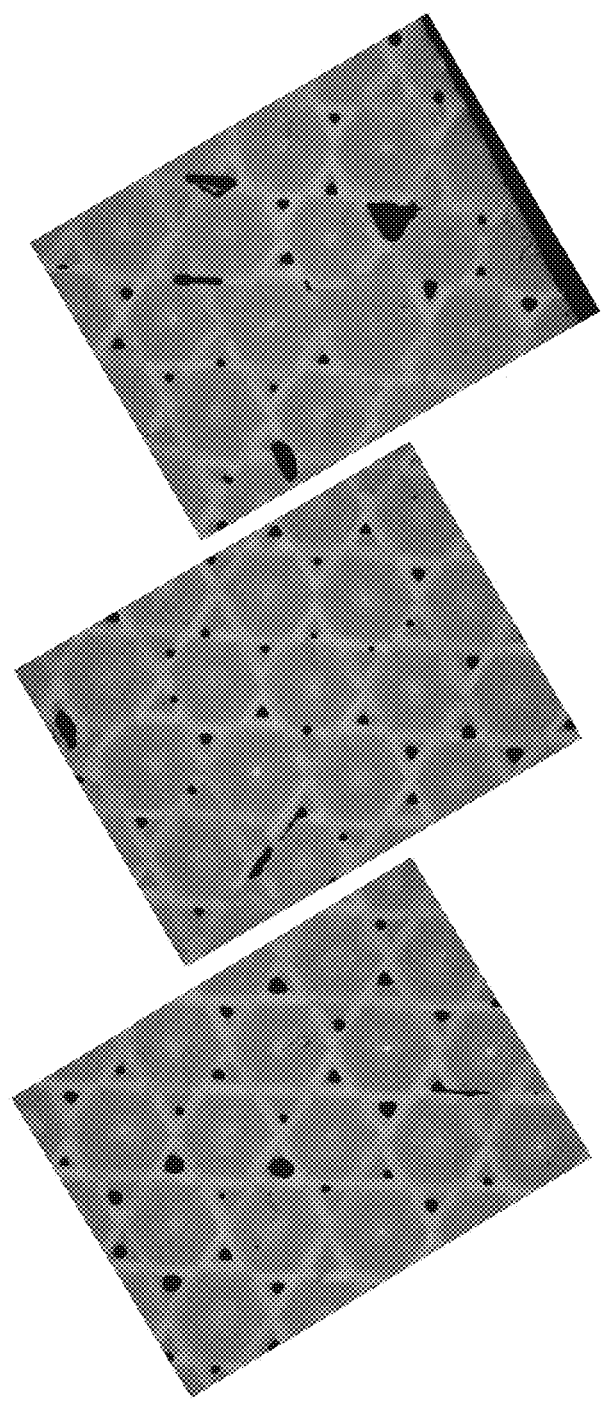
FIG. 16 shows photographs of a GaN crystal obtained by liquid phase epitaxy (first Group III nitride crystal production process) in Example. Through holes remain in the GaN crystal shown in FIG. 16 by not binding some parts of the Group III nitride crystals that are adjacent to one another.

FIG. 16 shows photographs of the surface of the GaN crystal layer produced by the liquid phase epitaxy. As shown in FIG. 16, a GaN crystal with very few dislocations throughout the entire crystal, homogeneity, and high quality could be obtained. In the unification site (means the same as the association site or the binding site) of crystals that are adjacent to each other, no crystal defect was observed. Furthermore, as shown in FIG. 16, through holes remained in this GaN crystal by not binding some parts of the GaN crystals that are adjacent to one another. Moreover, as shown in FIG. 16, the through holes were arranged in six-fold symmetry.

<Production of GaN Crystal by Vapor Phase Epitaxy>

On the first GaN crystal (GaN crystal layer) produced by the liquid phase epitaxy, a GaN crystal was produced by vapor phase epitaxy (homoepi). This process corresponds to the "second Group III nitride crystal production process" of the present invention.

First, the above described substrate (hereinafter, referred to as a "GaN crystal layer substrate") obtained by forming a GaN crystal layer (first GaN crystal) on a sapphire substrate was cleaned (pretreated). That is, first, the GaN crystal layer substrate was subjected to ultrasonic cleaning in acetone for 5 minutes twice, and then was washed with pure water. Subsequently, for the purpose of removing oil and fat, metal impurities, and the like from the GaN crystal layer, the GaN crystal layer substrate was immersed in nitric acid (commonly used reagent, stock solution without being diluted) of 70° C. for 30 minutes once. This GaN crystal layer substrate was washed with pure water. Then, for the purpose of completely removing acids in the through holes of the GaN crystal layer, the GaN crystal layer substrate washed was subjected to ultrasonic cleaning in pure water for 5 minutes twice. In the manner described above, the GaN crystal layer substrate was cleaned (pretreated).

Subsequently, using the GaN crystal layer substrate cleaned (pretreated) and a self-made apparatus shown in FIG. 28 (FIG. 29), a GaN crystal was produced on a GaN crystal layer by vapor phase epitaxy. In the present example, metal gallium (Ga) was used as a Group III element-containing material 110 and hydrogen chloride (HCl) gas was used as hydrogen halide gas 201a. The partial pressure $P_{HCl}$ of the hydrogen chloride gas was 6.3 kPa. In this state, the hydrogen halide gas 201a (201b) was caused to react with metal gallium 110 to generate gallium chloride (GaCl) gas 111a (111b). In the present example, the conversion efficiency from HCl and Ga to GaCl was estimated as 100%. That is, the partial pressure $P_{GaCl}$ of the gallium chloride gas 111a (111b) was estimated as 6.3 kPa. Furthermore, ammonia gas ($NH_3$) was used as nitrogen-containing gas 203a and 203b. The partial pressure $P_{NH3}$ of the ammonia gas was 15.8 kPa. Moreover, $H_2$ gas (100% $H_2$ gas, containing no other gas) as carrier gas was introduced from the hydrogen halide gas introduction pipe 105 and nitrogen-containing gas introduction pipes 107a and 107b and pressure was applied. The substrate temperature (crystal growth temperature) of the GaN crystal layer substrate (202 in FIG. 29) was 1030° C., and the crystal growth time (time when each gas was kept feeding) was 3 hr. This vapor phase epitaxy allows a GaN crystal having a thickness (homoepi thickness) of 700 µm to be produced on the GaN crystal layer of the GaN crystal layer substrate.

Figure 17:
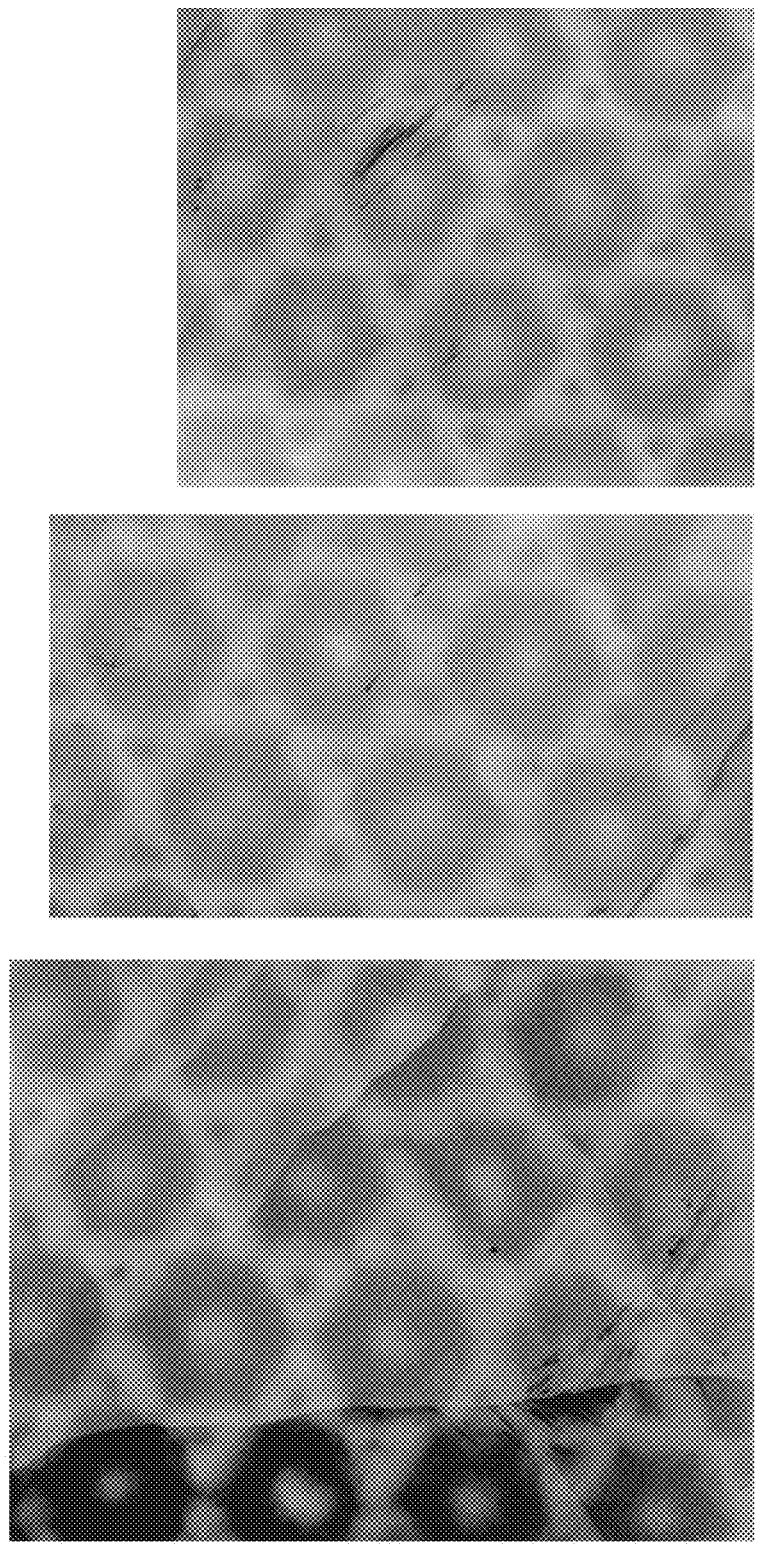
FIG. 17 shows photographs of a GaN crystal produced on the GaN crystal shown in FIG. 16 by vapor phase epitaxy (second Group III nitride crystal production process).

FIG. 17 shows photographs of the surface of the GaN crystal formed by vapor phase epitaxy (second Group III nitride crystal production process) (homoepi). As shown in FIG. 17, a flat even GaN crystal of significantly high quality with few defects could be produced by vapor phase epitaxy. The reason for this is that there was no polarity reversion in the vicinity of the through holes of the GaN produced by the liquid phase epitaxy (first Group III nitride crystal production process).

INDUSTRIAL APPLICABILITY

As described above, according to the present invention, a large Group III nitride crystal of high quality with few defects such as a distortion, a dislocation, warping, and the like can be produced by vapor phase epitaxy. The Group III nitride crystal of the present invention that can be produced by the production method according to the present invention is large in size, has few defects (e.g., a distortion, a dislocation, warping, and the like), and achieves high quality. Furthermore, the present invention provides a semiconductor apparatus that uses the Group III nitride crystal of the present invention, which is large in size, has few defects (e.g., a distortion, a dislocation, warping, and the like), and achieves high quality. The present invention also provides a Group III nitride crystal production apparatus that can be used in the production method according to the present invention. For example, by using a nitride crystal produced by the present invention as a substitute for Si in a semiconductor apparatus such as a power device generally required to have a large diameter of Si (silicon), a high frequency device, or the like, the performance can be further improved. Therefore, the present invention has a great impact on the semiconductor industry. Moreover, the present invention is not limited thereto and is applicable to other semiconductor apparatuses and other applications besides the semiconductor apparatuses.

While the present invention has been described above with reference to embodiments, the present invention is by no means limited thereto. Various changes and modifications that may become apparent to those skilled in the art may be made in the configuration and specifics of the present invention without departing from the scope of the present invention.

This application claims priority from Japanese Patent Application No. 2014-041080 filed on Mar. 3, 2014. The entire subject matter of the Japanese Patent Application is incorporated herein by reference.

EXPLANATION OF REFERENCE NUMERALS 12 substrate
12a convex portion
13 Group III nitride crystal layer
14, 14a, 14b cut plane
50 substrate
51 Group III nitride crystal layer
52 mask
52a through hole
53 Group III nitride crystal
54, 54a, 54b cut plane
361 raw material gas tank
362 pressure adjuster
363 valve for leakage
364 stainless container
365 electric furnace
366 crucible
370 electric furnace
371 chamber
372 furnace cover
373 heater
3700a, 3700b, 3700c zone
374a, 374b, 374c thermocouple
375 furnace pipe
376 crucible
377 melt
378 substrate-fixing part
379a, 379b rotary motor
3701 propeller
3702 gas source
3703 pressure adjuster
3704 gas purification part
380 swing LPE apparatus
381 growth furnace
382 heater
383 thermocouple
384 crucible-fixing stage
385 crucible
386 melt
387 seed crystal
388 flow rate adjuster
389 pipe
3800 direction in which atmospheric gas is supplied
3801 rotation direction
3802 rotation axis
3803 gas source
3804 pressure adjuster
1002 substrate (sapphire substrate)
1003 Group III nitride crystal (GaN crystal)
100, 300 production apparatus for use in second Group III nitride crystal production process
101 first container
102, 301 second container
103 substrate support
104 Group III element-containing material placement part
105 hydrogen halide gas introduction pipe
106 Group III element halide gas delivery pipe
107a, 107b nitrogen-containing gas introduction pipe
108 exhaust pipe
109a, 109b first heating unit
200a, 200b second heating unit
201a, 201b, 401a, 401b hydrogen halide gas
111a, 111b Group III element halide gas
202, 400 substrate
203a, 203b, 203c nitrogen-containing gas
203d exhaust pipe
204 Group III nitride crystal (GaN crystal)
302 Group III element metal introduction pipe
402, 110 Group III element-containing material (Group III element metal)
2001 seed substrate
2002 mask
2003 Group III nitride crystal
2004 crystal defect
2011 substrate
2012 Group III nitride crystal

The invention claimed is:

1. A method for producing a Group III nitride crystal, comprising:
a first Group III nitride crystal production process of producing a first Group III nitride crystal by liquid phase epitaxy; and
a second Group III nitride crystal production process of producing a second Group III nitride crystal on the first Group III nitride crystal by vapor phase epitaxy,
the first Group III nitride crystal production process comprising:
a seed crystal selection step of selecting a plurality of parts of a preliminarily provided Group III nitride as seed crystals for generation and growth of Group III nitride crystals;
a contact step of bringing the surfaces of the seed crystals into contact with an alkali metal melt; and
a Group III nitride crystal liquid phase growth step of causing a Group III element and nitrogen to react with each other in a nitrogen-containing atmosphere in the alkali metal melt to generate and grow Group III nitride crystals,
wherein in the Group III nitride crystal liquid phase growth step, the Group III nitride crystals are bound together by growth of the Group III nitride crystals grown from the seed crystals to produce the first Group III nitride crystal, in the Group III nitride crystal liquid phase growth step, the first Group III nitride crystal includes at least one of (a) through holes obtained by not binding some parts of Group III nitride crystals that are adjacent to one another, and (b) concave portions, and in the second Group III nitride crystal production process, the second Group III nitride crystal is grown so as to fill or cover the through holes or the concave portions that remain in the first Group III nitride crystal with the second Group III nitride crystal.

2. The method according to claim 1, wherein the first Group III nitride crystal has substantially no polarity inversion region.

3. The method according to claim 1, wherein the second Group III nitride crystal produced in the second Group III nitride crystal production process has substantially no polarity inversion region.

4. The method according to claim 1, wherein in the first Group III nitride crystal production process, the seed crystals are hexagonal crystals, and in the seed crystal selection step, the seed crystals are arranged such that m-planes of the crystals grown from the seed crystals that are adjacent to each other do not almost coincide with each other.

5. The method according to claim 4, wherein the seed crystals are arranged such that a-axes or c-axes of the seed crystals that are adjacent to each other almost coincide with each other.

6. The method according to claim 4, wherein each seed crystal has a c-plane, and in the seed crystal selection step, the c-planes are selected as crystal growth planes of the seed crystals, and the seed crystals are arranged such that a-axes of the seed crystals that are adjacent to each other almost coincide with each other.

7. The method according to claim 6, wherein in the Group III nitride crystal liquid phase growth step, the seed crystals are arranged such that apexes of hexagons of the Group III nitride crystals grown from the seed crystals that are adjacent to each other almost coincide with each other.

8. The method according to claim 4, wherein the seed crystals are arranged such that the sides of the crystals grown from the seed crystals do not almost coincide with each other.

9. The method according to claim 1, wherein in the seed crystal selection step, the preliminarily provided Group III nitride includes a plurality of Group III nitride crystals arranged on a substrate, and the Group III nitride crystals are selected as the seed crystals, or in the seed crystal selection step, the preliminarily provided Group III nitride is a Group III nitride crystal layer, a mask having a plurality of through holes is arranged on the Group III nitride crystal layer, and parts of the plane the Group III nitride crystal layer exposed from the through holes are selected as the seed crystals.

10. The method according to claim 9, wherein in the seed crystal selection step, the preliminarily provided Group III nitride includes a plurality of Group III nitride crystals arranged on a substrate, the Group III nitride crystals are selected as the seed crystals, and the Group III nitride crystals arranged on the substrate are Group III nitride crystals formed by removing parts of the Group III nitride crystal layer formed on the substrate.

11. The method according to claim 9, wherein in the seed crystal selection step, the preliminarily provided Group III nitride is a Group III nitride crystal layer, a mask having a plurality of through holes is arranged on the Group III nitride crystal layer, parts of the plane of the Group III nitride crystal layer exposed from the through holes are selected as the seed crystals, and the mask does not adhere to the Group III nitride crystal layer.

12. The method according to claim 9, wherein in the seed crystal selection step, the contact step, and the crystal growth step, a plurality of units each composed of the Group III nitride crystal layer and the mask or a plurality of units each composed of the substrate and the Group III nitride crystal are adjacently arranged in parallel, and in the crystal growth step, the Group III nitride crystals grown from the units that are adjacent to each other are bound together by the growth of the Group III nitride crystals.

13. The method according to claim 12, wherein in the first Group III nitride crystal production process, the seed crystals are hexagonal crystals, and the seed crystals are arranged such that m-planes of the crystals grown from the seed crystals that are adjacent to each other do not almost coincide with each other between the units that are adjacent to each other.

14. The method according to claim 13, wherein the seed crystals are arranged such that a-axes or c-axes of the seed crystals that are adjacent to each other almost coincide with each other between the units that are adjacent to each other.

15. The method according to claim 13, wherein each seed crystal has a c-plane, in the seed crystal selection step, the c-planes are selected as crystal growth planes of the seed crystals, and the seed crystals are arranged such that a-axes of the seed crystals that are adjacent to each other almost coincide with each other between the units that are adjacent to each other.

16. The method according to claim 15, wherein in the Group III nitride crystal liquid phase growth step, the seed crystals are arranged such that apexes of hexagons of the Group III nitride crystal grown from the seed crystals that are adjacent to each other almost coincide with each other between the units that are adjacent to each other.

17. The method according to claim 9, wherein the mask or the substrate comprises at least one selected from the group consisting of $Al_xGa_{1-x}N$ ($0<x\le1$), an oxide of the $Al_xGa_{1-x}N$ ($0<x\le1$), diamond-like carbon, silicon nitride, silicon oxide, silicon oxynitride, aluminum oxide, aluminum oxynitride, silicon carbide, yttrium oxide, yttrium aluminum garnet (YAG), tantalum, rhenium, and tungsten.

18. The method according to claim 9, wherein the through holes of the mask or the Group III nitride crystals arranged on the substrate each have a dot shape.

19. The method according to claim 18, wherein the through holes of the mask or the Group III nitride crystals arranged on the substrate are aligned at substantially equal intervals.

20. The method according to claim 18, wherein
the through holes of the mask or the Group III nitride crystals arranged on the substrate each have almost the same size.

21. The method according to claim 20, wherein
the dot has a diameter in a range from 0.01 to 10 mm.

22. The method according to claim 9, wherein
a distance between the centers of the adjacent through holes of the mask or a distance between the centers of the adjacent Group III nitride crystals arranged on the substrate is 0.01 mm or more.

23. The method according to claim 1, wherein
the first Group III nitride crystal is a Group III nitride crystal represented by $Al_xGa_yIn_{1-x-y}N$ ($0 \leq x \leq 1$, $0 \leq y \leq 1$, $x+y \leq 1$).

24. The method according to claim 1, wherein
the first Group III nitride crystal is GaN.

25. The method according to claim 1, wherein
in the second Group III nitride crystal production process, the vapor phase epitaxy is hydride vapor phase epitaxy (HVPE).

26. The method according to claim 1, wherein
in the second Group III nitride crystal production process, the vapor phase epitaxy is a method of producing the second Group III nitride crystal by causing Group III element halide to react with nitrogen-containing gas.

27. The method according to claim 26, wherein
the Group III element halide is at least one selected from the group consisting of $AlCl_3$, $GaCl$, $GaCl_3$, and $InCl_3$.

28. The method according to claim 18, wherein
the nitrogen-containing gas is $NH_3$.

29. The method according to claim 1, further comprising:
a slicing step of slicing the second Group III nitride crystal to provide at least one Group III nitride crystal substrate.

30. The method according to claim 1, further comprising:
a polishing step of polishing the surface of the first Group III nitride crystal, wherein
in the second Group III nitride crystal production process, the second Group III nitride crystal is produced by vapor phase epitaxy on the surface of the first Group III nitride crystal polished in the polishing step.

31. The method according to claim 1, wherein
the second Group III nitride crystal is a Group III nitride crystal represented by $Al_xGa_yIn_{1-x-y}N$ ($0 \leq x \leq 1$, $0 \leq y \leq 1$, $x+y \leq 1$).

32. The method according to claim 1, wherein
the second Group III nitride crystal is GaN.

33. The method according to claim 1, wherein
the second Group III nitride crystal produced has a major axis of 15 cm or more.

34. The method according to claim 1, wherein
the second Group III nitride crystal produced has a dislocation density of $1.0 \times 10^7$ $cm^{-2}$ or less.

35. The method according to claim 1, wherein
in the second Group III nitride crystal produced, a half width of each of a symmetric reflection component (002) and an asymmetric reflection component (102) by an X-ray rocking curve method (XRC) is 300 seconds or less.

* * * * *